United States Patent
Miyazaki

(10) Patent No.: US 8,040,162 B2
(45) Date of Patent: Oct. 18, 2011

(54) SWITCH MATRIX DRIVE CIRCUIT FOR A POWER ELEMENT

(75) Inventor: Yuji Miyazaki, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/667,306

(22) PCT Filed: Jul. 3, 2007

(86) PCT No.: PCT/JP2007/063270
§ 371 (c)(1),
(2), (4) Date: Dec. 30, 2009

(87) PCT Pub. No.: WO2009/004715
PCT Pub. Date: Jan. 8, 2009

(65) Prior Publication Data
US 2010/0141304 A1  Jun. 10, 2010

(51) Int. Cl.
*H03K 3/00* (2006.01)
(52) U.S. Cl. ......... 327/108; 327/110; 327/423; 327/588
(58) Field of Classification Search .......... 327/108, 327/110, 423, 588
See application file for complete search history.

(56) References Cited

U.S. PATENT DOCUMENTS

| | | | | |
|---|---|---|---|---|
| 4,849,873 A | * | 7/1989 | Vanderhelst | 363/55 |
| 5,453,717 A | * | 9/1995 | Gerfault | 330/146 |
| 5,952,856 A | * | 9/1999 | Horiguchi et al. | 327/110 |
| 6,066,930 A | * | 5/2000 | Horiguchi et al. | 318/400.29 |
| 6,094,021 A | * | 7/2000 | Noro et al. | 318/400.29 |
| 6,204,729 B1 | * | 3/2001 | Takita | 330/146 |
| 6,731,525 B2 | * | 5/2004 | Meiners | 363/148 |
| 6,963,773 B2 | * | 11/2005 | Waltman et al. | 607/5 |
| 7,817,452 B2 | * | 10/2010 | Smith | 363/132 |
| 7,834,761 B2 | * | 11/2010 | Leone | 340/551 |

FOREIGN PATENT DOCUMENTS

| | | |
|---|---|---|
| JP | 57 9256 | 1/1982 |
| JP | 57 87626 | 6/1982 |
| JP | 59 13422 | 1/1984 |
| JP | 63 215114 | 9/1988 |
| JP | 5 276761 | 10/1993 |
| JP | 7 131971 | 5/1995 |
| JP | 9 140122 | 5/1997 |
| JP | 10032976 | 2/1998 |
| JP | 11055936 | 2/1999 |
| JP | 2001 358577 | 12/2001 |

* cited by examiner

*Primary Examiner* — Kenneth B. Wells
(74) *Attorney, Agent, or Firm* — Oblon, Spivak, McClelland, Maier & Neustadt, L.L.P.

(57) ABSTRACT

A drive circuit for an IGBT includes an H-bridge circuit using first to fourth switch elements. When a control unit receives a command for changing the IGBT from an on state to an off state, it switches states of the first to fourth switch elements from a first state in which the first and fourth switch elements are in an on state and the second and third switch elements are in an off state to a second state in which the first and fourth switch elements are in the off state and the second and third switch elements are in the on state. This structure of the drive circuit can apply a reverse bias to the IGBT from a single power supply.

16 Claims, 26 Drawing Sheets

SWITCH MATRIX DRIVE CIRCUIT FOR A POWER ELEMENT

TECHNICAL FIELD

The present invention relates to a drive circuit for turning on/off a power semiconductor element (i.e., a semiconductor element for an electric power).

BACKGROUND ART

A power semiconductor element performs on/off control of a main current by a voltage or current signal applied to a control electrode. An MOSFET (Metal Oxide Semiconductor Field Effect Transistor), an IGBT (Insulated Gate Bipolar Transistor) and the like are power elements of a voltage drive type that perform the on/off control according to the voltage signal, A bipolar transistor and the like are power elements of a current drive type that perform the on/off control according to the current signal.

In many of such power elements, a reverse bias is applied between a control electrode (a gate or base electrode) and a main electrode (a source or emitter electrode) when the element is to be switched from the on state to the off state. In the power element of the voltage drive type, the above bias is applied for ensuring an off state without being influenced by noises. In the element of the current drive type, the above bias is applied for reducing a turn-off time of a main current. The following first and second prior arts are known as the drive circuits for applying the reverse bias.

The first prior art uses two power supplies for forward and reverse biases, respectively (see Japanese Patent Laying-Open No. 07-131971 (Patent Document 1), column [0003] in specification and FIG. 8). When the IGBT is used as the power element, an on-transistor used as a switch element for turn-on, on-resistance, an off-transistor used as a switch element for turn-off, and off-resistance are connected in series. These are connected to a main gate power supply formed of a series connection of a forward bias power supply and a reverse bias power supply, and a connection point between the on-resistance and the off-resistance is connected to a gate of the IGBT so that a gate drive circuit is formed. When the on-transistor is turned on, a forward bias current flows from the forward bias power supply through the on-transistor, on-resistance, gate of the IGBT and emitter of the IGBT to the forward bias power supply, and thereby turns on the IGBT. When the off-transistor is turned on, a reverse bias current flows from the reverse bias power supply through the emitter of the IGBT, gate of the IGBT, off-resistance and off-transistor to the reverse bias power supply, and thereby turns off the IGBT.

In the second prior art, a capacitor for charging is employed together with a single power supply, and is used as a pseudo-power supply (Japanese Patent Laying-Open No. 09-140122 (Patent Document 2)). In this prior art, a diode is connected between base and emitter terminals of a P-type transistor, and a resistance is connected between base and collector terminals thereof. This P-type transistor is connected in parallel between input terminals of a pulse power supply. The emitter terminal of the P-type transistor is connected to a gate terminal of an IGBT via a first resistance, and a collector terminal of the P-type transistor is connected via a parallel circuit formed of a capacitor and a constant-voltage diode to a second resistance connected to the gate terminal of the IGBT. Thereby, a gate drive circuit is formed. When the pulse power supply applies a positive bias to the gate terminal of the IGBT via the diode and the first resistance, the capacitor is likewise charged through the second resistance. When the positive bias is off, the P-type transistor is on so that the charges accumulated in the capacitor are discharged through the P-type transistor and the second resistance, and the reverse bias is applied to the gate terminal of the IGBT.

Patent Document 1: Japanese Patent Laying-Open No. 07-131971

Patent Document 2: Japanese Patent Laying-Open No. 09-140122

DISCLOSURE OF THE INVENTION

Problems to be Solved by the Invention

However, the first prior art described above uses the two power supplies, and therefore requires extra space and cost as compared with a structure of a single power supply. In the second prior art described above, the capacitor used as the pseudo-power supply must have a much larger capacitance than a gate capacitance of the power element to be driven so that extra space and cost are required as compared with the structure of the single power supply.

The first and second prior arts commonly suffer from a problem that the drive circuit must have a higher breakdown voltage performance than the structure of the single power supply. More specifically, in the first prior art, the drive circuit receives the voltage equal to a sum of the power supply voltages of the forward and reverse bias power supplies so that components of the drive circuit must have a performance capable of withstanding the sum of these voltages. In the second prior art, the power supply supplies a sum of the voltage forwardly biasing the power element and the charge voltage of the capacitor so that the breakdown voltage performance required in the drive circuit increases correspondingly to the charge voltage of the capacitor.

The invention has been made for overcoming the above problems, and an object of the invention is to provide a drive circuit that can apply a reverse bias to the control electrode of the power element only by a single power supply without requiring an additional power supply.

Means for Solving the Problems

The invention provides a drive circuit for a power element that controls a main current flowing between first and second main electrodes according to a signal provided to a control electrode. A basic structure thereof includes a power supply connected between first and second nodes, a switch matrix circuit configured to connect the control electrode selectively to one of the first and second nodes, and to connect the second main electrode selectively to one of the first and second nodes, and a control unit for controlling the switch matrix circuit according to an input signal provided for switching the power element between on and off states. When the input signal changes to switch the power element from the on state to the off state, the control unit switches the state of the switch matrix circuit from a first state for connecting the control electrode to the first node and connecting the second main electrode to the second node to a second state for connecting the control electrode to the second node and connecting the second main electrode to the first node.

Effects of the Invention

According to the invention, when the first state changes to the second state, the voltage applied between the control electrode of the power element and the second main electrode changes in polarity, and a reverse bias can be applied.

DESCRIPTION OF THE REFERENCE SIGNS 1-8 drive circuit, 10 IGBT (power element), 10a sense IGBT (power element), 11 power supply node (first node), 12 ground node (second node), 15 power supply, 20 and 20a-20j control unit, 50a and 50b control IC, 70 comparator (voltage monitoring unit), 74 Zener diode (constant voltage unit), 80 switch matrix circuit, C collector electrode (first main electrode), E emitter electrode (second main electrode), G gate electrode (control electrode), S sense electrode, IC collector current (main current), Q1-Q6 switch element, SG0 input signal, R1 and R4 resistance, D1-D4 diode, RD current sense resistance.

BEST MODES FOR CARRYING OUT THE INVENTION

Embodiments of the invention will now be described with reference to the drawings. In the following description, the same or corresponding portions bear the same reference signs, and description thereof is not repeated.

In the following embodiments, an IGBT is described as an example of a power element. However, each of the embodiments can be applied to a drive circuit for driving an MOS-FET or a bipolar transistor as well as a drive circuit for an IGBT. More specifically, in the case of the MOSFET, the following description can be true when an emitter electrode is read as a source electrode, and a collector electrode is read as a drain electrode. In the case of the bipolar transistor, the following description can be true when a gate electrode is read as a base electrode. In the specification, the bipolar transistor represents an ordinary PNP- or NPN-type bipolar transistor of which on/off control is performed by a base current.

In the following description, the conductivity type of the IGBT is an N-channel that is a general type. However, each of the embodiments of the drive circuit for the N-channel IGBT can be applied to a drive circuit for a P-channel MOSFET or a PNP-type bipolar transistor. In the case of the P-channel or the PNP type, the following description can be true when polarities of power supplies and diodes are inverted, a source electrode and an emitter electrode of an MOSFET used as respective switch elements are interchanged with each other, and an emitter electrode and a collector electrode of a bipolar transistor used as each switch element are interchanged with each other.

First Embodiment

Figure 1:
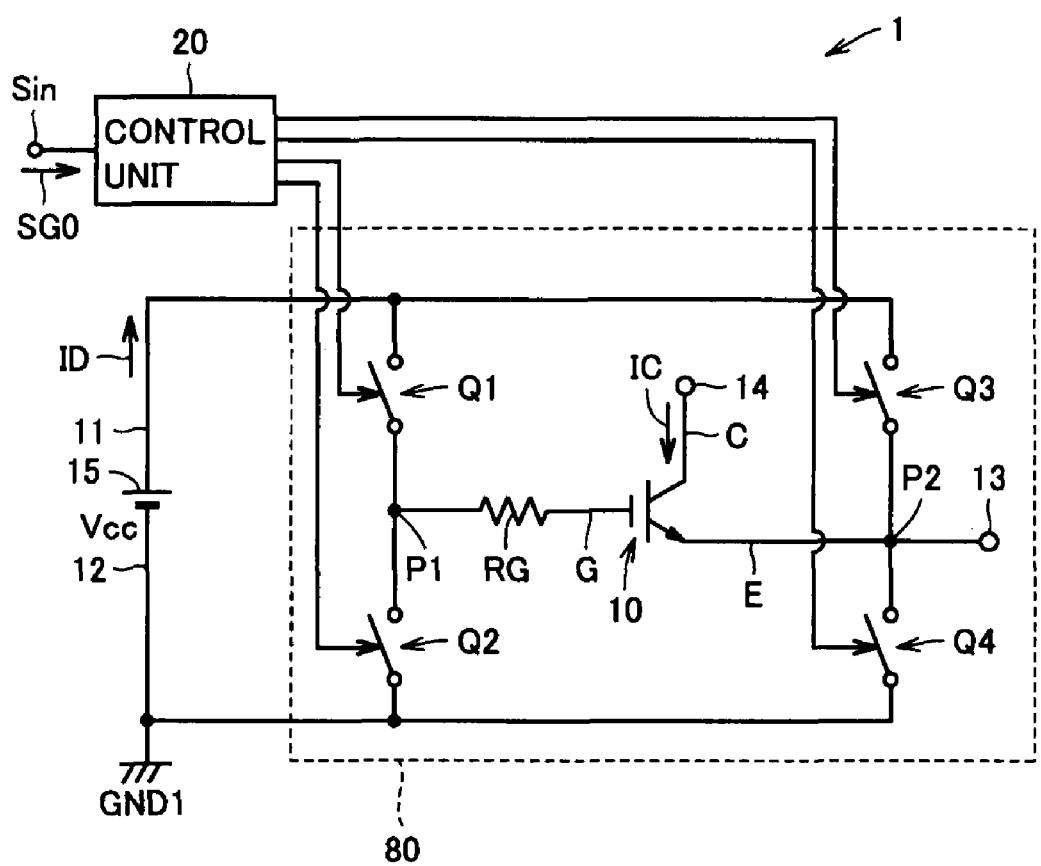
FIG. 1 is a circuit diagram showing, as a first embodiment of the invention, a basic structure of a drive circuit 1 for an IGBT 10.

FIG. 1 is a circuit diagram showing, as a first embodiment of the invention, a basic structure of a drive circuit 1 for an IGBT 10. In N-channel IGBT 10, a main current flowing from a collector electrode C that is a first main electrode to an emitter electrode E that is a second main electrode is controlled by a voltage applied between a gate electrode G that is a control electrode and emitter electrode E.

As shown in FIG. 1, a drive circuit 1 for IGBT 10 includes a single DC power supply 15 arranged between first and second nodes 11 and 12, a gate resistance RG arranged between a connection node P1 and gate electrode G of IGBT 10, a first switch element Q1 arranged between connection node P1 and node 11, a second switch element Q2 arranged between connection node P1 and node 12, a third switch element Q3 arranged between node 11 and a connection node P2 connected to emitter electrode E of IGBT 10, and a fourth switch element Q4 arranged between connection node P2 and node 12. The circuit formed of switch elements Q1-Q4 is a so-called H-bridge circuit.

An output voltage Vcc of power supply 15 is equal to a voltage that is necessary and sufficient for reliably changing IGBT 10 to an on state. In the IGBT, output voltage Vcc is usually set to 15V. Gate resistance RG is employed for restricting a current flowing to or from the gate electrode when IGBT 10 is turned on/off.

In the first embodiment, node 11 is on a positive side of power supply 15, and node 12 is on a negative side of power supply 15. Node 12 is connected to a ground GND1 that is employed for drive circuit 1 and determines a reference potential of drive circuit 1. Therefore, the potential of node 11 attains power supply voltage Vcc, and the potential of node 12 attains a reference potential 0. Node 11 may be referred to as "power supply node 11", and node 12 may be referred to as "ground node 12".

Drive circuit 1 for IGBT 10 includes a control unit 20 that switches the on/off states of these switch elements Q1-Q4 between first and second states according to a logical level of an input signal SG0 provided from an signal input node Sin. The logical level of input signal SG0 changes between high (H) and low (L) levels. In each embodiment, input signal SG0 at the H-level corresponds to a command causing a transition or change of IGBT 10 to the on state (i.e., turn-on), and input signal SG0 at the L-level corresponds to a command causing a transition of the IGBT to the off state (i.e., turn-off). When input signal SG0 is at the H-level, control unit 20 sets switch elements Q1-Q4 to the on, off, off and on states, respectively. These states of switch elements Q1-Q4 are referred to as a first state. When input signal SG0 is at the L-level, control unit 20 sets switch elements Q1-Q4 to the off, on, on and off states, respectively. These states of switch elements Q1-Q4 are referred to as a second state.

Figure 2:
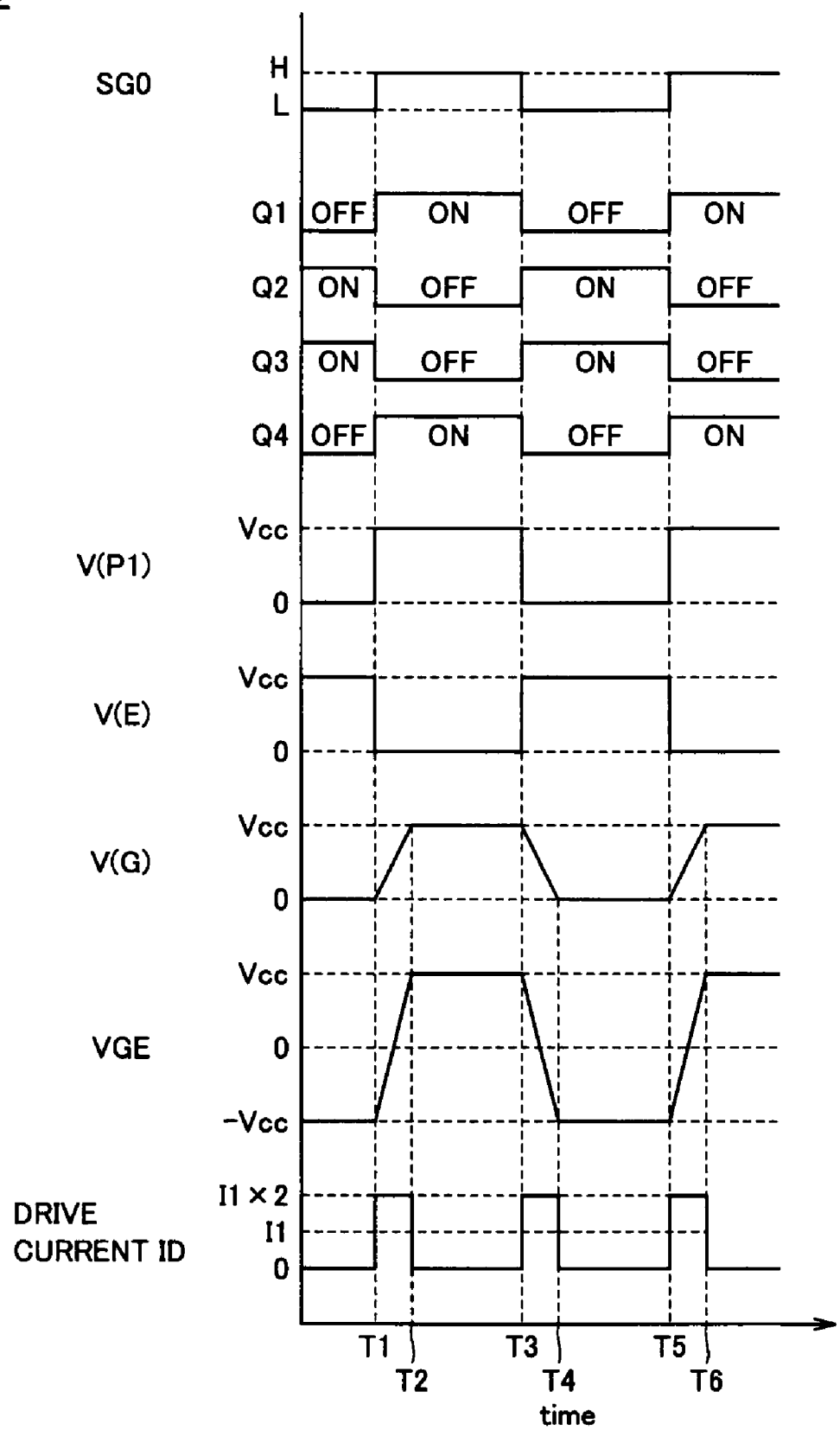
FIG. 2 is a time chart showing changes that occur in state relating to drive circuit 1 shown in FIG. 1 according to an input signal SG0.

FIG. 2 is a time chart showing changes that occur in state relating to drive circuit 1 shown in FIG. 1 according to input signal SG0. In FIG. 2, the abscissa gives the time, and the ordinate gives, in the descending order, the logical level of input signal SG0, the on/off states of switch elements Q1-Q4, a potential V(P1) of connection node P1, a potential V(E) of emitter electrode E of IGBT 10, a potential V(G) of gate electrode G of IGBT 10, a voltage VGE between the gate and emitter of IGBT 10 and a drive current ID for IGBT 10.

Gate-emitter voltage VGE represents a potential of gate electrode G with reference to a potential of emitter electrode E of IGBT 10. Drive current ID is a current supplied from drive power supply 15 (i.e., power supply for drive) for forwardly and reversely biasing gate electrode G of IGBT 10. In the specification, drive current ID is approximately represented by a constant average current within a turn-on or turn-off time of IGBT 10. In the drawings, a portion of a voltage waveform that changes exponentially is approximately represented by straight line.

An operation of drive circuit 1 will be described below with reference to FIGS. 1 and 2.

At a time T1 in FIG. 2, input signal SG0 changes from the L-level to the H-level. Thereby, control unit 20 changes the states of switch elements Q1-Q4 from the second state to the first state. In the first state, connection nodes P1 and P2 are connected to power supply node 11 and ground node 12, respectively, so that potential V(P1) of connection node P1 changes from 0 to Vcc, and potential V(E) of emitter electrode E of the IGBT connected to connection node P2 changes from Vcc to 0. Consequently, IGBT 10 receives a forward bias voltage such that the potential of gate electrode G becomes positive with respect to the potential of emitter electrode E, and IGBT 10 is turned on.

As shown in FIG. 2, potential V(G) of gate electrode G of IGBT 10 gradually changes to Vcc until a subsequent time T2. A turn-on time between times T1 and T2 depends on a time constant that is determined by a gate capacitance of IGBT 10 and a resistance value of gate resistance RG. As potential V(G) of gate electrode G changes, gate-emitter voltage VGE gradually changes from −Vcc to Vcc.

At a next time T3, input signal SG0 changes from the H-level to the L-level. Thereby, control unit 20 changes the states of switch elements Q1-Q4 from the first state to the second state. In the second state, connection node P1 is connected to ground node 12, and connection node P2 is connected to power supply node 11 so that potential V(P1) of connection node P1 changes from Vcc to 0, and potential V(E) of emitter electrode E of the IGBT connected to connection node P2 changes from 0 to Vcc. Consequently, IGBT 10 receives a reverse bias voltage such that the potential of gate electrode G becomes negative with respect to the potential of emitter electrode E, and IGBT 10 is turned off.

In this turn-off operation, potential V(G) of gate electrode G of IGBT 10 gradually changes to 0 until a subsequent time T4. Thereby, gate-emitter voltage VGE gradually changes from Vcc to −Vcc. A turn-on time between times T3 and T4 depends on a time constant that is determined by a gate capacitance of IGBT 10 and the resistance value of gate resistance RG, similarly to the foregoing turn-on time.

At a next time T5, input signal SG0 changes again from the L-level to the H-level for turning on IGBT 10 and, in response to this, control unit 20 changes the states of switch elements Q1-Q4 from the second state to the first state. Similarly to the case between the foregoing times T1 and T2, gate electrode G gradually changes to Vcc between times T5 and T6, and gate-emitter voltage VGE gradually changes from −Vcc to Vcc.

As described above, the circuit including switch elements Q1-Q4 functions as a switch matrix circuit 80 in which, according to input signal SG0, gate electrode G of IGBT 10 is selectively connected to nodes 11 and 12 and also emitter electrode E of IGBT 10 is selectively connected to nodes 11 and 12. According to this switching of connection to nodes 11 and 12, charging and discharging are performed on gate electrode G and emitter electrode E of IGBT 10. When gate-emitter voltage VGE is positively biased, charges are accumulated such that the potential of gate electrode G may become positive with respect to the potential of emitter electrode E. When gate-emitter voltage VGE changes from the positive to the negative, the charges accumulated between the gate and emitter are discharged, and conversely the charging is performed such that the potential of gate electrode G becomes negative with respect to the potential of the emitter electrode. When switch elements Q1-Q4 of drive circuit 1 are controlled as shown in FIG. 2, the current of the above charge/discharge is supplied as drive current ID by power supply 15.

For raising gate-emitter voltage VGE from 0 to Vcc, a magnitude of the average current supplied by power supply 15 is assumed as I1, and drive current ID is evaluated with reference to I1. As shown in FIG. 2, gate-emitter voltage VGE changes from −Vcc to Vcc during each turn-on time between times T1 and T2 or between times T5 and T6 so that drive current ID has a magnitude of (I1×2). In the turn-off time between times T3 and T4, gate-emitter voltage VGE changes from Vcc to −Vcc so that drive current ID has a magnitude of (I1×2).

Figure 3:
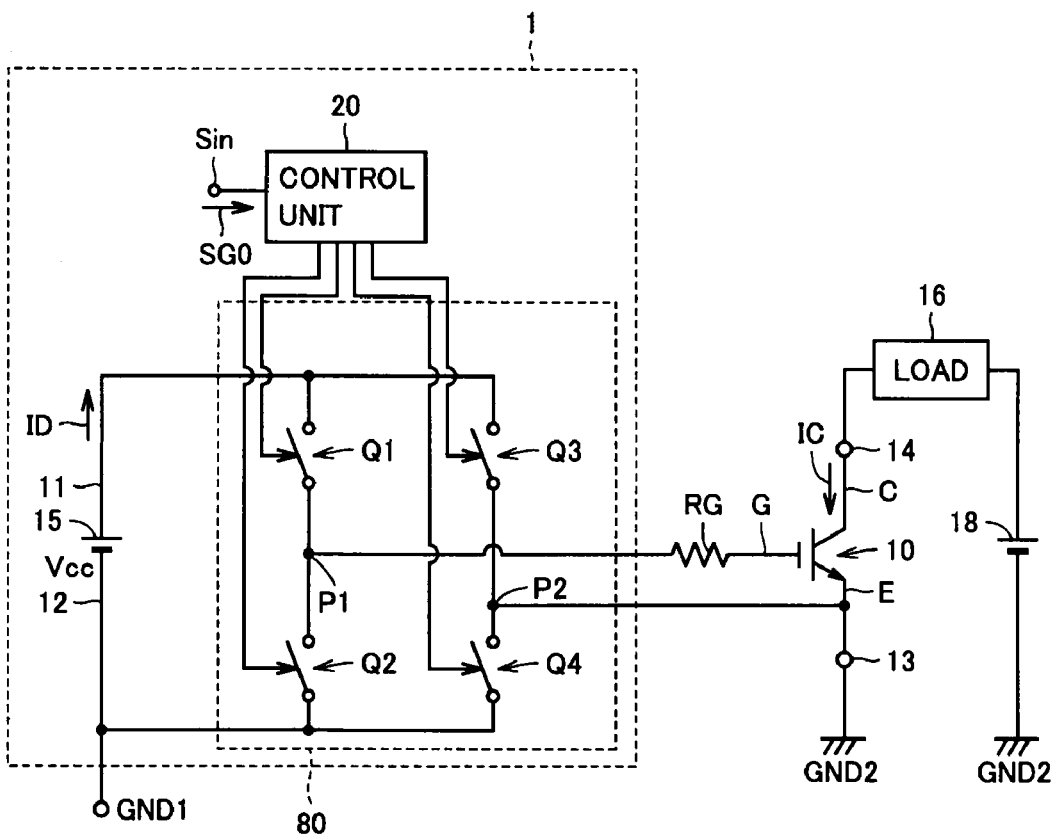
FIG. 3 is a circuit diagram showing a connection relationship of IGBT 10 and drive circuit 1 with respect to a main circuit including a load 16 and a power supply 18.

FIG. 3 is a circuit diagram showing a connection relationship of IGBT 10 and drive circuit 1 with respect to a main circuit including a load 16 and a power supply 18.

As shown in FIG. 3, IGBT 10 is connected to the main circuit via a node 13 connected to emitter electrode E and a node 14 connected to collector electrode C. Ground GND2 for the main circuit is connected to node 13, and one end of load 16 for the main circuit is connected to node 14. The other end of load 16 is connected to a positive terminal of power supply 18 of the main circuit, and a negative terminal of power supply 18 is connected to ground GND2. When IGBT 10 is turned on, a collector current IC flowing from collector electrode C of IGBT 10 to emitter electrode E is supplied by power supply 18 of the main circuit via load 16. Ground GND1 for the drive circuit is not connected to ground GND2, and is floating.

An example of specific structures of switch elements Q1-Q4 will be described below.

Figure 4:
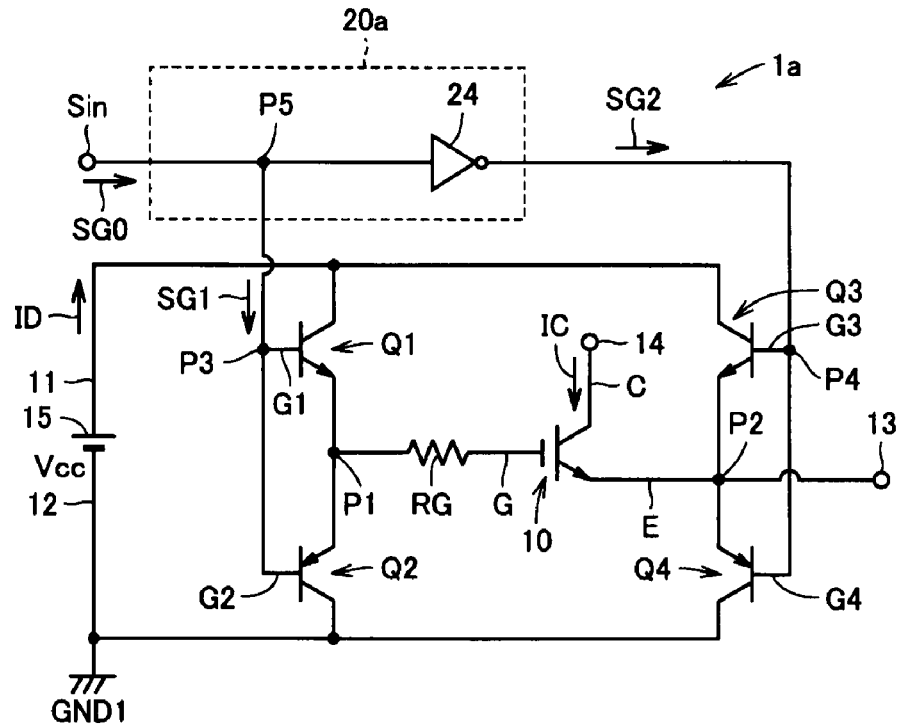
FIG. 4 is a circuit diagram showing a drive circuit 1a for a power element that is an example of a structure using bipolar transistors.
Figure 5:
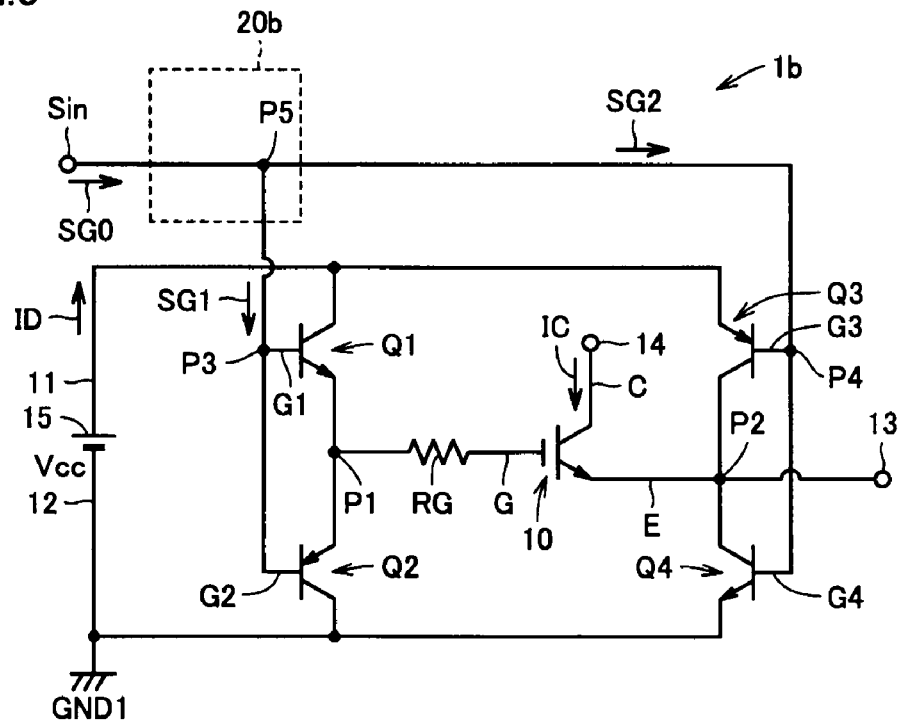
FIG. 5 is a circuit diagram showing a drive circuit 1b for a power element of another example of the structure using the bipolar transistors.
Figure 6:
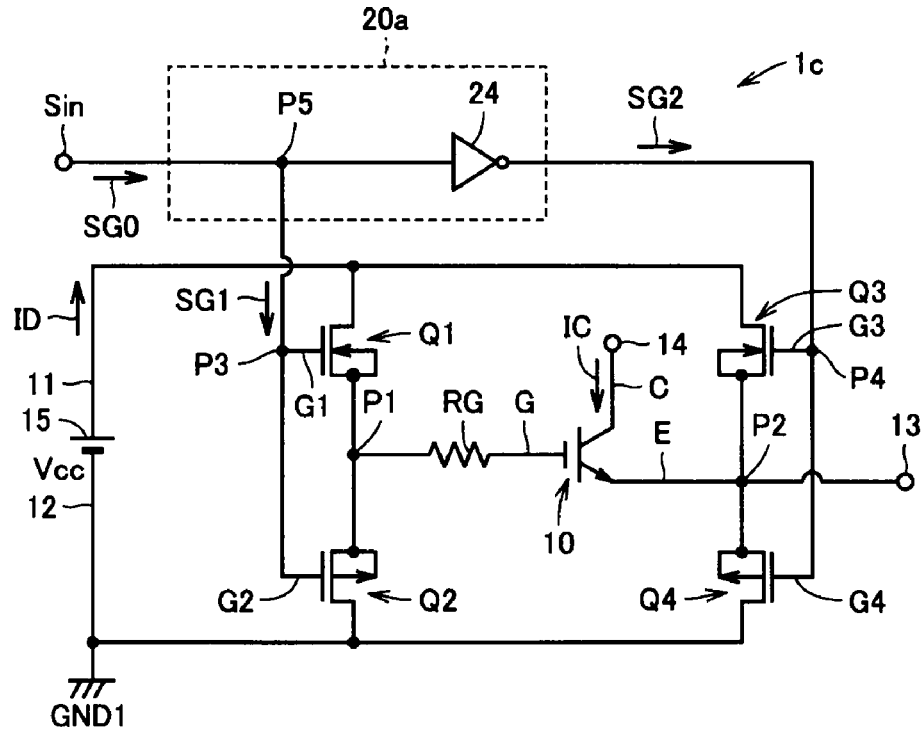
FIG. 6 is a circuit diagram showing a drive circuit 1c for a power element that is an example of a structure using MOSFETs.
Figure 7:
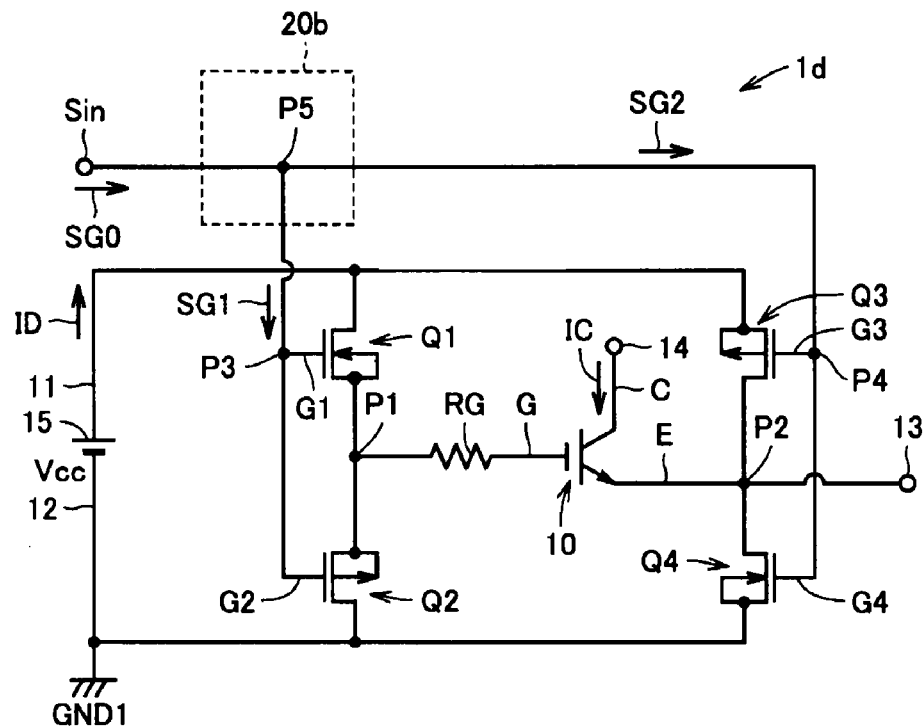
FIG. 7 is a circuit diagram showing a drive circuit 1d for a power element of another example of the structure using the MOSFETs.

FIGS. 4 and 5 are circuit diagrams showing drive circuits 1a and 1b for the power elements that are examples of the structure using bipolar transistors. FIGS. 6 and 7 are circuit diagrams showing drive circuits 1c and 1d for the power elements that are examples of the structures using MOSFETs.

In drive circuit 1a shown in FIG. 4, switch elements Q1-Q4 are formed of NPN, PNP, NPN and PNP bipolar transistors, respectively. The bipolar transistors forming switch elements Q1-Q4 will be simply described as bipolar transistors Q1-Q4, respectively.

In FIG. 4, when bipolar transistors Q1-Q4 are of the NPN type, the emitter electrode is connected to a low voltage side, and the collector electrode is connected to a high voltage side. In the PNP type, the emitter electrode is connected to the high voltage side, and the collector electrode is connected to the low voltage side. More specifically, the collector electrodes of bipolar transistors Q1 and Q3 are connected to power supply node 11, and the emitter electrodes of bipolar transistors Q1 and Q2 are connected to connection node P1. The emitter electrodes of bipolar transistor Q3 and Q4 are connected to connection node P2 (emitter electrode E of IGBT 10), and the collector electrodes of bipolar transistors Q2 and Q4 are connected to ground node 12. Further, base electrodes G1 and G2 that are control electrodes of bipolar transistors Q1 and Q2, respectively, are connected to a connection node P3 arranged for providing a control signal SG1 to bipolar transistors Q1 and Q2. Base electrodes G3 and G4 of bipolar transistors Q3 and Q4 are connected to a connection node P4 arranged for providing a control signal SG2 to bipolar transistors Q3 and Q4.

A control unit 20a in FIG. 4 includes an inverter 24 connected between a division node P5 and connection node P4. Division node P5 is connected to signal input node Sin and connection node P3. Input signal SG0 provided from signal input node Sin is divided at division node P5 so that connection node P3 receives input signal SG0 as control signal SG1. Also, connection node P4 receives control signal SG2 that is produced by inverting the logical level of input signal SG0 by inverter 24.

Consequently, when input signal SG0 is at the H-level, the states of bipolar transistors Q1-Q4 attain the first state already described with reference to FIG. 1, and IGBT 10 switches to the on state. Conversely, when input signal SG0 is at the L-level, the states of bipolar transistors Q1-Q4 attain the second state already described with reference to FIG. 1, and IGBT 10 switches to the off state.

Drive circuit 1b shown in FIG. 5 differs from drive circuit 1a shown in FIG. 4 in that bipolar transistors Q3 and Q4 are of the PNP and NPN types instead of the NPN and PNP types, respectively, drive circuit 1b does not include inverter 24, and bipolar transistors Q3 and Q4 receive control signal SG2 at the same logical level as input signal SG0. In drive circuit 1b, the emitter and collector electrodes of bipolar transistor Q3 are connected to power supply node 11 and connection node P2, respectively, according to the changes in conductivity type of bipolar transistors Q3 and Q4. Also, the collector and emitter electrodes of bipolar transistor Q4 are connected to connection node P2 and ground node 12, respectively. The conductivity types of bipolar transistors Q3 and Q4 as well as the logical level of control signal SG2 provided to gate electrodes G3 and G4 is opposite to that of drive circuit 1a in FIG. 4. Therefore, the on/off operations of bipolar transistors Q3 and Q4 according to input signal SG0 are substantially the same as those of drive circuit 1a in FIG. 4. Other structures in FIG. 5 are substantially the same as those in drive circuit 1a in FIG. 4, and therefore description thereof is not repeated.

Drive circuits 1c and 1d shown in FIGS. 6 and 7 differ from drive circuits 1a and 1b shown in FIGS. 4 and 5 in that switch elements Q1-Q4 are formed of the MOSFETs, respectively. Therefore, in the description relating to FIGS. 4 and 5, when the base, emitter and collector electrodes of the bipolar transistor are read as the gate, source and drain electrodes of the MOSFET, respectively, and the NPN and PNP types of the bipolar transistors are read as the N-channel and the P-channel of the MOSFETS, respectively, the description relating to FIGS. 4 and 5 are also true with respect to drive circuits 1c and 1d shown in FIGS. 6 and 7. Therefore, description thereof is not repeated.

According to drive circuits 1 and 1a-1d of the first embodiment, as described above, by using single power supply 15 and switching switch elements Q1-Q4, both the forward and reverse biases can be applied to gate electrode G of IGBT 10. Also, the output of power supply 15 is necessary and sufficient for providing a magnitude that can reliably turn on IGBT 10. In the second prior art described before, the power supply supplies the voltage to which the charge voltage of the capacitor used for applying the reverse bias is added. However, the first embodiment can apply the reverse bias to gate electrode G of IGBT 10 using a smaller output voltage. Therefore, drive circuits 1 and 1a-1d of the first embodiment do not require a high breakdown voltage performance that is required in the first and second prior arts already described.

Second Embodiment

When a reverse bias is applied for turning off a power element such as an IGBT, a required drive current is substantially four times as large as that required when the reverse bias is not applied. Therefore, a drive power supply (i.e., a power supply for driving) requires a relatively large current capacity, and switch elements of a drive circuit must have large current capacities, respectively. Further, the turn-on time of the power element increases so that the switching loss increases. For increasing the switching speed of the power element, a resistance value of a gate resistance or a base resistance may be reduced. However, this increases a peak value of the drive current, and thus further increases a required current capacity of the drive power supply.

For overcoming the above problem, the second embodiment is configured as follows. When IGBT 10 is to be turned off, emitter and gate electrodes E and G of IGBT 10 are connected together through the path not passing through power supply 15 after temporarily attaining the second state, and thereby the charges accumulated between gate and emitter electrodes G and E are discharged. Thereby, the second embodiment reduces drive current ID at the time of turn-on. The second embodiment will be described below in detail with reference to FIGS. 8 to 15.

Figure 8:
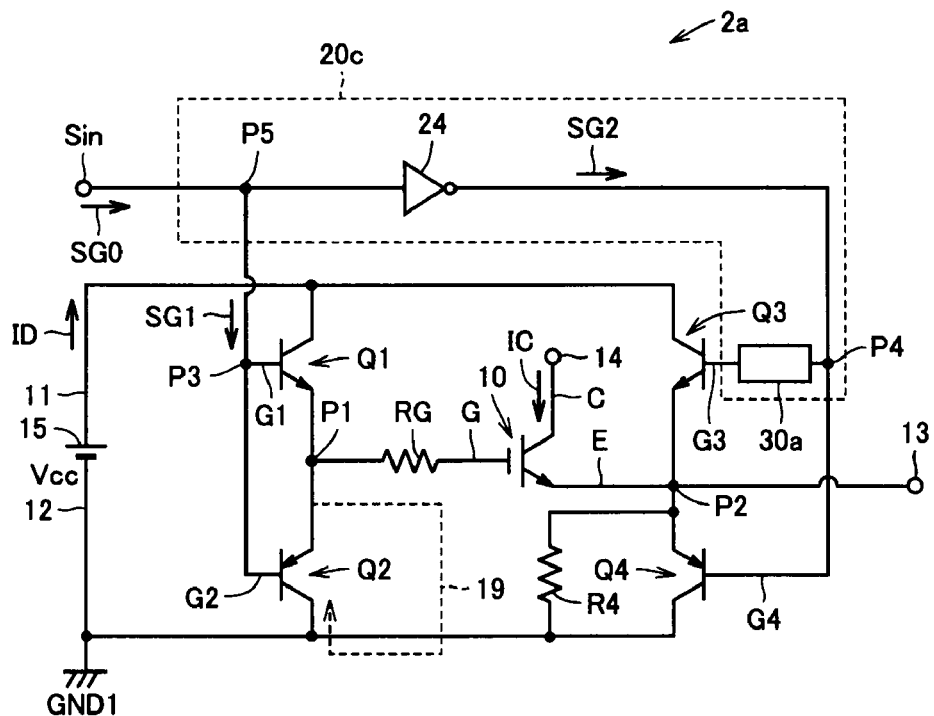
FIG. 8 is a circuit diagram showing a structure of a drive circuit 2a for IGBT 10 according to a second embodiment of the invention.

FIG. 8 is a circuit diagram showing a structure of a drive circuit 2a for IGBT 10. Drive circuit 2a shown in FIG. 8 is a modification of drive circuit 1a shown in FIG. 4. Drive circuit 2a differs from drive circuit 1a in FIG. 4 in that drive circuit 2a further includes a one-shot pulse generating circuit 30a connected between the gate electrode of bipolar transistor Q3 and connection node P4, and includes a resistance R4 connected between the emitter and collector electrodes of bipolar transistor Q4. One-shot pulse generating circuit 30a is included in a control unit 20c of drive circuit 2a. When an pulse signal provided to one-shot pulse generating circuit 30a changes from the L-level to the H-level, one-shot pulse generating circuit 30a outputs a one-shot pulse at the H-level using the this rising edge as a trigger. An example of a specific structure of one-shot pulse generating circuit 30a will be described later with reference to FIG. 10. A resistance value of resistance R4 is much larger than an emitter-collector resistance of bipolar transistors Q1-Q4 in the on state.

Figure 9:
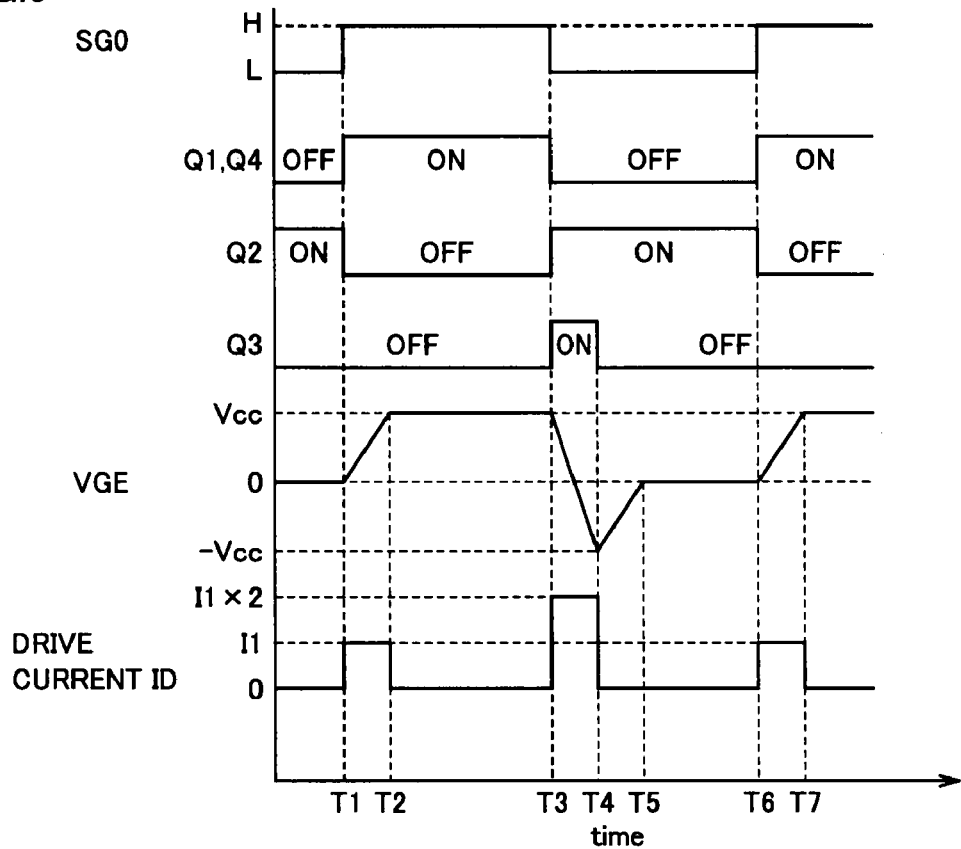
FIG. 9 is a time chart showing changes that occur in state relating to drive circuit 2a in FIG. 8 according to input signal SG0.

FIG. 9 is a time chart showing changes that occur in state relating to drive circuit 2a in FIG. 8 according to input signal SG0. In FIG. 9, the abscissa gives the time, and the ordinate gives, in the descending order, the logical level of input signal SG0, on/off states of bipolar transistors Q1-Q4, voltage VGE between the gate and emitter of IGBT 10 and drive current ID.

Referring to FIGS. 8 and 9, the operation of drive circuit 2a will be described below.

At time T1 in FIG. 9, input signal SG0 changes from the L-level to the H-level. At this time, bipolar transistors Q1 and Q2 receiving input signal SG0 as control signal SG1 attain the on and off states, respectively, and bipolar transistor Q4 receiving control signal SG2 produced by inverting input signal SG0 is turned on.

At a falling edge of control signal SG2 between the H- and L-levels, one-shot pulse generating circuit 30a does not generate the one-shot pulse, and keeps its output at the L-level. Therefore, bipolar transistor Q3 keeps the off state. Consequently, the states of bipolar transistors Q1-Q4 attain the first state already described with reference to FIG. 1, and a forward bias is applied to gate electrode G of IGBT 10 to turn on IGBT 10. During the turn-off time between times T1 and T2, gate-emitter voltage VGE changes from 0 to Vcc.

At time T3, input signal SG0 changes from the H-level to the L-level. At this time, bipolar transistors Q1 and Q2 receiving input signal SG0 at the L-level attain the off and on states, respectively, and bipolar transistor Q4 receiving control signal SG2 at the H-level attains the off state.

Since control signal SG2 changes from the L-level to the H-level, one-shot pulse generating circuit 30a generates the one-shot pulse at the H-level using this rising edge as a trigger. At a next time T4, the output of one-shot pulse generating circuit 30a returns to the L-level. In response to this pulse output, bipolar transistor Q3 temporarily keeps the on state between times T3 and T4 so that states of bipolar transistors Q1-Q4 temporarily attain the second state. Consequently, the reverse bias is applied to gate electrode G of IGBT 10 to turn off IGBT 10. In this operation, gate-emitter voltage VGE of IGBT 10 gradually changes from Vcc to −Vcc, and drive current ID is equal to (I1×2).

At time T4, bipolar transistors Q1, Q3 and Q4 are turned off so that a path between power supply node 11 and IGBT 10 is open. Meanwhile, bipolar transistor Q2 is on so that a discharge path 19 is formed from emitter electrode E of IGBT 10 through resistance R4 connected in parallel to bipolar transistor Q4, turned-on bipolar transistor Q2 and gate resistance RG to gate electrode G of IGBT 10.

Since the discharge current flows through this discharge path 19 not passing through power supply 15, the charges that have been accumulated between the gate and emitter of IGBT 10 are discharged between times T3 and T4. Drive by power supply 15 does not cause this discharge, in contrast to the discharge between times T5 and T6 in FIG. 2. When gate-emitter voltage VGE becomes 0 at time T5, the discharge is completed. The discharge time period between times T4 and T5 depends on the time constant that is determined by the resistance value of resistance R4 for the bypass, the resistance value of gate resistance RG and the gate capacitance of IGBT 10.

At a next time T6, input signal SG0 changes from the L-level to the H-level again so that the states of bipolar transistors Q1-Q4 attain the first state similarly to the case at time T1, and the forward bias is applied to gate electrode G of IGBT 10 so that IGBT 10 is turned on. At the start point of this turn-on, the discharge of the charges accumulated between the gate and emitter is already completed, and gate-emitter voltage VGE is already 0. Therefore, the quantity of change in gate-emitter voltage VGE during the turn-on time between times T6 and T7 is equal to Vcc from 0 to Vcc, and is half the value exhibited between times T5 and T6 in FIG. 2 showing the first embodiment. Consequently, drive current ID supplied by power supply 15 at the time of turn-on is equal to I1, which is half the current in the first embodiment.

In drive circuit 2a of the second embodiment, as described above, after the second state is temporarily attained, the charges accumulated between the gate and emitter of IGBT 10 are discharged through discharge path 19 not passing through power supply 15 so that gate-emitter voltage VGE returns to 0. Thereby, drive current ID at the time of turn-on of IGBT 10 can be reduced. Further, the quantity of change that occurs in gate-emitter voltage VGE at the time of turn-on also decreases so that the turn-on time of IGBT 10 can also be reduced.

Figure 10:
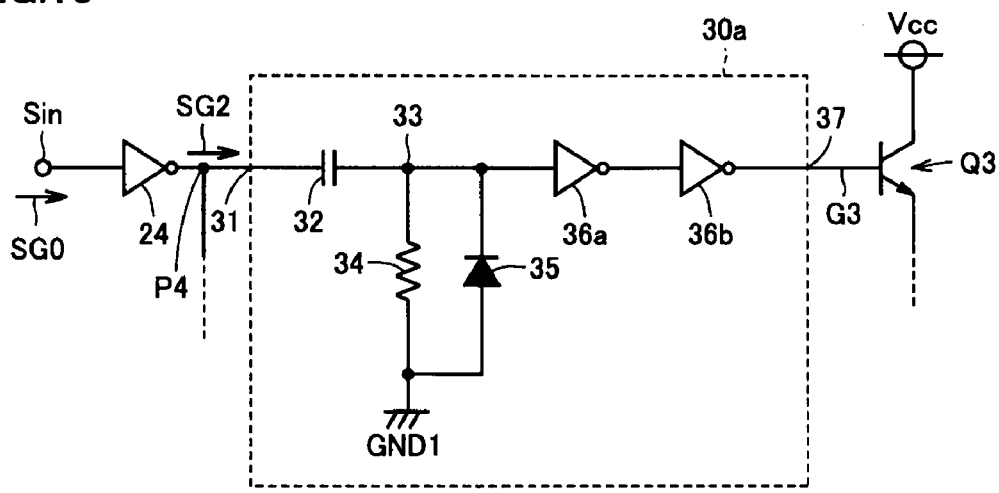
FIG. 10 is a circuit diagram showing an example of a specific structure of a one-shot pulse generating circuit 30a shown in FIG. 8.

FIG. 10 is a circuit diagram showing an example of a specific structure of one-shot pulse generating circuit 30a shown in FIG. 8.

As shown in FIG. 10, one-shot pulse generating circuit 30a includes a capacitor 32 connected between input-side node 31 and an intermediate node 33, and two inverters 36a and 36b connected in series between intermediate node 33 and an output-side node 37, and also includes a resistance 34 and a diode 35 that are connected, in parallel with each other, between intermediate node 33 and ground node GND1 (ground node 12). Input-side node 31 of one-shot pulse generating circuit 30a is connected to connection node P4, and an output-side node 37 is connected to a base electrode G3 of bipolar transistor Q3.

The circuit that is formed of capacitor 32 and resistance 34 is a so-called differential circuit, and differentiates the signal on input-side node 31 to provide a result to intermediate node 33. However, when a potential V(33) on intermediate node 33 is negative with respect to ground GND1, the current flows forward through diode 35 so that potential V(33) of intermediate node 33 is restricted substantially to 0. Further, two inverters 36a and 36b connected in series in FIG. 10 are used as a buffer rectifying the input voltage waveform into a rectangular wave.

Figure 11:
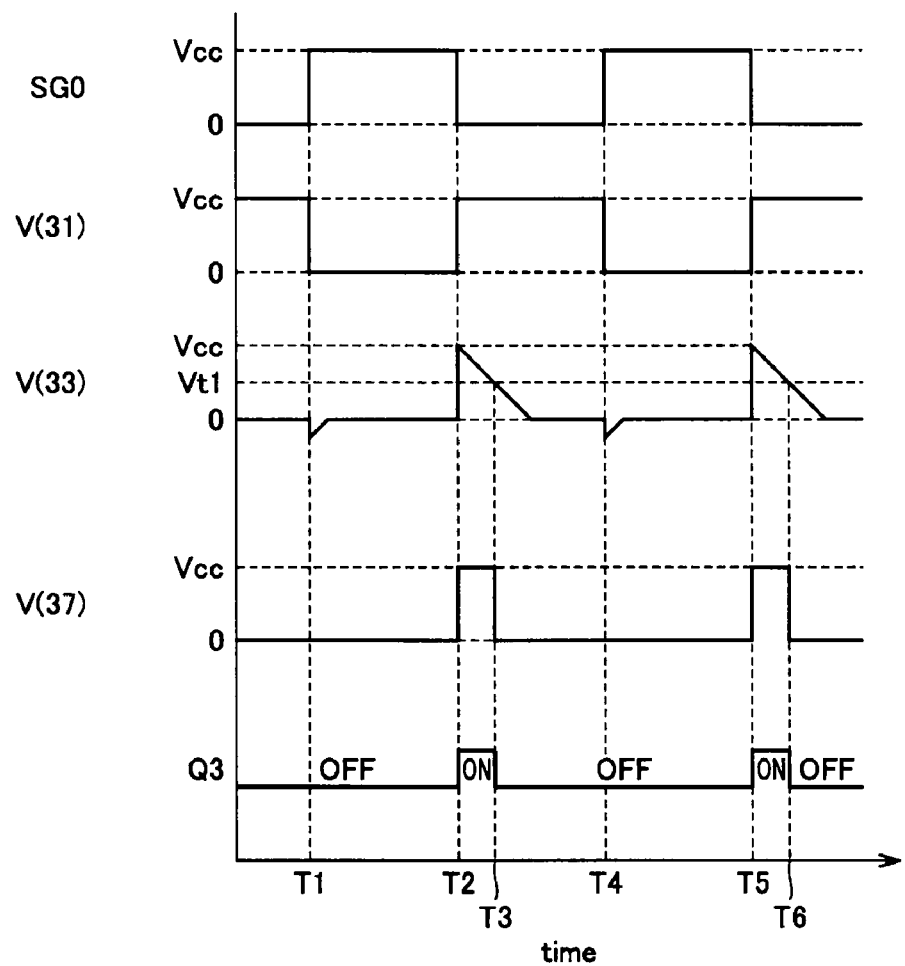
FIG. 11 is a time chart showing changes that occur in state relating to one-shot pulse generating circuit 30a shown in FIG. 10 according to input signal SG0.

FIG. 11 is a time chart showing changes that occur in state relating to one-shot pulse generating circuit 30a shown in FIG. 10 according to input signal SG0. In FIG. 11, the abscissa gives the time, and the ordinate gives, in the descending order, the logical level of input signal SG0 (i.e., a potential V(Sin) of signal input node Sin), a potential V(31) of input-side node 31, potential V(33) of intermediate node 33, a potential V(37) of output-side node 37 and an operation state of bipolar transistor Q3.

Referring to FIGS. 10 and 11, at times T1 and T4, input signal SG0 changes from the L-level (0) to the H-level (Vcc) so that potential V(31) of input-side node 31 changes from Vcc to 0. At this time, diode 35 restricts the negative potential that is produced as the differential signal on intermediate node 33 so that potential V(33) on intermediate node 33 lowers potential corresponding to the forward voltage drop of diode 35.

At times T2 and T5, potential V(31) of input-side node 31 changes from 0 to Vcc according to input signal SG0 so that potential V(33) that is produced as the differential signal on intermediate node 33 will gradually return to 0 after rising to Vcc. Consequently, potential V(33) of intermediate node 33 becomes equal to or higher than a threshold voltage Vt1 of inverter 36a. Between times T2 and T3 and between times T5 and T6, the pulse signal at the H-level (power supply voltage Vcc) is provided to output-side node 37. Bipolar transistor Q3 is turned on in response to reception of this pulse output. The respective time lengths between times T2 and T3, and between times T5 and T6 correspond to the pulse width of the one-shot pulse, and depend on the time constant of the differential circuit that is a product of the capacitance of capacitor 32 and the value of resistance 34.

Figure 12:
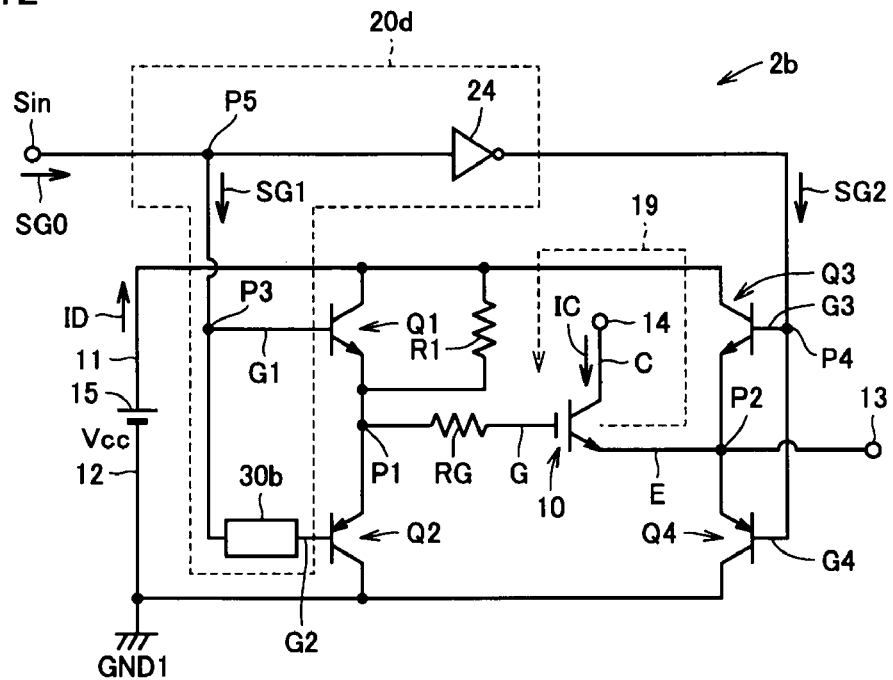
FIG. 12 is a circuit diagram showing a structure of a drive circuit 2b that is a modification of drive circuit 2a shown in FIG. 8.

FIG. 12 is a circuit diagram showing a structure of a drive circuit 2b that is a modification of drive circuit 2a shown in FIG. 8. Drive circuit 2b in FIG. 12 differs from drive circuit 2a shown in FIG. 8 in that it does not include one-shot pulse generating circuit 30a and resistance R4 in FIG. 8, and alternatively includes a one-shot pulse generating circuit 30b connected between connection node P3 and a base electrode G2 of bipolar transistor Q2, and a resistance R1 connected between the collector and emitter electrodes of bipolar transistor Q1. One-shot pulse generating circuit 30b is included in a control unit 20d of drive circuit 2b. When a pulse signal provided to one-shot pulse generating circuit 30b changes from the H-level to the L-level, one-shot pulse generating circuit 30b uses, as a trigger, a falling edge of the above pulse signal and outputs a one-shot pulse at the L-level that temporarily attains the L-level and will return to the H-level. The specific structure of one-shot pulse generating circuit 30b will be described later with reference to FIG. 14. Resistance R1 has a resistance value much larger than that of the emitter-collector resistances of bipolar transistors Q1-Q4 in the on state.

Figure 13:
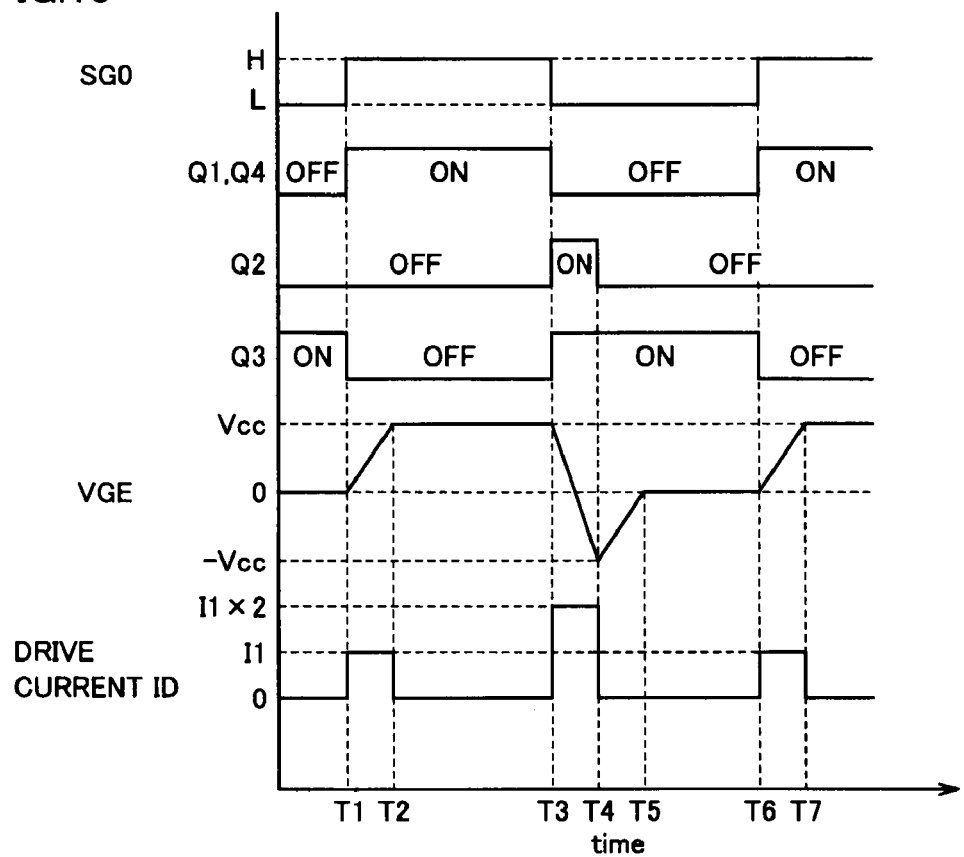
FIG. 13 is a time chart showing changes that occur in state relating to drive circuit 2b in FIG. 12 according to input signal SG0.

FIG. 13 is a time chart showing changes that occur in state relating to drive circuit 2b in FIG. 12 according to input signal SG0. In FIG. 13, the abscissa gives the time, and the ordinate gives, in the descending order, the logical level of input signal SG0, the on/off states of bipolar transistors Q1-Q4, gate-emitter voltage VGE of IGBT 10 and drive current ID.

Referring to FIGS. 12 and 13, an operation of drive circuit 2b will be described below. FIG. 13 differs from the time chart of drive circuit 2a of FIG. 9 in that the waveform of bipolar transistor Q2 is interchanged with that of bipolar transistors Q3. Accordingly, the following description will be primarily given on the operations of bipolar transistors Q2 and Q3, and description is not repeated in connection with the operations that are substantially the same as those in drive circuit 2a.

At time T1 in FIG. 13, input signal SG0 changes from the L-level to the H-level. At this time, bipolar transistor Q3 that receives an inverted signal of input signal SG0 changes to the off state. At the rising edge of input signal SG0 changing from the L-level to the H-level, one-shot pulse generating circuit 30b does not generates a one-shot pulse, and keeps its output at the H-level. Therefore, bipolar transistor Q2 keeps the off state. Consequently, the states of bipolar transistors Q1-Q4 attain the first state, and IGBT 10 is turned on.

When input signal SG0 changes from the H-level to the L-level at time T3, bipolar transistor Q3 is turned on. Since input signal SG0 changes from the H-level to the L-level, one-shot pulse generating circuit 30b generates the one-shot pulse at the L-level, using the falling edge of input signal SG0 as a trigger. The output of one-shot pulse generating circuit 30b returns to the H-level at subsequent time T4. In response to this pulse output, bipolar transistor Q2 attains the on state between times T3 and T4 so that the states of bipolar transistors Q1-Q4 temporarily attain the second state to turn off IGBT 10.

At time T4, since bipolar transistors Q1, Q2 and Q4 are turned off, a path between ground node 12 and IGBT 10 is open. Since bipolar transistor Q3 is on, discharge path 19 is formed from emitter electrode E of IGBT 10 through turned-on bipolar transistor Q3, resistance R1 for bypass and gate resistance RG to gate electrode G of IGBT 10. Since the discharge current flows through discharge path 19 not passing through power supply 15, the charges that have been accumulated between the gate and emitter of IGBT 10 between times T3 and T3 are discharged.

As described above, drive circuit 2b in FIG. 12 likewise discharges the charges accumulated between the gate and emitter of IGBT 10 through discharge path 19 not passing through power supply 15 after temporarily attaining the second state. Therefore, drive circuit 2b in FIG. 12 can achieve substantially the same effect as drive circuit 2a in FIG. 8.

Figure 14:
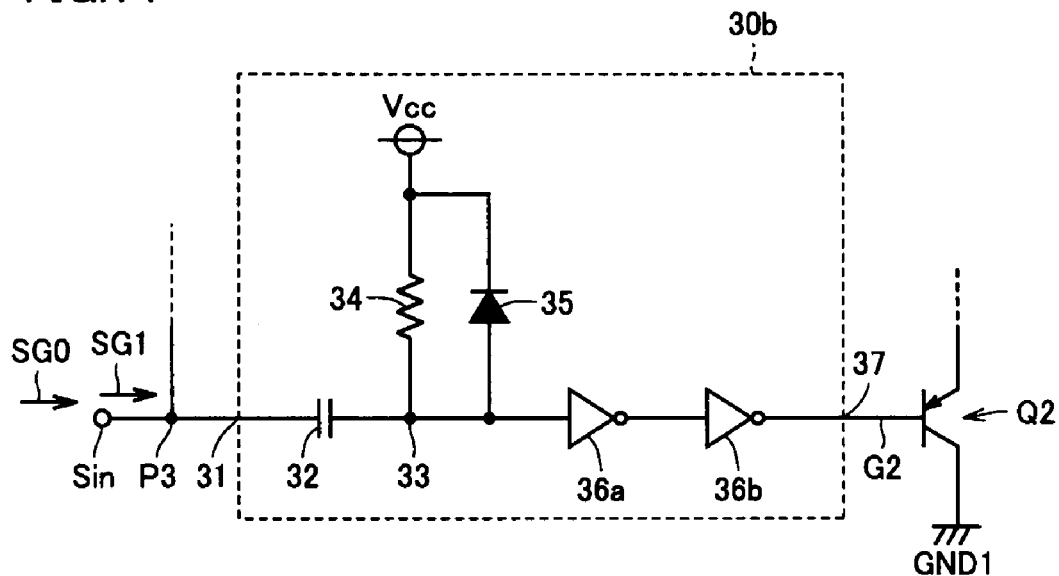
FIG. 14 is a circuit diagram showing an example of a specific structure of a one-shot pulse generating circuit 30b shown in FIG. 12.

FIG. 14 is a circuit diagram showing an example of a specific structure of one-shot pulse generating circuit 30b shown in FIG. 12.

One-shot pulse generating circuit 30b shown in FIG. 14 differs from one-shot pulse generating circuit 30a shown in FIG. 10 in that resistance 34 and diode 35 are connected between intermediate node 33 and power supply node 11 (power supply voltage Vcc). In connection with the polarity, diode 35 in FIG. 14 has the cathode connected to power supply node 11 as well as the anode connected to intermediate node 33. As described above, intermediate node 33 is connected to power supply node 11 through resistance 34 so that potential V(33) of intermediate node 33 is fixed to Vcc when potential V(31) of input-side node 31 does not change. When potential V(31) of input-side node 31 changes, a potential produced by superimposing a differential signal thereof on power supply voltage Vcc occurs on intermediate node 33. When potential V(33) of intermediate node 33 exceeds power supply voltage Vcc, the forward flow occurs in diode 35 so that potential V(33) of intermediate node 33 is substantially restricted to Vcc.

Figure 15:
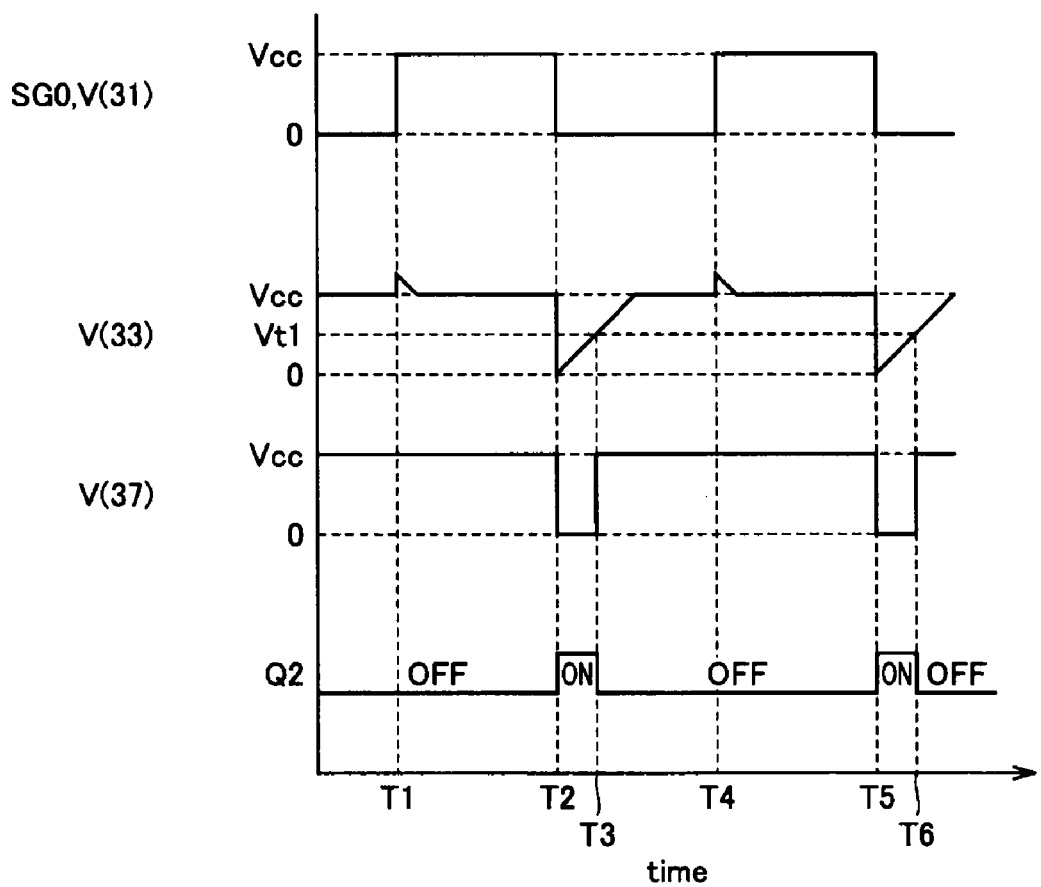
FIG. 15 is a time chart showing changes that occur in state relating to one-shot pulse generating circuit 30b shown in FIG. 14 according to input signal SG0.

FIG. 15 is a time chart showing changes that occur in state relating to one-shot pulse generating circuit 30b shown in FIG. 14 according to input signal SG0. In FIG. 15, the abscissa gives the time, and the ordinate gives, in the descending order, the logical level of input signal SG0 (equal to potential V(31) of input-side node 31), potential V(33) of intermediate node 33, potential V(37) of output-side node 37 and the operation state of bipolar transistor Q2.

Referring to FIGS. 14 and 15, when potential V(31) of input-side node 31 changes from 0 to Vcc according to input signal SG0 at time T1 or T4, diode 35 restricts the rising of the voltage so that potential V(33) of intermediate node 33 slightly rises by a magnitude equal to the forward voltage drop of diode 35. When potential V(31) of input-side node 31 changes from Vcc to 0, potential V(33) of intermediate node 33 lowers to 0 and then gradually returns to Vcc. Potential V(33) of intermediate node 33 becomes equal to or lower than threshold voltage Vt1 of inverter 36a between times T2 and T4, and between times T5 and T6, and the potential of 0, i.e., the pulse signal at the L-level occurs on the output-side node during these time periods. In response to this pulse output, bipolar transistor Q2 is turned on.

Although the second embodiment described above relates to the structures of drive circuits 2a and 2b implemented by modifying drive circuit 1a shown in FIG. 4, the drive circuit for the power element that can achieve substantially the same operation and effect can be implemented by modifying drive circuits 1b-1d shown in FIGS. 5-7. For connecting the one-shot pulse generating circuit to the NPN-type bipolar transistor or the N-channel MOSFET, one-shot pulse generating circuit 30a shown in FIG. 10 is employed. For connecting the one-shot pulse generating circuit to the PNP-type bipolar transistor or the P-channel MOSFET, one-shot pulse generating circuit 30b shown in FIG. 14 is used.

Third Embodiment

A third embodiment aims to reduce drive current ID when IGBT 10 is turned off. More specifically, when switch elements Q1-Q4 change from the first state to the second state, this embodiment delays timing according to which one of switch elements Q2 and Q3 is turned on. During this period of delay, emitter and gate electrodes E and G of IGBT 10 are connected together without interposing power supply 15 therebetween so that the charges accumulated between the gate and emitter are discharged. Details will be described below with reference to FIGS. 16 to 23.

Figure 16:
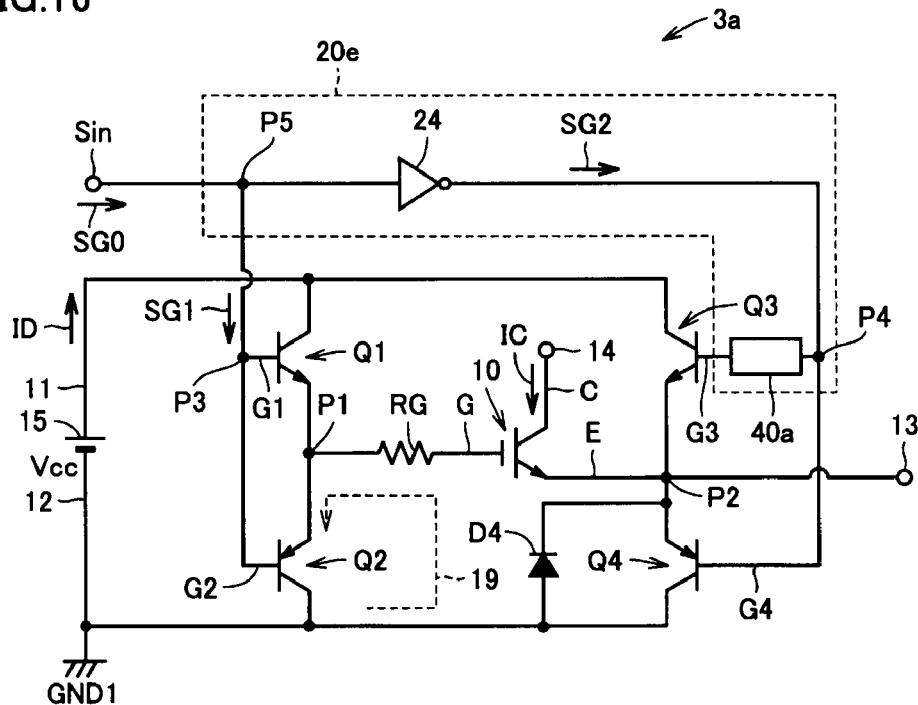
FIG. 16 is a circuit diagram showing a structure of a drive circuit 3a for IGBT 10 according to a third embodiment of the invention.

FIG. 16 is a circuit diagram showing a structure of a drive circuit 3a for IGBT 10 according to the third embodiment of the invention. Drive circuit 3a shown in FIG. 16 is a modification of drive circuit 1a shown in FIG. 4. Drive circuit 3a shown in FIG. 16 differs from drive circuit 1a shown in FIG. 4 in that drive circuit 3a further includes a diode D4 connected between the emitter and collector electrodes of bipolar transistor Q4, and a delay circuit 40a connected between gate electrode G3 and connection node P4 of bipolar transistor Q3. The cathode of diode D4 is connected to the emitter electrode of bipolar transistor Q4, and the anode of diode D4 is connected to the collector electrode. In the second state, therefore, when bipolar transistor Q3 is turned on, diode D4 is reversely biased and does not conduct. Delay circuit 40a is included in a control unit 20e of drive circuit 3a, and has a function of delaying a rising edge of the input pulse signal changing from the L-level to the H-level. A specific example of delay circuit 40a will be described later with reference to FIG. 18.

Figure 17:
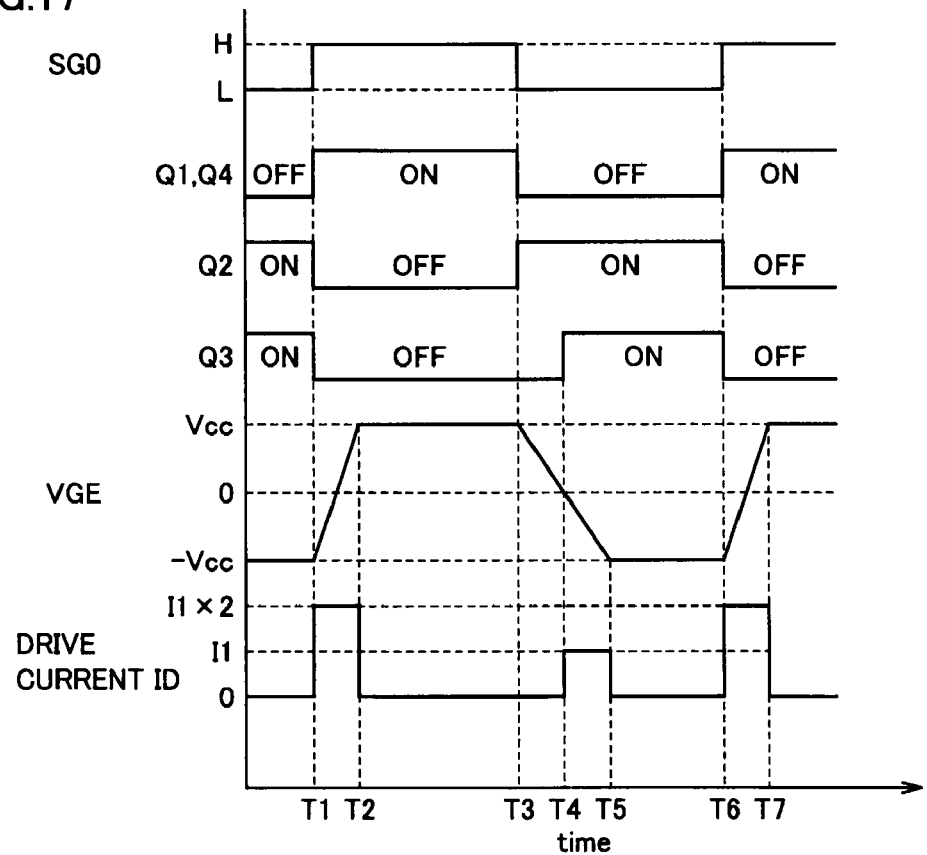
FIG. 17 is a time chart showing changes that occur in state relating to drive circuit 3a in FIG. 16 according to input signal SG0.

FIG. 17 is a time chart showing changes that occur in state of drive circuit 3a in FIG. 16 according to input signal SG0. In FIG. 17, the abscissa gives the time, and the ordinate gives, in the descending order, the logical level of input signal SG0, the on/off states of bipolar transistors Q1-Q4, gate-emitter voltage VGE of IGBT 10 and drive current ID.

Referring to FIGS. 16 and 17, an operation of drive circuit 3a will be described below.

When input signal SG0 changes from the L-level to the H-level at time T1 in FIG. 17, bipolar transistors Q1 and Q2 receiving input signal SG0 attain the on and off states, respectively, and bipolar transistor Q4 receiving control signal SG2 produced by inverting input signal SG0 is turned on. At the falling edge of control signal SG2 changing from the H-level to the L-level, delay circuit 40a does not cause a delay so that bipolar transistor Q3 connected to delay circuit 40a changes to the off state without a delay from time T1. Consequently, the states of bipolar transistors Q1-Q4 enter the first state already described with reference to FIG. 1 so that a forward bias is applied to gate electrode G of IGBT 10 to turn on IGBT 10. During the turn-on time between times T1 and T2, gate-emitter voltage VGE changes from −Vcc to Vcc.

Then, input signal SG0 changes from the H-level to the L-level at time T3. At this time, bipolar transistors Q1 and Q2 attain the off and on states, respectively, bipolar transistor Q4 receiving control signal SG2 produced by inverting input signal SG0 is turned off. When control signal SG2 changes from the L-level to the H-level at time T3, delay circuit 40a delays the rising of control signal SG2 to time T4, and outputs it. In response to this output, bipolar transistor Q3 keeps the off state until time T4, and changes to the on state at time T4.

Between times T3 and T4, bipolar transistor Q3 is not yet turned on, and bipolar transistors Q1, Q3 and Q4 are off so that a path between power supply node 11 and IGBT 10 is open. Meanwhile, bipolar transistor Q2 is on and therefore discharge path 19 is formed from gate electrode G of IGBT 10 through gate resistance RG, turned-on bipolar transistor Q2 and forward diode D4 to emitter electrode E of IGBT 10. Since the discharge current flows through discharge path 19 not passing through power supply 15, the charges accumulated between the gate and emitter of IGBT 10 are discharged. In contrast to the period between times T3 and T4 shown in FIG. 2, this discharge is not caused by the driving by power supply 15. When gate-emitter voltage VGE becomes 0, the discharge is completed. The time required for completing the discharge depends on a time constant determined by the resistance value of gate resistance RG, the gate capacitance of IGBT 10 and the like.

When bipolar transistor Q3 changes to the on state at time T4, the states of bipolar transistors Q1-Q4 attain the second state so that a reverse bias is applied to gate electrode G of IGBT 10. In FIG. 17, the discharge is already completed and gate-emitter voltage VGE is already 0 at time T4 so that gate-emitter voltage VGE changes from 0 to −Vcc between times T4 and T5.

In the third embodiment, as described above, the turn-off period between times T3 and T5 includes a first period between times T3 and T4 as well as a second period between times T4 and T5. In the first period, the charges accumulated between the gate and emitter of IGBT 10 are discharged through the path not passing through power supply 15. Therefore, this discharge is not driven by power supply 15. In the second period following the first period, power supply 15 supplies drive current ID to apply a reverse bias to IGBT 10. When the discharging of the charges accumulated between the gate and emitter was completed in the first period, the quantity of change in gate-emitter voltage VGE in the second period is Vcc so that drive current ID required for the turn-off is I1, which is half the current in the case of the first embodiment shown between T3 and T4 in FIG. 2. As described above, drive circuit 3a in the third embodiment can reduce drive current ID required for the turn-off.

At time T6, input signal SG0 changes again from the L-level to the H-level. Similarly to the case at time T1, therefore, the states of bipolar transistors Q1-Q4 attain the first state so that a forward bias is applied to gate electrode G of IGBT 10 to turn on IGBT 10. In the third embodiment, a process of discharging the charges accumulated between the gate and emitter is not present during the turn-on so that required drive current ID is (I1×2), which is equal to that in the first embodiment indicated between T5 and T6 in FIG. 2.

Figure 18:
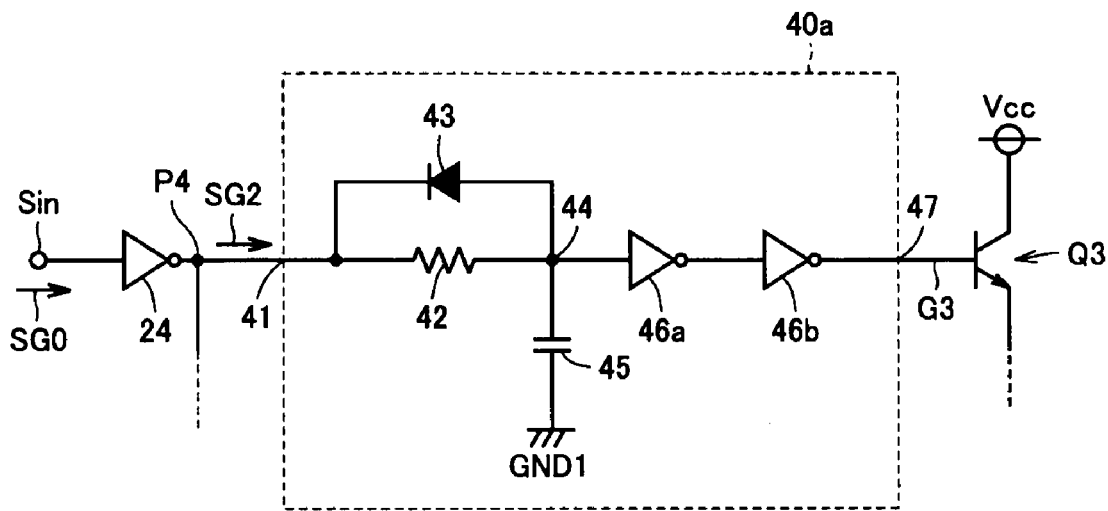
FIG. 18 is a circuit diagram showing an example of a specific structure of a delay circuit 40a shown in FIG. 16.

FIG. 18 is a circuit diagram showing an example of a specific structure of delay circuit 40a shown in FIG. 16.

As shown in FIG. 18, delay circuit 40a includes a resistance 42 connected between an input-side node 41 and an intermediate node 44, two inverters 46a and 46b for buffer connected in series between intermediate node 44 and an output-side node 47, a diode 43 connected in parallel to resistance 42, and a capacitor 45 connected between intermediate node 44 and ground node 12 (ground GND1). In connection with the polarity, diode 43 has a cathode connected to input-side node 41 and an anode connected to intermediate node 44. Input-side node 41 of delay circuit 40a is connected to connection node P4, and output-side node 47 is connected to base electrode G3 of bipolar transistor Q3.

Figure 19:
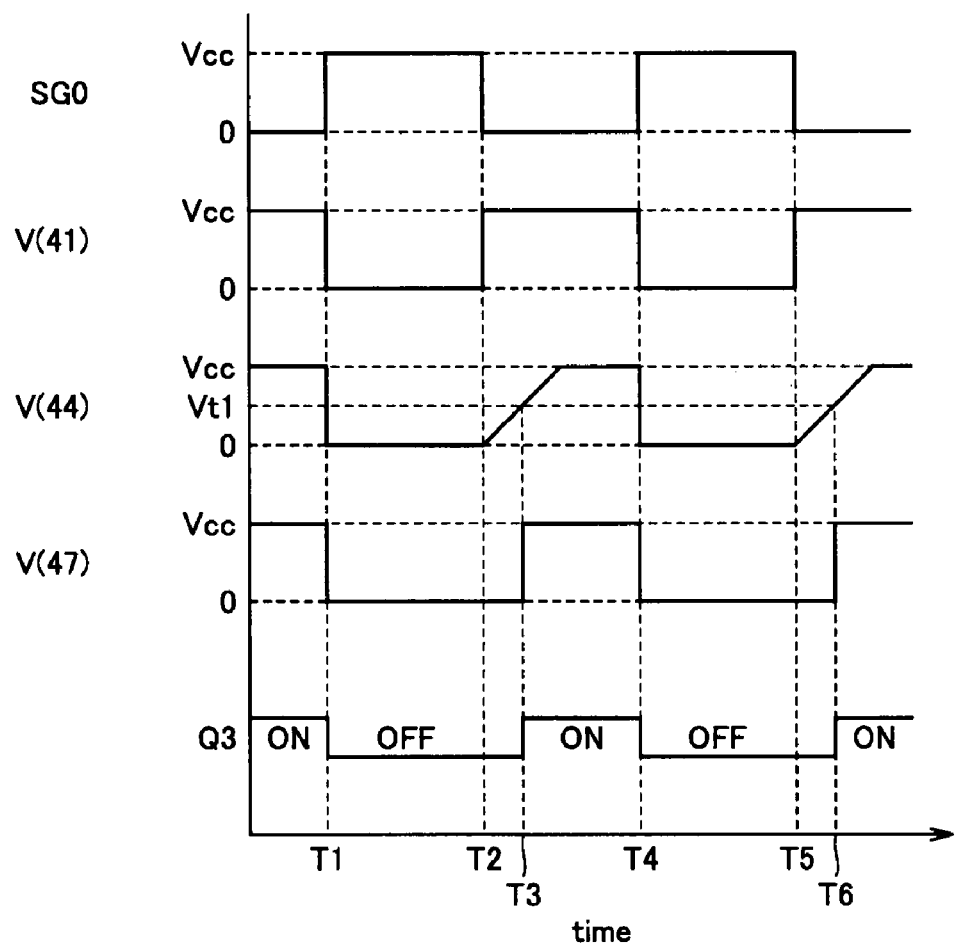
FIG. 19 is a time chart showing changes that occur in state relating to delay circuit 40a shown in FIG. 18 according to input signal SG0.

FIG. 19 is a time chart showing changes that occur in state relating to delay circuit 40a shown in FIG. 18 according to input signal SG0. In FIG. 19, the abscissa gives the time, and the ordinate gives, in the descending order, the logical level of input signal SG0 (potential V(Sin) of signal input node Sin), potential V(41) of input-side node 41, potential V(44) of intermediate node 44, potential V(47) of output-side node 47 and the operation state of bipolar transistor Q3.

Referring to FIGS. 18 and 19, potential V(41) of input-side node 41 changes from Vcc to 0 in response to the change of input signal SG0 from the L-level (0) to the H-level (Vcc) at times T1 and T4. At the time of this falling of potential V(41), a forward current flows in diode 43 so that potential V(44) of intermediate node 44 follows the changes in potential V(41) of input-side node 41 and thereby changes from Vcc to 0.

At times T2 and T5, potential V(41) of input-side node 41 changes from 0 to Vcc. At this time, diode 43 is reversely biased to keep the off state. Therefore, the effect of an integration circuit formed of resistance 42 and capacitor 45 dulls the rising edge of the signal produced on intermediate node 44, and potential V(44) of intermediate node 44 gradually rises from 0 to Vcc. Consequently, after time T3 or T6 when potential V(44) of intermediate node 44 becomes equal to or higher than threshold voltage Vt1 of inverter 46a, potential V(47) of output-side node 47 attains Vcc, and bipolar transistor Q3 is turned on.

In delay circuit 40a, as described above, potential V(47) of output-side node 47 rises according to the timing delayed by the delay time between times T2 and T3 or between times T5 and T6 in FIG. 9 from the rising timing of potential V(41) of input-side node 41. This delay time depends on the time constant of the integration circuit that is a product of the capacitance of capacitor 45 and the resistance value of resistance 42.

Figure 20:
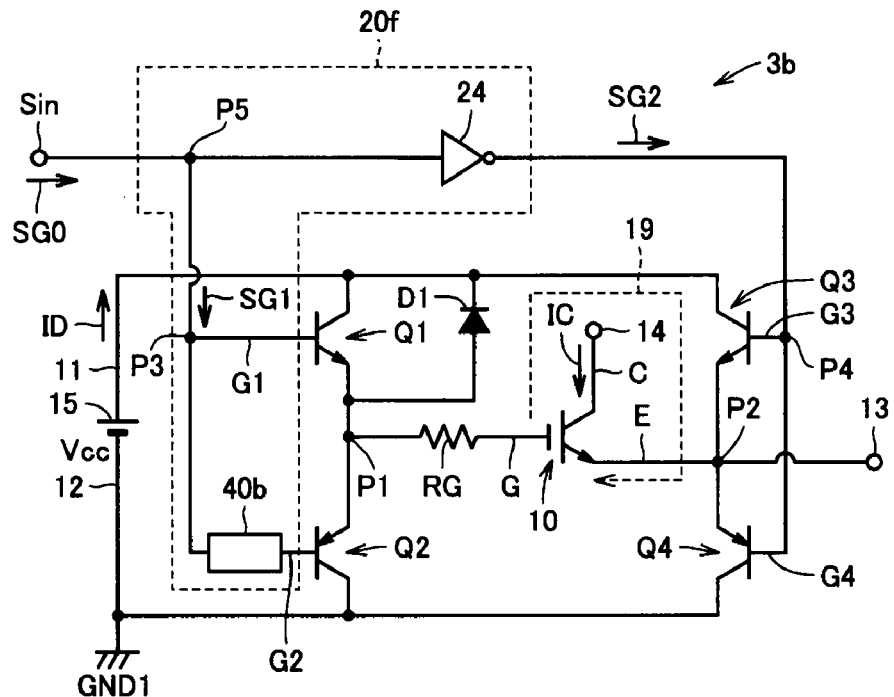
FIG. 20 is a circuit diagram showing a structure of a drive circuit 3b that is a modification of drive circuit 3a shown in FIG. 16.

FIG. 20 is a circuit diagram showing a structure of a drive circuit 3b that is a modification of drive circuit 3a shown in FIG. 16. Drive circuit 3b in FIG. 20 differs from drive circuit 3a in FIG. 16 in that drive circuit 3b does not include diode D4 and delay circuit 40a in FIG. 16, and alternatively includes a diode D1 connected between the collector and emitter electrodes of bipolar transistor Q1 as well as a delay circuit 40b connected between connection node P3 and base electrode G2 of bipolar transistor Q2. Diode D1 has a cathode connected to the collector electrode of bipolar transistor Q1, and has an anode connected to the emitter electrode thereof. Therefore, when bipolar transistor Q2 is turned on in the second state, diode D1 is reversely biased, and does not conduct. Delay circuit 40b in FIG. 20 is included in a control unit 20f of drive circuit 3b, and delays a falling edge at which the input pulse signal changes from the H-level to the L-level. A specific structure of delay circuit 40b will be described later with reference to FIG. 22.

Figure 21:
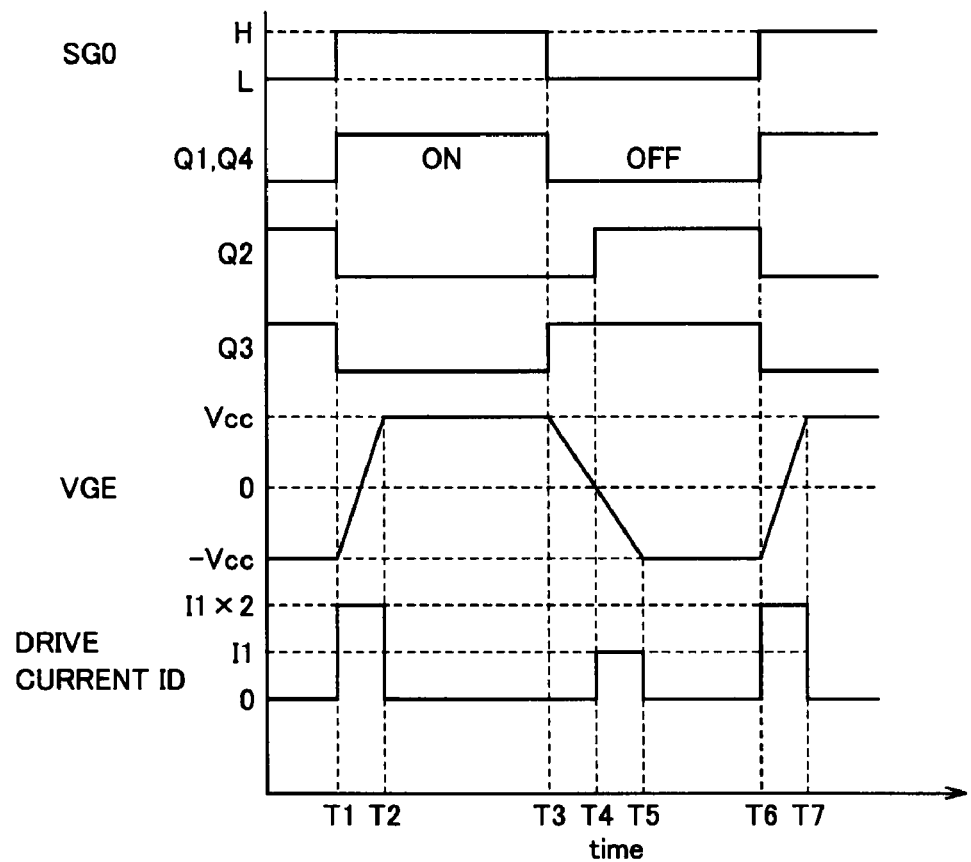
FIG. 21 is a time chart showing changes that occur in state relating to drive circuit 3b shown in FIG. 20 according to input signal SG0.

FIG. 21 is a time chart showing changes that occur in state relating to drive circuit 3b shown in FIG. 20 according to input signal SG0. In FIG. 21, the abscissa gives the time, and the ordinate gives, in the descending order, the logical level of input signal SG0, the on/off states of bipolar transistors Q1-Q4, gate-emitter voltage VGE of IGBT 10 and drive current ID.

Referring to FIGS. 20 and 21, an operation of drive circuit 3b will be described below. FIG. 21 differs from the time chart relating to drive circuit 3a in FIG. 17 in that the waveforms of bipolar transistors Q2 and Q3 are interchanged with each other. In the following description, therefore, the operations of bipolar transistors Q2 and Q3 will be primarily described, and description of the operations similar to those of drive circuit 3a is not repeated.

At time T1 in FIG. 21, input signal SG0 changes from the L-level to the H-level. In this operation, bipolar transistor Q3 receiving control signal SG2 produced by inverting input signal SG0 changes to the off state. Base electrode G2 of bipolar transistor Q2 receives the output of delay circuit 40b. At the rising edge of input signal SG0 changing from the L-level to the H-level, delay circuit 40b does not cause the delay in timing so that bipolar transistor Q2 changes to the off state at time T1.

At time T3, input signal SG0 changes from the H-level to the L-level, and thereby and bipolar transistor Q3 changes to the on state. Delay circuit 40b delays the falling timing of change of input signal SG0 from the H-level to the L-level for outputting it. Bipolar transistor Q2 receiving the output keeps the off state until time T4, and changes to the on state at time T4.

For a period between times T3 and T4 before bipolar transistor Q2 changes to the on state, bipolar transistors Q1, Q2 and Q4 are off so that a path between ground node 12 and IGBT 10 is open. Meanwhile, bipolar transistor Q3 is on so that discharge path 19 is formed from gate electrode G of IGBT 10 through gate resistance RG, forward diode D1 and turned-on bipolar transistor Q3 to emitter electrode E of IGBT 10. The discharge current flows through discharge path 19 not passing through power supply 15, and thereby the charges accumulated between the gate and emitter of IGBT 10 are discharged.

When bipolar transistor Q2 changes to the on state at time T4, the states of bipolar transistors Q1-Q4 attain the second state so that a reverse bias is applied to gate electrode G of IGBT 10.

As described above, drive circuit 3b discharges the charges accumulated between the gate and emitter of IGBT 10 through the path not passing through power supply 15 during the first turn-off period between T3 and T4 similarly to drive circuit 3a in FIG. 16 so that drive current ID required for the turn-off can be reduced.

Figure 22:
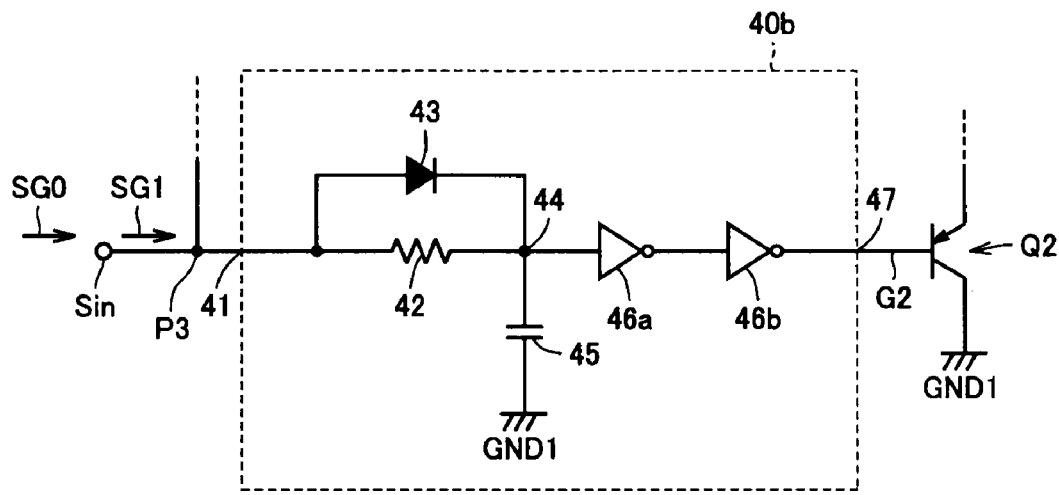
FIG. 22 is a circuit diagram showing an example of a specific structure of delay circuit 40b shown in FIG. 20.

FIG. 22 is a circuit diagram showing an example of a specific structure of delay circuit 40b shown in FIG. 20b.

Delay circuit 40b shown in FIG. 22 differs from delay circuit 40a shown in FIG. 18 in that the anode of diode 43 is connected to input-side node 41, and the cathode thereof is connected to intermediate node 44. Since the polarities of diode 43 are different from those of in FIG. 18, delay circuit 40b in FIG. 22 delays the falling timing when the pulse signal is provided to input-side node 41, in contrast to delay circuit 40a in FIG. 18 that delays the rising timing.

Figure 23:
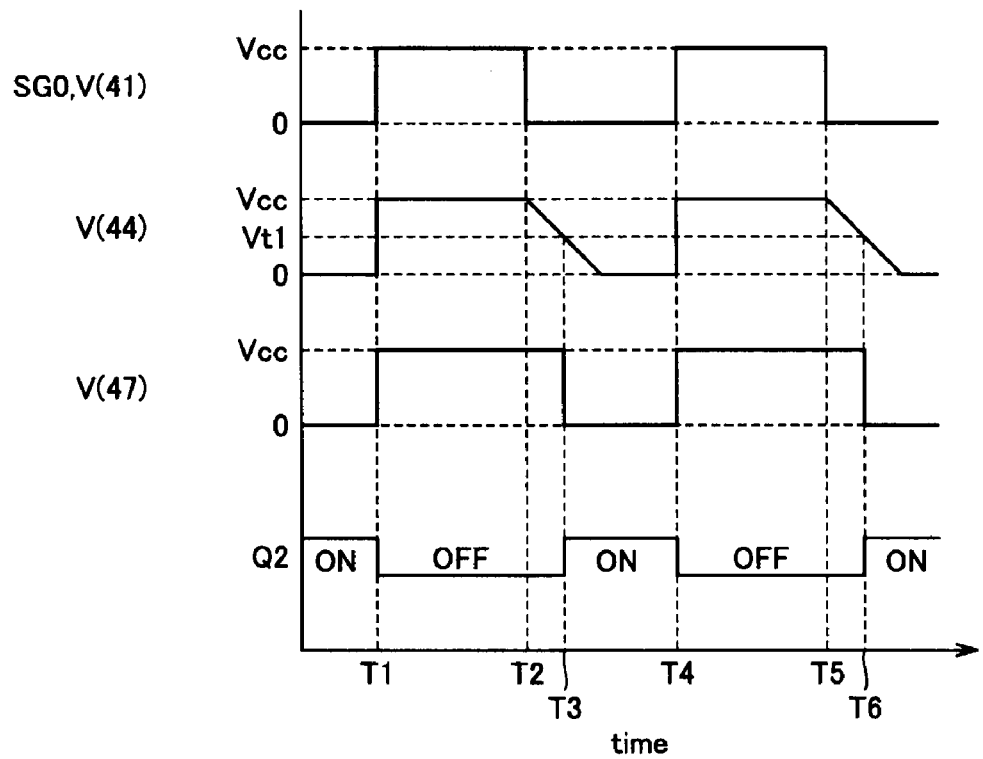
FIG. 23 is a time chart showing changes that occur in state relating to delay circuit 40b shown in FIG. 22 according to input signal SG0.

FIG. 23 is a time chart showing changes that occur in state relating to delay circuit 40b shown in FIG. 22 according to input signal SG0. In FIG. 23, the abscissa gives the time, and the ordinate gives, in the descending order, the logical level of input signal SG0 (potential V(41) of input-side node 41), potential V(44) of intermediate node 44, potential V(47) of output-side node 47, and the operation state of bipolar transistor Q2.

Referring to FIGS. 22 and 23, potential V(41) of input-side node 41 changes from 0 to Vcc in response to input signal SG0 at times T1 and T4. At the time of this rising of potential V(41), a forward current flows in diode 43 so that potential V(44) of intermediate node 44 follows the changes in potential V(41) of input-side node 41 and thereby changes from 0 to Vcc.

At times T2 and T5, potential V(41) of input-side node 41 changes from Vcc to 0. At this time of falling of potential V(41), the rising edge of the signal produced on intermediate node 44 dulls, and potential V(44) of intermediate node 44 gradually falls from Vcc to 0. Consequently, after time T3 or T6 when potential V(44) of intermediate node 44 becomes lower than threshold voltage Vt1 of inverter 46a, potential V(47) of output-side node 47 becomes 0, and bipolar transistor Q3 is turned on. Thus, the falling timing of potential V(47) of output-side node 47 delays from the falling timing of potential V(41) of input-side node 41 by the delay time lengths between times T2 and T3 as well as between times T5 and T6.

Although the third embodiment described above relates to the structures of drive circuits 3a and 3b implemented by modifying drive circuit 1a in FIG. 4, the drive circuit for the power element that can achieve substantially the same operation and effect can be implemented by modifying drive circuits 1b-1d shown in FIGS. 5-7. For connecting the delay circuit to the NPN-type bipolar transistor or the N-channel MOSFET, delay circuit 40a shown in FIG. 18 is used. For connecting the delay circuit to the PNP-type bipolar transistor or the P-channel MOSFET, delay circuit 40b shown in FIG. 22 is used.

When MOSFETs are used as switch elements Q1-Q4, parasitic diodes of the MOSFETs can be used as discharge path 19. Therefore, it is not necessary to connect diode D1 or D4 in parallel to switch element Q1 or Q4, in contrast to the structures in FIGS. 16 and 20.

The third embodiment can be combined with the second embodiment. This combination can achieve the effect of the second embodiment, i.e., the reduction of drive current ID at the time of turn-on of IGBT 10 and the shortening of the turn-on time, and can also achieve the effect of the third embodiment, i.e., the reduction of drive current ID at the time of turn-off. Since the drive current can be reduced at both the times of turn-on and turn-off, power supply 15 and switch elements Q1-Q4 for the driving can have small current capacities, respectively, which offers a cost advantage.

Fourth Embodiment

A fourth embodiment aims at reduction of drive current ID that flows when IGBT 10 is turned on, in contrast to the third embodiment. A specific method is similar to that in the third embodiment. When the states of switch elements Q1-Q4 changes from the first state to the second state, the turn-on timing of one of switch elements Q1 and Q4 is delayed. During this, emitter and gate electrodes E and G of IGBT 10 are connected together through the path not passing through power supply 15 so that the charges accumulated between the gate and emitter are discharged. Details will be described below with reference to FIGS. 24 to 27.

Figure 24:
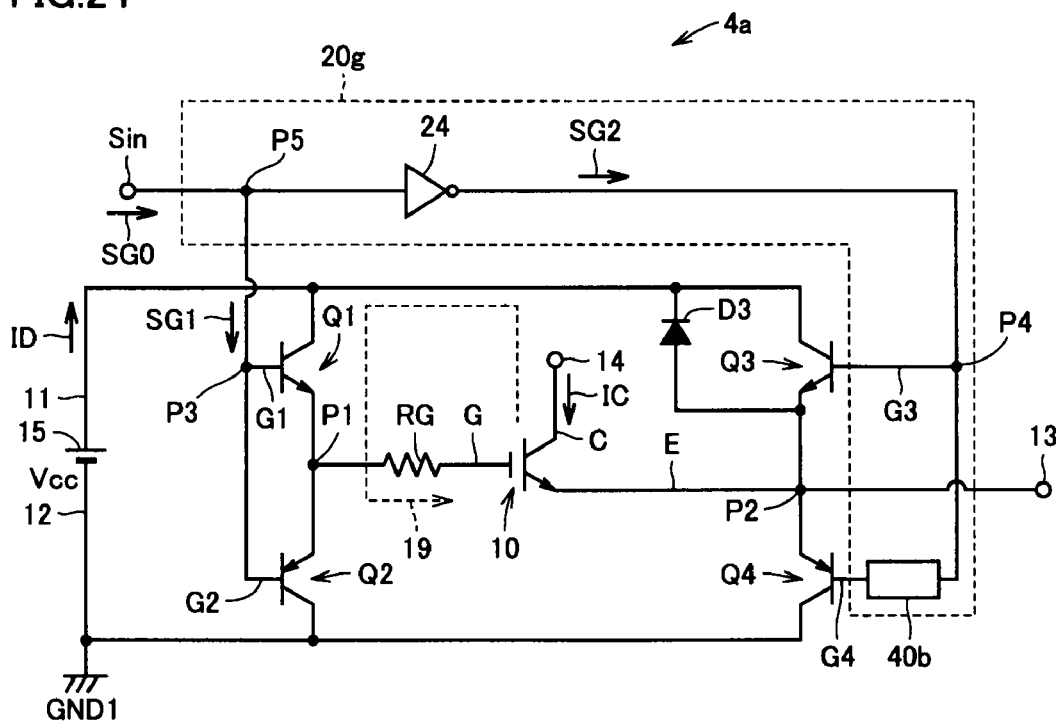
FIG. 24 is a circuit diagram showing a structure of a drive circuit 4a for IGBT 10 according to a fourth embodiment of the invention.

FIG. 24 is a circuit diagram showing a structure of a drive circuit 4a for IGBT 10 according to the fourth embodiment of the invention. Drive circuit 4a shown in FIG. 24 is a modification of drive circuit 1a shown in FIG. 4. Drive circuit 4a shown in FIG. 24 differs from drive circuit 1a shown in FIG. 4 in that drive circuit 4a further includes a diode D3 connected between the emitter and collector electrodes of bipolar transistor Q3, and also includes delay circuit 40b connected between gate electrode G4 and connection node P4 of bipolar transistor Q4. A cathode and an anode of diode D3 are connected to the collector and emitter electrodes of bipolar transistor Q3, respectively. Therefore, when bipolar transistor Q4 enters the on state in the first state, diode D3 is reversely biased, and does not conduct. Delay circuit 40b is included in a control unit 20g of drive circuit 4a, and delays a falling edge at which the input pulse signal changes from the H-level to the L-level, as already described with reference to FIGS. 20 and 22.

Figure 25:
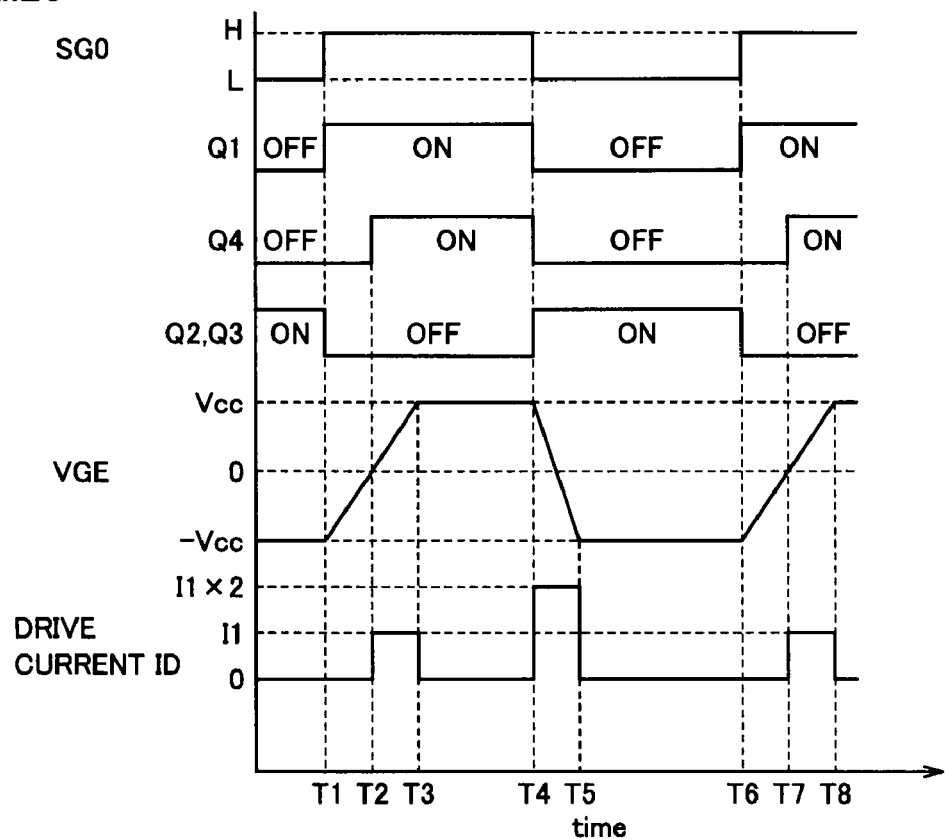
FIG. 25 is a time chart showing changes that occur in state relating to drive circuit 4a shown in FIG. 24 according to input signal SG0.

FIG. 25 is a time chart showing changes that occur in state relating to drive circuit 4a shown in FIG. 24 according to input signal SG0. In FIG. 25, the abscissa gives the time, and the ordinate gives, in the descending order, the logical level of input signal SG0, the on/off states of bipolar transistors Q1-Q4, gate-emitter voltage VGE of IGBT 10 and drive current ID.

Referring to FIGS. 24 and 25, an operation of drive circuit 4a will be described below.

Before time T1 in FIG. 25, the one/off states of bipolar transistors Q1-Q4 are in the second state already described with reference to FIG. 1. Therefore, a reverse bias is applied to IGBT 10 so that the potential of gate electrode G may become negative with respect to the potential of emitter electrode E.

When input signal SG0 changes from the L-level to the H-level at time T1, bipolar transistors Q1 and Q2 receiving input signal SG0 attain the on and off states, respectively, and bipolar transistor Q3 receiving control signal SG2 produced by inverting input signal SG0 is turned off. At time T1, control signal SG2 changes from the H-level to the L-level so that delay circuit 40b delays the falling of control signal SG2 to time T2, and outputs it. In response to this output, bipolar transistor Q4 keeps the off state until time T2, and changes to the on state at time T2.

A period between times T1 and T2 before bipolar transistor Q4 is turned on, bipolar transistors Q2-Q4 are off so that a path between ground node 12 and IGBT 10 is open. Meanwhile, bipolar transistor Q1 is on so that discharge path 19 is formed from emitter electrode E of IGBT 10 through forward diode D3, turned-on bipolar transistor Q1 and gate resistance RG to gate electrode G of IGBT 10. The discharge current flows through discharge path 19 not passing through power supply 15 so that the charges accumulated between the gate and emitter of IGBT 10 are discharged. In contrast to the case between times T1 and T2 shown in FIG. 2, this discharge is not caused by the driving by power supply 15. When gate-emitter voltage VGE becomes 0, the discharge is completed. The time required for completing the discharge depends on a time constant determined by the resistance value of gate resistance RG, the gate capacitance of IGBT 10 and the like.

When bipolar transistor Q4 changes to the on state at time T2, the states of bipolar transistors Q1-Q4 attain the first state already described with reference to FIG. 1 so that a forward bias is applied to gate electrode G of IGBT 10. In FIG. 25, the discharge is already completed and gate-emitter voltage VGE is already 0 at time T2 so that gate-emitter voltage VGE changes from 0 to Vcc between times T2 and T3.

In the fourth embodiment, as described above, the turn-on period between times T1 and T3 includes a first period between times T1 and T2 as well as a second period between times T2 and T3. In the first period, the charges accumulated between the gate and emitter of IGBT 10 are discharged through the path not passing through power supply 15. Therefore, power supply 15 does not supply drive current ID. In the second period following the first period, power supply 15 supplies drive current ID to apply a forward bias to IGBT 10. When the discharging of the charges accumulated between the gate and emitter was completed in the first period, the quantity of change in gate-emitter voltage VGE in the second period is Vcc so that drive current ID required for the turn-on is I1, which is half the current in the case of the first embodiment shown between T1 and T2 in FIG. 2. As described above, the fourth embodiment can reduce drive current ID required for the turn-on.

When input signal SG0 changes from the H-level to the L-level at time T4, bipolar transistors Q1 and Q2 receiving input signal SG0 attain the off and on states, respectively, and bipolar transistor Q3 receiving control signal SG2 produced by inverting input signal SG0 is turned on. At the rising edge of control signal SG2 changing from the L-level to the H-level, delay circuit 40b does not cause a delay so that bipolar transistor Q4 connected to delay circuit 40b changes to the off state without a delay from time T4. Consequently, the states of bipolar transistors Q1-Q4 enter the second state so that a reverse bias is applied to gate electrode G of IGBT 10 to turn off IGBT 10.

In contrast to the third embodiment described before, the fourth embodiment does not employ, for the turn-off time or period, the process of discharging the charges accumulated between the gate and emitter. Therefore, drive current ID that is supplied from power supply 15 in the turn-off period between times T4 and T5 is equal to (I1×2), and is the same as that in the first embodiment.

At time T6, input signal SG0 changes again from the L-level to the H-level so that the turn-on of IGBT 10 is performed through steps similar to those between times T1 and T3 and is completed at or before a time T8.

Figure 26:
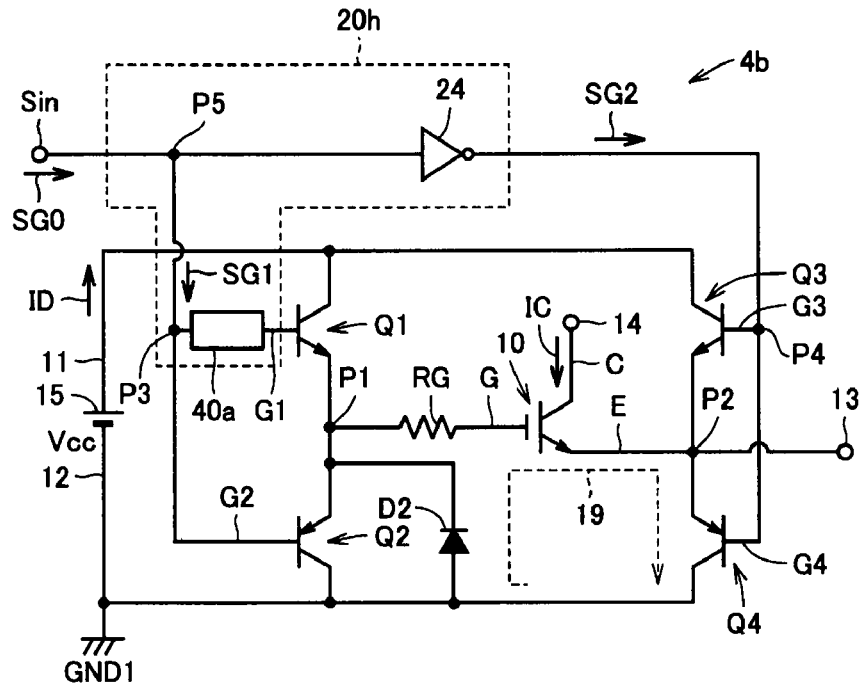
FIG. 26 is a circuit diagram showing a structure of a drive circuit 4b that is a modification of drive circuit 4a shown in FIG. 24.

FIG. 26 is a circuit diagram showing a structure of a drive circuit 4b that is a modification of drive circuit 4a shown in FIG. 24. Drive circuit 4b in FIG. 26 differs from drive circuit 4a in FIG. 24 in that drive circuit 4b does not include diode D3 and delay circuit 40b in FIG. 24, and alternatively includes a diode D2 connected between the collector and emitter electrodes of bipolar transistor Q2 as well as delay circuit 40a connected between connection node P3 and base electrode G1 of bipolar transistor Q1. The cathode and anode of diode D2 are connected to the emitter and collector electrodes of bipolar transistor Q2, respectively. Therefore, when bipolar transistor Q1 in the first state is turned on, diode D2 is reversely biased, and does not conduct. Delay circuit 40a is included in a control unit 20h of drive circuit 4b, and delays the rising edge at which the input pulse signal changes from the L-level to the H-level as already described with reference to FIGS. 16 and 18.

Figure 27:
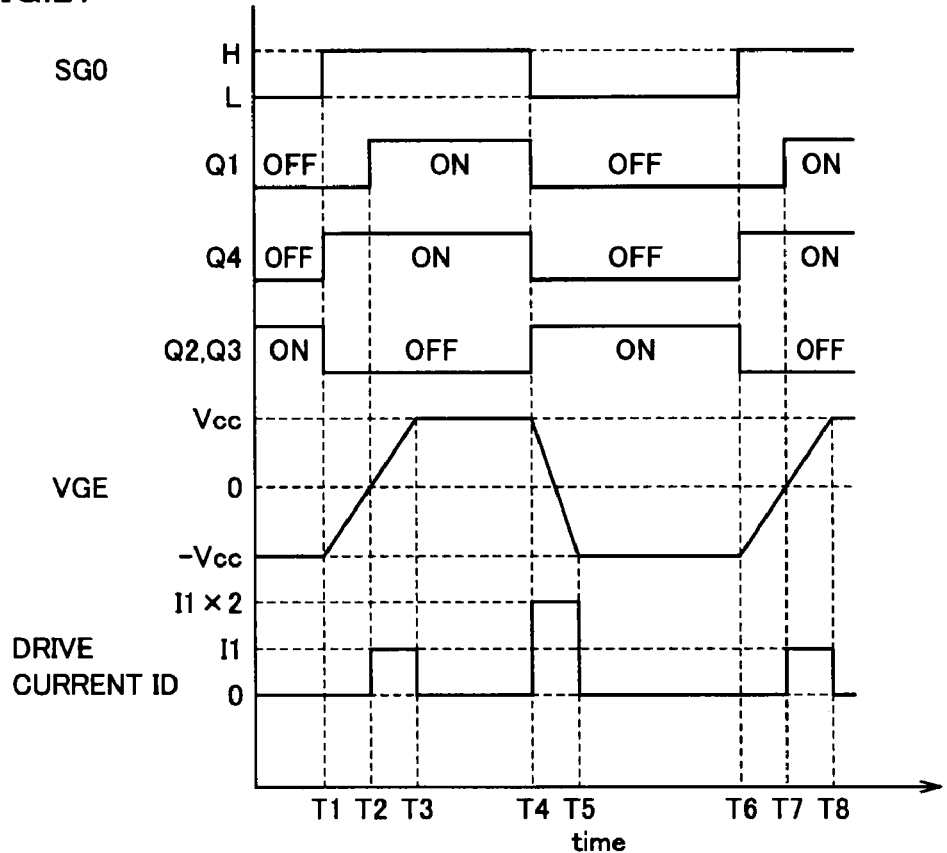
FIG. 27 is a time chart showing changes that occur in state relating to drive circuit 4b shown in FIG. 26 according to input signal SG0.

FIG. 27 is a time chart showing changes that occur in state relating to drive circuit 4b shown in FIG. 26 according to input signal SG0. In FIG. 27, the abscissa gives the time, and the ordinate gives, in the descending order, the logical level of input signal SG0, the on/off states of bipolar transistors Q1-Q4, gate-emitter voltage VGE of IGBT 10 and drive current ID.

Referring to FIGS. 26 and 27, an operation of drive circuit 4b will be described below. The time chart in FIG. 27 differs from that in FIG. 25 relating to drive circuit 4a in that the waveforms of bipolar transistors Q1 and Q4 are interchanged with each other. In the following description, therefore, the operations of bipolar transistors Q1 and Q4 will be primarily described, and description of the operations similar to those of drive circuit 4a is not repeated.

At time T1 in FIG. 27, input signal SG0 changes from the L-level to the H-level. In response to this, bipolar transistor Q4 receiving control signal SG2 produced by inverting input signal SG0 is turned on. Delay circuit 40b delays the rising of control signal SG2 from the L-level to the H-level to time T2, and bipolar transistor Q1 receiving the output thereof keeps the off state before time T2, and changes to the on state at time T2.

In the period between times T1 and T2 before bipolar transistor Q1 is turned on, bipolar transistors Q1-Q3 are off so that a path between power supply node 11 and IGBT 10 is open. Meanwhile, bipolar transistor Q4 is on so that discharge path 19 is formed from emitter electrode E of IGBT 10 through turned-on bipolar transistor Q4, forward diode D2 and gate resistance RG to gate electrode G of IGBT 10. Since the discharge current flows through discharge path 19 not passing through power supply 15, the charges accumulated between the gate and emitter of IGBT 10 are discharged.

When bipolar transistor Q1 changes to the on state at time T2, the states of bipolar transistors Q1-Q4 attain the first state so that a forward bias is applied to gate electrode G of IGBT 10.

When input signal SG0 changes from the H-level to the L-level at time T4, bipolar transistor Q4 is turned off. In this operation, delay circuit 40a does not delay the falling edge of input signal SG0 changing from the H-level to the L-level so that bipolar transistor Q1 changes to the off state without a delay from time T4.

As described above, drive circuit 4b discharges the charges accumulated on emitter electrode E of IGBT 10 through the path not passing through power supply 15 during the initial period between times T1 and T2 in the turn-on period. Therefore, it is possible to reduce drive current ID required for the turn-on.

Although the fourth embodiment described above relates to the structures of drive circuits 4a and 4b implemented by modifying drive circuit 1a in FIG. 4, the drive circuit for the power element that can achieve substantially the same operation and effect can be implemented by modifying drive circuits 1b-1d shown in FIGS. 5-7. For connecting the delay circuit to the NPN-type bipolar transistor or the N-channel MOSFET, delay circuit 40a shown in FIG. 18 is used. For connecting the delay circuit to the PNP-type bipolar transistor or the P-channel MOSFET, delay circuit 40b shown in FIG. 22 is used.

When MOSFETs are used as switch elements Q1-Q4, parasitic diodes of the MOSFETs can be used as discharge path 19. Therefore, it is not necessary to connect diodes D2 and D3 in parallel to switch elements Q2 and Q3, in contrast to the structures in FIGS. 24 and 26.

The fourth embodiment can be combined with the third embodiment. This combination can achieve the effect of the third embodiment, i.e., the reduction of drive current ID at the time of turn-off of IGBT 10, and can also achieve the effect of the fourth embodiment, i.e., the reduction of drive current ID at the time of turn-on. Since the drive current can be reduced at both the times of turn-on and turn-off, power supply 15 and switch elements Q1-Q4 for the driving can have small current capacities, respectively, which offers a cost advantage.

Fifth Embodiment

A fifth embodiment aims at reduction of drive current ID that flows every time IGBT 10 is turned on or off. Specifically, for changing the states of switch elements Q1-Q4 to the first state or the second state, the circuit enters a state in which switch elements Q1 and Q3 are on state and switch elements Q2 and Q4 are off state, or enters a state in which switch elements Q1 and Q3 are off state and switch elements Q2 and Q4 are on state. During these states, gate and emitter electrodes G and E of IGBT 10 are connected together through the path not passing through power supply 15 so that the charges accumulated between the gate and emitter are discharged. Details will be described below with reference to FIGS. 28 to 33.

Figure 28:
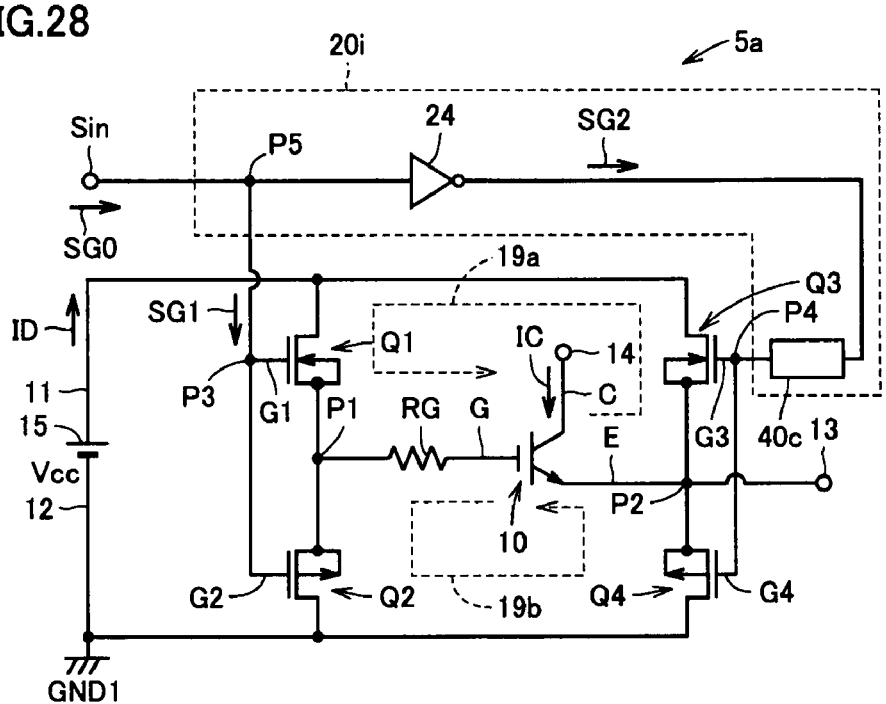
FIG. 28 is a circuit diagram showing a structure of a drive circuit 5a for IGBT 10 according to a fifth embodiment of the invention.

FIG. 28 is a circuit diagram showing a structure of a drive circuit 5a for IGBT 10 according to the fifth embodiment of the invention. Drive circuit 5a shown in FIG. 28 is a modification of drive circuit 1c shown in FIG. 6. Drive circuit 5a shown in FIG. 28 differs from drive circuit 1c shown in FIG. 6 in that drive circuit 5a further includes a delay circuit 40c connected between connection node P4 and the output terminal of inverter 24. Delay circuit 40c is included in a control unit 20i of drive circuit 5a, and delays both the rising timing and the falling timing of the input pulse signal. A specific example of the structure of delay circuit 40c will be described later with reference to FIG. 30.

Figure 29:
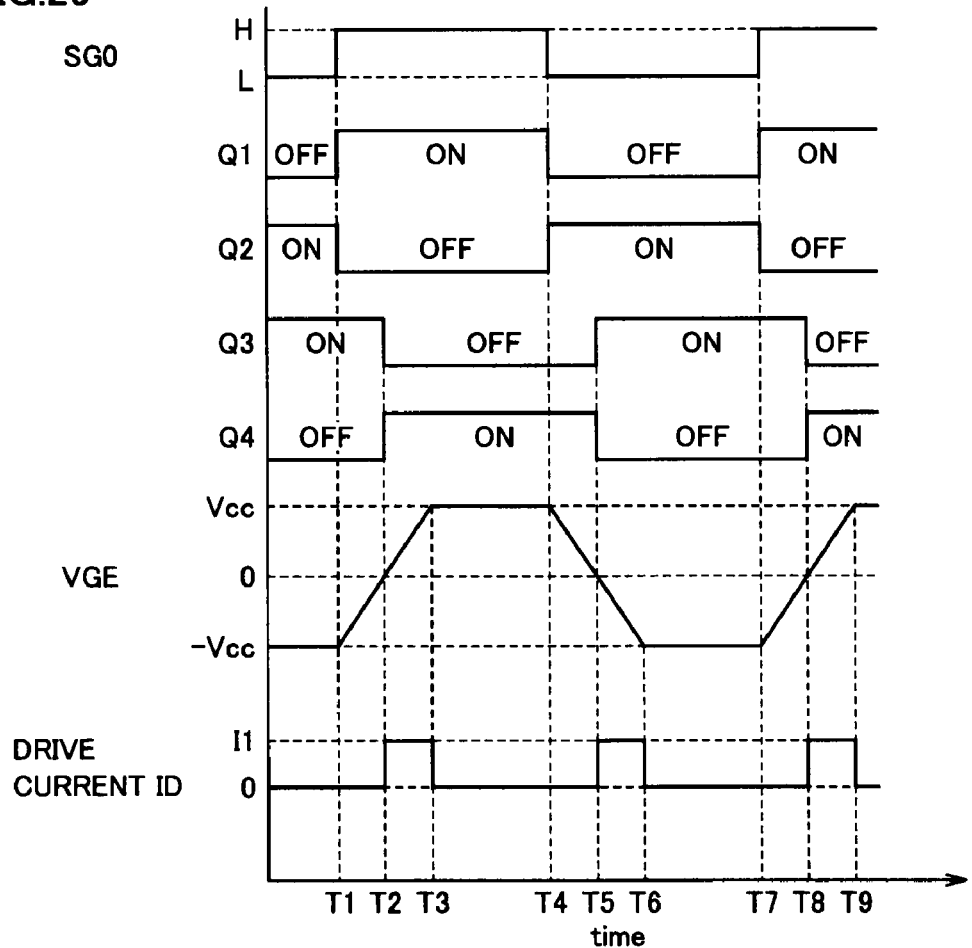
FIG. 29 is a time chart showing changes that occur in state relating to drive circuit 5a shown in FIG. 28 according to input signal SG0.

FIG. 29 is a time chart showing changes that occur in state relating to drive circuit 5a shown in FIG. 28 according to input signal SG0. In FIG. 29, the abscissa gives the time, and the ordinate gives, in the descending order, the logical level of input signal SG0, the on/off states of the MOSFETs forming switch elements Q1-Q4, gate-emitter voltage VGE of IGBT 10 and drive current ID. In the following description, the MOSFETs forming switch elements Q1-Q4 are simply referred to as MOSFETs Q1-Q4, respectively.

Referring to FIGS. 28 and 29, an operation of drive circuit 5a will be described below.

When input signal SG0 changes from the L-level to the H-level at time T1 in FIG. 29, MOSFETs Q1 and Q2 receiving input signal SG0 attain the on and off states, respectively. Delay circuit 40c receives control signal SG2 produced by inverting input signal SG0. The delay circuit delays the time of falling of control signal SG2 from the H-level to the L-level to T2, and outputs it. In response to this output, MOSFETs Q3 and Q4 keep the on and off states before time T2, respectively, and change to the off and on states at time T2, respectively.

Between times T1 and T2, since MOSFETs Q2 and Q4 are off, a path between ground node 12 and IGBT 10 is open. Since MOSFETs Q1 and Q3 are on, a discharge path 19a is formed from emitter electrode E of IGBT 10 through turned-on MOSFET Q3, turned-on MOSFET Q1 and gate resistance RG to gate electrode G of IGBT 10. Since the discharge current flows through discharge path 19a not passing through power supply 15, the charges accumulated between the gate and emitter of IGBT 10 are discharged. In contrast to the case between times T1 and T2 shown in FIG. 2, this discharge is not caused by the driving by power supply 15. When gate-emitter voltage VGE becomes 0, the discharge is completed. The time required for completing the discharge depends on a time constant determined by the resistance value of gate resistance RG, the gate capacitance of IGBT and the like.

When MOSFETs Q3 and Q4 switch to the off and on states at time T2, respectively, the states of MOSFETs Q1-Q4 attain the first state so that a forward bias is applied to gate electrode G of IGBT 10. In FIG. 29, the discharge is already completed and gate-emitter voltage VGE is already 0 at time T2 so that gate-emitter voltage VGE changes from 0 to Vcc between times T2 and T3.

When input signal SG0 changes from the H-level to the L-level at time T4, MOSFETs Q1 and Q2 attain the off and on states, respectively. Delay circuit 40c delays the time of rising of control signal SG2 from the L-level to the H-level to T5, and outputs it. In response to this output, MOSFETs Q3 and Q4 keep the off and on states before time T5, respectively, and change to the on and off states at time T5, respectively.

Between times T4 and T5, MOSFETs Q1 and Q3 are off so that a path between power supply node 11 and IGBT 10 is open. Since MOSFETs Q2 and Q4 are on, a discharge path 19b is formed from gate electrode G of IGBT 10 through gate resistance RG, turned-on MOSFET Q2 and turned-on MOSFET Q4 to emitter electrode E of IGBT 10. Since the discharge current flows through discharge path 19b not passing through power supply 15, the charges accumulated between the gate and emitter of IGBT 10 are discharged. In contrast to the case between times T3 and T4 in FIG. 2 already described with reference to the first embodiment, this discharge is not caused by driving by power supply 15. When gate-emitter voltage VGE becomes 0, the discharge is completed.

When MOSFETs Q3 and Q4 change to the on and off states at time T5, respectively, the states of MOSFETs Q1-Q4 attain the second state so that a reverse bias is applied to gate electrode G of IGBT 10. In FIG. 29, the discharge is already completed and gate-emitter voltage VGE is 0 at time T5 so that gate-emitter voltage VGE changes from 0 to −Vcc between times T5 and T6.

At time T7, input signal SG0 changes from the L-level to the H-level again. The operation of drive circuit 5*a* in the turn-on period between times T7 and T9 is substantially the same as that between times T1 and T3.

In the fifth embodiment, as described above, the turn-on periods between times T1 and T3, and between times T7 and T9 as well as the turn-off period between times T4 and T6 are configured as follows. During a first discharge period in each of these periods, the charges accumulated on gate electrode G or emitter electrode E are discharged through the path not passing through power supply 15 and the absolute value of gate-emitter voltage VGE decreases. Thereafter, power supply 15 supplies drive current ID to apply forward or reverse bias voltage VGE between gate and emitter electrodes G and E. This can reduce the quantity of change in gate-emitter voltage VGE caused by drive power supply 15 (i.e., power supply for driving). Consequently, drive circuit 5*a* in the fifth embodiment can reduce drive current ID required for the turn-on and turn-off. The discharge is completed during the discharge period, and drive current ID in each of the turn-off and turn-on operations becomes equal to I1 when gate-emitter voltage VGE returns to 0, and thus is half the value in the first embodiment.

Figure 30:
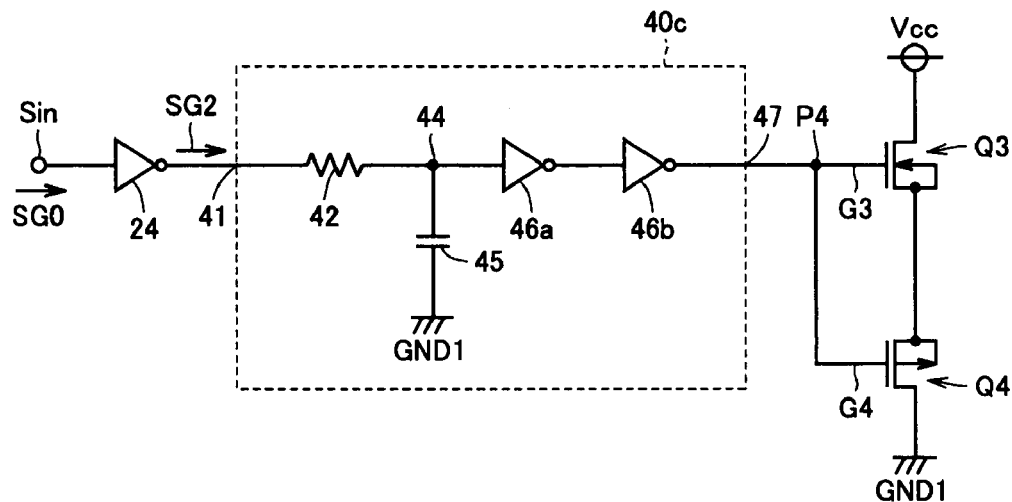
FIG. 30 is a circuit diagram showing an example of a specific structure of a delay circuit 40c shown in FIG. 28.

FIG. 30 is a circuit diagram showing an example of a specific structure of delay circuit 40*c* shown in FIG. 28.

Delay circuit 40*c* shown in FIG. 30 differs from delay circuits 40*a* and 40*b* shown in FIGS. 18 and 22 in that delay circuit 40*c* does not employ diode 43 connected between input-side node 41 and intermediate node 44. Since diode 43 is not employed, delay circuit 40*c* in FIG. 30 delays both the timing of rising and the timing of falling when the pulse signal is applied to input-side node 41 in contrast to delay circuits 40*a* and 40*b* that delay the timing of rising and the timing of falling, respectively.

Figure 31:
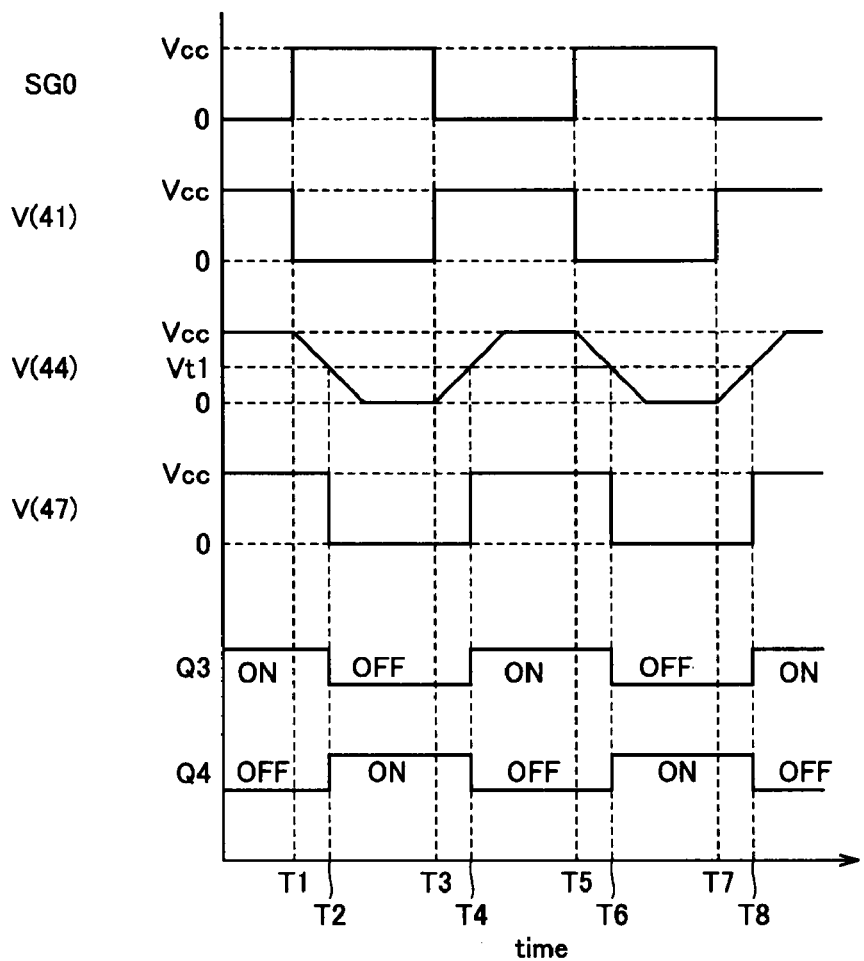
FIG. 31 is a time chart showing changes that occur in state relating to delay circuit 40c shown in FIG. 30 according to input signal SG0.

FIG. 31 is a time chart showing changes that occur in state relating to delay circuit 40*c* shown in FIG. 30 according to input signal SG0. In FIG. 31, the abscissa gives the time, and the ordinate gives, in the descending order, the logical level of input signal SG0 (potential V(Sin) of signal input node Sin), potential V(41) of input-side node 41, potential V(44) of intermediate node 44, potential V(47) of output-side node 47 and the operation states of MOSFETs Q3 and Q4.

Referring to FIGS. 30 and 31, potential V(41) of input-side node 41 falls from Vcc to 0 at times T1 and T4 in response to the switching of input signal SG0 from the L-level (0) to the H-level (Vcc). At this time, the effect of the integration circuit formed of resistance 42 and capacitor 45 gradually lowers potential V(44) produced on intermediate node 44 from Vcc to 0. Likewise, when potential V(41) of input-side node 41 rises from 0 to Vcc in response to input signal SG0 at times T3 and T7, potential V(44) produced on intermediate node 44 gradually rises from 0 to Vcc.

Consequently, potential V(47) of output-side node 47 attains Vcc when potential V(44) of intermediate node 44 becomes equal to or higher than threshold voltage Vt1 of inverter 46*a*, i.e., before time T2, between times T4 and T6, and after time T8. Thus, the rising timing and falling timing of potential V(47) of output-side node 47 are delayed by the delay time between times T1 and T2, between T3 and T4 or between T7 and T8 from the rising timing and falling timing of potential V(41) of input-side node 41, respectively. This delay time depends on a time constant of the integration circuit that is a product of the capacitance of capacitor 45 and the resistance value of resistance 42. Therefore, the timing of turn on/off of MOSFETs Q3 and Q4 is delayed by the above delay time according to which the logical level of input signal SG0 changes.

Figure 32:
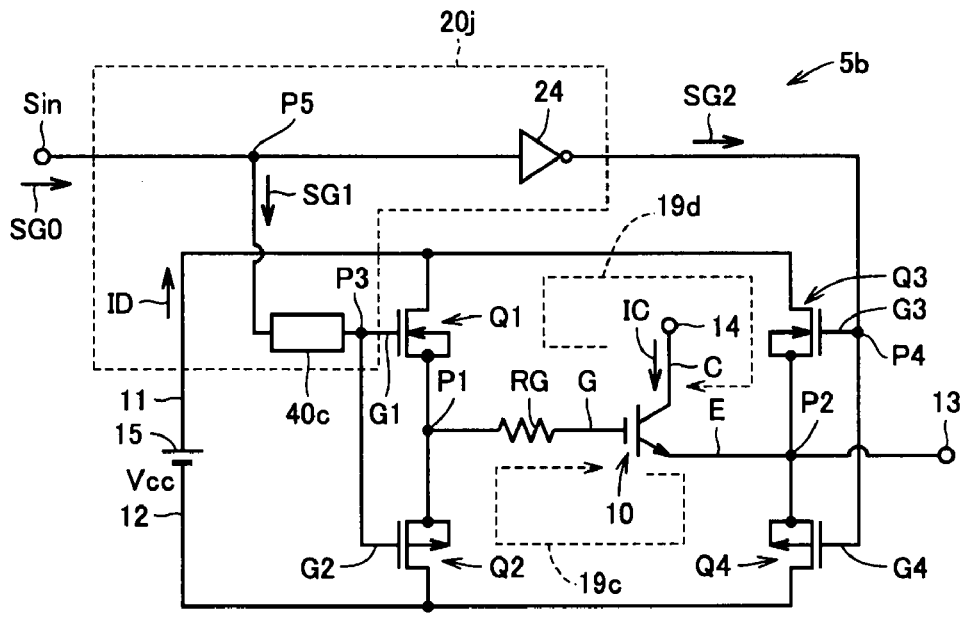
FIG. 32 is a circuit diagram showing a structure of a drive circuit 5b that is a modification of drive circuit 5a shown in FIG. 28.

FIG. 32 is a circuit diagram showing a structure of a drive circuit 5*b* that is a modification of drive circuit 5*a* shown in FIG. 28. Drive circuit 5*b* in FIG. 32 differs from drive circuit 5*a* in FIG. 28 in that delay circuit 40*c* is located between division node P5 and connection node P3. Delay circuit 40*c* in FIG. 32 is included in a control unit 20*j* of drive circuit 5*b*, and delays both the timing of rising and that of falling of the input pulse signal, as already described with reference to FIG. 30.

Figure 33:
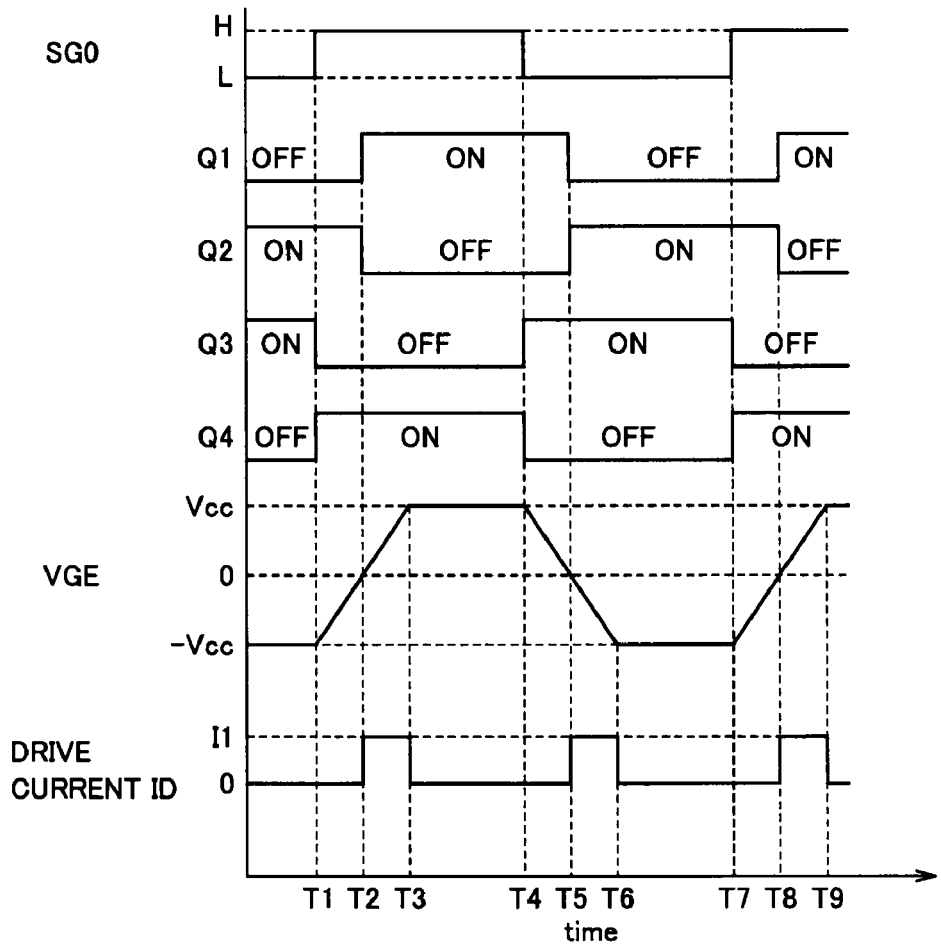
FIG. 33 is a time chart showing changes that occur in state relating to drive circuit 5b shown in FIG. 32 according to input signal SG0.

FIG. 33 is a time chart showing changes that occur in state relating to drive circuit 5*b* shown in FIG. 32 according to input signal SG0. In FIG. 33, the abscissa gives the time, and the ordinate gives, in the descending order, the logical level of input signal SG0, the on/off states of MOSFETs Q1-Q4, gate-emitter voltage VGE of IGBT 10 and drive current ID.

Referring to FIGS. 32 and 33, an operation of drive circuit 5*b* will be described below. FIG. 33 differs from the time chart of FIG. 29 relating to drive circuit 5*a* in that the waveforms of bipolar transistors Q1 and Q2 are interchanged with those of bipolar transistors Q3 and Q4. In the following description, therefore, operations that are different from those of drive circuit 5*a* will be described, and description of operations that are substantially the same as those of drive circuit 5*a* is not repeated.

At time T1 in FIG. 33, when input signal SG0 changes from the L-level to the H-level, MOSFETs Q3 and Q4 enter the off and on states, respectively. MOSFETs Q1 and Q2 receiving the output of delay circuit 40*c* change to the on and off states at subsequent time T2, respectively.

Between times T1 and T2, MOSFETs Q2 and Q4 are on so that a discharge path 19*c* is formed from emitter electrode E of IGBT 10 through turned-on MOSFET Q4, turned-on MOSFET Q2 and gate resistance RG to gate electrode G of IGBT 10. Since the discharge current flows through discharge path 19*c* not passing through power supply 15, the charges accumulated between the gate and emitter of IGBT 10 are discharged. When MOSFETs Q1 and Q2 change to the on and off states at time T2, respectively, the states of MOSFETs Q1-Q4 attain the first state so that a forward bias is applied to gate electrode G of IGBT 10.

When input signal SG0 changes from the H-level to the L-level at time T4, MOSFETs Q3 and Q4 attain the on and off states, respectively. Since MOSFETs Q1 and Q2 receive the output of delay circuit 40*c*, these change to the off and on states at time T5, respectively.

Between times T4 and T5, MOSFETs Q1 and Q3 are on so that a discharge path 19*d* is formed from gate electrode G of IGBT 10 through gate resistance RG, turned-on MOSFET Q1 and turned-on MOSFET Q3 to emitter electrode E of IGBT 10. Since the discharge current flows through discharge path 19 not passing through power supply 15, the charges accumulated between the gate and emitter of IGBT 10 are discharged. When MOSFETs Q1 and Q2 switch to the off and on states at time T5, respectively, the states of MOSFETs Q1-Q4 attain the second state so that a reverse bias is applied to gate electrode G of IGBT 10.

As described above, drive circuit 5*b* discharges the charges accumulated on gate or emitter electrode G or E of IGBT 10 through the path not passing through power supply 15 in initial periods of the turn-on and turn-off period, similarly to drive circuit 5*a* in FIG. 28. Thereby, drive current ID can be reduced. The foregoing fifth embodiment has been described in connection with the structures of drive circuits 5*a* and 5*b* prepared by modifying drive circuit 1*c* shown in FIG. 6.

However, drive circuits 1a, 1b and 1d shown in FIGS. 4, 5 and 7 can be modified to implement the drive circuit for the power element that achieves substantially the same operation and effect.

Sixth Embodiment

In a sixth embodiment, the drive circuit of the invention is applied to the power element having a current sense electrode.

For example, in a sense IGBT, i.e., an IGBT having an emitter electrode that is partially isolated as a sense electrode, a current (sense current) corresponding to a collector current flows through the sense electrode. Therefore, the collector current can be monitored by sensing a magnitude of this sense current, and can be used, e.g., for protection against an overcurrent. In recent years, power elements provided with such sense electrodes are often used in IPMs (Intelligent Power Modules) that have been prosperously developed.

When a reverse bias is applied to the power element with the sense electrode, the drive circuits of the first and second prior arts already described suffer from a problem that a complicated connection is required between the sense electrode and the drive circuit. For example, when the drive circuit of the first prior art using two power supplies is applied to the sense IGBT, a current sense resistance for sensing a sense current cannot be connected to ground GND1 arranged for the drive circuit. The current sense resistance must be connected to a reference line connecting a negative terminal of a power supply for a forward bias, a positive terminal of a power supply for a reverse bias and an emitter electrode of the IGBT. In the prior art, this reference line must be arranged independently of ground GND1. For comparing a voltage occurring on the current sense resistance with a reference power supply by a comparator, a ground side of the reference power supply must likewise be connected to this reference line. Conversely, the drive circuit of the invention has an advantage that the current sense resistance and the ground side of the reference power supply described above can be connected to ground GND1. Details will be described below with reference to FIGS. 34 to 36.

Figure 34:
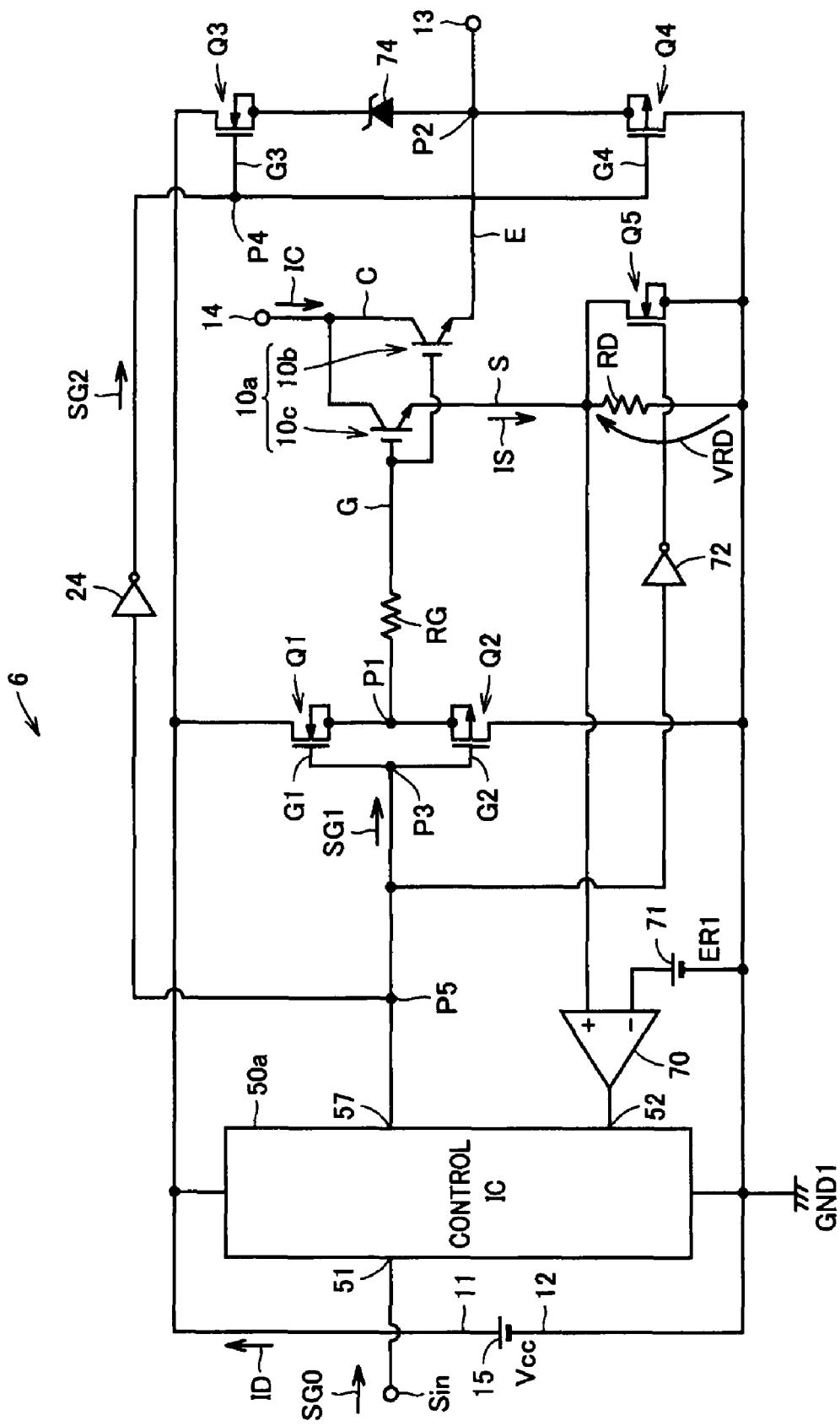
FIG. 34 is a circuit diagram showing a structure of a drive circuit 6 for a sense IGBT 10a according to a sixth embodiment of the invention.

FIG. 34 is a circuit diagram showing a structure of a drive circuit 6 for IGBT 10 according to the sixth embodiment of the invention. Drive circuit 6 shown in FIG. 34 is a modification of drive circuit 1c shown in FIG. 6.

Drive circuit 6 differs from drive circuit 1c in FIG. 6 in that drive circuit 6 is applied to a sense IGBT 10a having a sense electrode. Sense IGBT 10a includes a main portion 10b through which a majority of collector current IC flows, and a sense portion 10c having a sense electrode S isolated from emitter electrode E of main portion 10b. A part of collector current IC flows through sense electrode S. Main portion 10b and sense portion 10c of sense IGBT 10a share collector electrode C, and gate electrodes G of main and sense portions 10b and 10c are connected together. In drive circuit 6, gate electrode G of sense IGBT 10a is connected to connection node P1 through gate resistance RG, and emitter electrode E thereof is connected to connection node P2, similarly to drive circuit 1c in FIG. 6.

Drive circuit 6 differs from drive circuit 1c in FIG. 6 in that drive circuit 6 includes a control IC (Integrated Circuit) 50a connected between signal input node Sin and division node P5, a current sense resistance RD connected between sense electrode S and ground node 12, an N-channel MOSFET serving as a fifth switch element Q5 connected in parallel to current sense resistance RD, an inverter 72 connected between a control electrode (gate electrode) of an MOSFET Q5 and division node P5, a comparator 70 having one input terminal connected to sense electrode S, a reference power supply 71 connected between the other input terminal of comparator 70 and ground node 12, and a Zener diode 74 connected between connection node P2 and a source electrode of MOSFET Q3.

Zener diode 74 has a cathode connected to a source electrode of MOSFET Q3 and an anode connected to connection anode P2. In the second state already described with reference to FIG. 1, power supply voltage Vcc is applied to a path extending from power supply node 11 through MOSFET Q3, sense IGBT 10a and MOSFET Q2 to ground node 12. Zener diode 74 functions as a constant voltage unit sharing power supply voltage Vcc applied to this path. Consequently, it is possible to reduce reverse bias voltage VGE applied between emitter and gate electrodes E and G of sense IGBT 10a. Zener diode 74 may be connected between connection node P1 and the source electrode of MOSFET Q2 such that the cathode may be on the connection node (P1) side.

Comparator 70 compares a sense voltage VRD occurring on current sense resistance RD with a power supply voltage ER1 of reference power supply 71. Comparator 70 outputs a signal at the H-level when sense voltage VRD is equal to or higher than power supply voltage ER1, and outputs a signal at the L-level when sense voltage VRD is lower than power supply voltage ER1. In this manner, comparator 70 functions as a voltage monitoring unit that monitors sense voltage VRD.

MOSFET Q5 has the gate electrode connected to an output node 57 via inverter 72. Therefore, when input signal SG0 changes to the L-level and potential V(57) of output node 57 is 0, inverter 72 supplies the signal at the H-level to change the MOSFET to the on state. Consequently, the opposite ends of current sense resistance RD are electrically connected though turned-on MOSFET Q5 so that sense voltage VRD becomes 0. In this manner, when input signal SG0 is at the L-level, sense voltage VRD becomes 0 independently of the magnitude of a sense current IS, and comparator 70 outputs a signal at the L-level.

Primarily, when input signal SG0 is at the L-level, sense IGBT 10a is to be turned on, and collector and sense currents IC and IS are to be set to 0. However, in the state where gate electrode G of sense IGBT 10a is biased, a parasitic resistance due to the chip structure reduces a value of the resistance between emitter electrode E and sense electrode G. When a reverse bias is applied to sense IGBT 10a, the potential of emitter electrode E is higher than the potential of sense electrode S so that a current may flow to current sense resistance RD through this parasitic resistance. Consequently, when sense voltage VRD becomes equal to or higher than power supply voltage ER1, comparator 70 malfunctions to provide an output at H-level. MOSFET Q5 is employed for avoiding this malfunction.

Control IC 50a forming the control unit of drive circuit 6 includes a control amplifier 54 (see FIG. 38) for amplifying input signal SG0. Control amplifier 54 is connected to signal input node Sin through an input node 51, is connected to division node P5 through output node 57 and is connected to an output terminal of comparator 70 via an input node 52. Control amplifier 54 is connected to power supply node 11 and ground node 12 (ground GND1), and receives power supply voltage Vcc. Control amplifier 54 outputs amplified control signal SG0 from output node 57 when the output of comparator 70 is at the L-level. After the output of comparator 70 attains the H-level, control amplifier 54 outputs the signal at the L-level independently of the output of control signal SG0, and invalidates control signal SG0.

Figure 35:
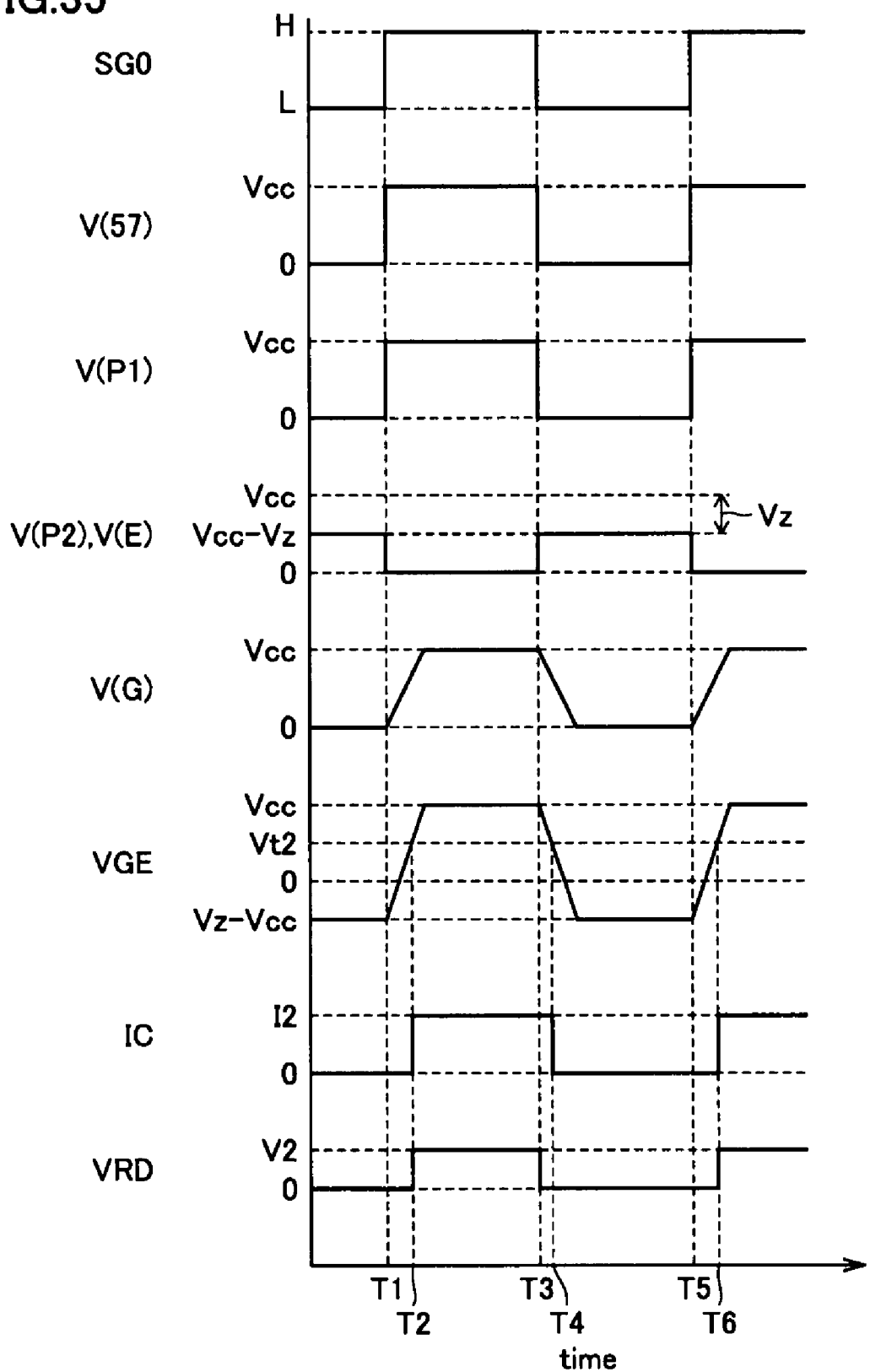
FIG. 35 is a time chart showing changes that occur in state relating to drive circuit 6 in FIG. 34 according to input signal SG0.

FIG. 35 is a time chart showing changes that occur in state relating to drive circuit 6 in FIG. 34 according to input signal SG0. In FIG. 35, the abscissa gives the time, and the ordinate gives, in the descending order, the logical level of input signal SG0, potential V(57) of output node 57, potential V(P1) of connection node P1, potential V(E) of emitter electrode E of sense IGBT 10a, potential V(G) of gate electrode G of sense IGBT 10a, gate-emitter voltage VGE, collector current IC through sense IGBT 10a and voltage VRD placed on current sense resistance RD.

Referring to FIGS. 34 and 35, operations of drive circuit 6 will be successively described below in time sequence. The following description will be primarily given on the operation of the portion different from that in drive circuit 1c in FIG. 6, and description of the same or corresponding portions is not repeated.

The state before time T1 in FIG. 35 is a steady state attained when input signal SG0 is at the L-level. In this state, potential V(57) of output node 57 of the control IC is 0, and thereby the states of MOSFETs Q1-Q4 are in the second state already described with reference to FIG. 1. In this state, potential V(P1) of connection node P1 and potential V(G) of gate electrode G of sense IGBT 10a are 0 similarly to the case in the first embodiment shown in FIG. 2, but Zener diode 74 lowers a potential V(P2) of connection node P2 by a Zener voltage Vz, and becomes equal to (Vcc−Vz) in contrast to the case in FIG. 2.

Consequently, gate-emitter voltage VGE is equal to (Vz−Vcc), and the absolute value thereof can be smaller by Vz than that in the case shown in FIG. 2. Therefore, drive circuit 6 in the sixth embodiment can be applied to the IGBT having a lower breakdown voltage in the reverse bias direction.

At next time T1, input signal SG0 changes from the L-level to the H-level. At this time, potential V(57) of output node 57 of control IC 50a changes from 0 to Vcc so that the states of MOSFETs Q1-Q4 change to the first state already described with reference to FIG. 1. In the first state, potential V(P1) of connection node P1 changes from 0 to Vcc, and the potential of emitter electrode E changes from (Vcc−Vz) to 0 so that a forward bias is applied to gate electrode G, and potential V(G) of gate electrode G gradually rises from 0 to Vcc. Consequently, gate-emitter voltage VGE gradually changes from (Vz−Vcc) to Vcc.

Figure 36:
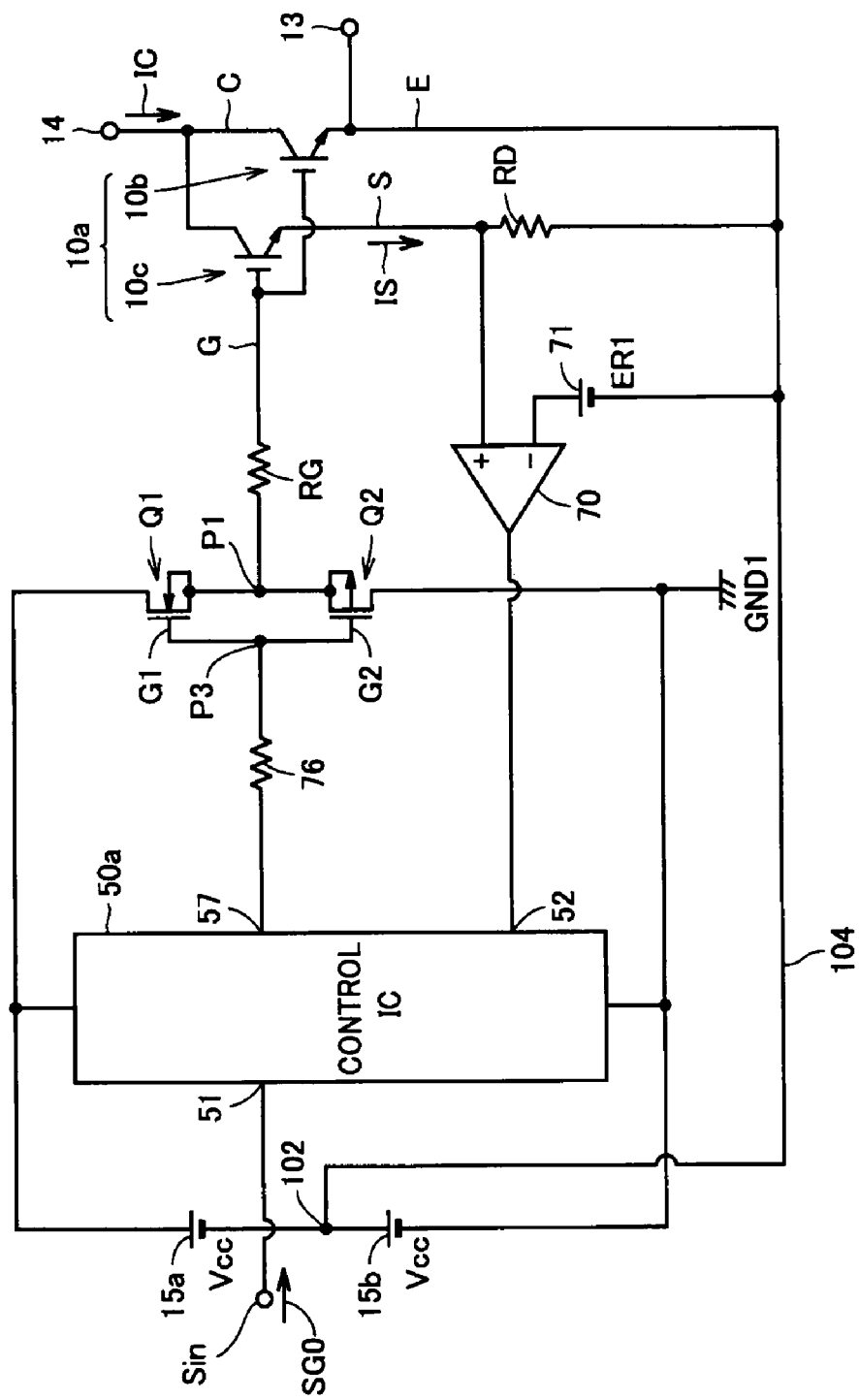
FIG. 36 is a circuit diagram showing a structure of a drive circuit 100 for sense IGBT 10a that is an example for comparison with drive circuit 6 in FIG. 34.

At time T2 when gate-emitter voltage VGE exceeds a threshold voltage Vt2 of sense IGBT 10a, sense IGBT 10 is turned on to pass collector current IC. A part of the collector current flows from sense electrode S through current sense resistance RD so that sense voltage VRD placed on current sense resistance RD changes from 0 to V2. FIG. 36 shows a case where V2 is smaller than power supply voltage ER1. Therefore, comparator 70 outputs a signal at the L-level, and control amplifier 54 does not invalidate input signal SG0.

When input signal SG0 changes from the H-level to the L-level at time T3, potential V(57) of output node 57 of control IC 50a changes from Vcc to 0. At this time, the states of MOSFETs Q1-Q4 change to the second state so that gate-emitter voltage VGE gradually changes from Vcc to (Vz−Vcc). Consequently, a reverse bias is applied to main portion 10b of sense IGBT 10a. The voltage between gate and sense electrodes G and S of sense portion 10c is 0.

When potential V(57) of output node 57 changes from Vcc to 0 at time T3, MOSFET Q5 connected to output node 57 via inverter 72 changes to the on state. Consequently, sense voltage VRD occurring on current sense resistance RD becomes equal to 0. Therefore, the output of comparator 70 attains the L-level independently of the magnitude of sense current IS, and control amplifier 54 does not malfunction to invalidate control signal SG0.

When gate-emitter voltage VGE becomes lower than threshold voltage Vt2 at time T4, collector current IC returns from I2 of the on state to 0 of the off state.

FIG. 36 is a circuit diagram showing a structure of a drive circuit 100 for sense IGBT 10a that is an example for comparison with drive circuit 6 in FIG. 34.

Drive circuit 100 shown in FIG. 36 differs from drive circuit 6 in FIG. 34 in that drive circuit 100 employs two power supplies 15a and 15b instead of single power supply 15, and also employs two switch elements of MOSFETs Q1 and Q2 instead of the H-bridge formed of MOSFETs Q1-Q4. Therefore, in contrast to drive circuit 6 that is provided with division node P5 supplying control signal SG0 to MOSFETs Q3 and Q4, drive circuit 100 not having MOSFETs Q3 and Q4 is not provided with division node P5.

In drive circuit 6 shown in FIG. 34, current sense resistance RD and the negative terminal of reference power supply 71 are connected to ground GND1 (ground node 12). Conversely, in drive circuit 100 shown in FIG. 36, current sense resistance RD and the negative terminal of reference power supply 71 are connected to a reference line 104 connecting a node 102 between two power supplies 15a and 15b to emitter electrode E of sense IGBT 10a. In this point, drive circuit 100 differs from drive circuit 6 in FIG. 34. This is for the following reason. Drive circuit 100 provided with two power supplies 15a and 15b cannot measure voltage VRD occurring on current sense resistance RD with reference to ground GND1, and must measure it with reference to node 102 between two power supplies 15a and 15b. In contrast to drive circuit 100 of the comparison example, drive circuit 6 in the sixth embodiment does not require reference line 104 that differs from ground GND1, and therefore can simplify the connection between sense electrode S and drive circuit 100.

Seventh Embodiment

A drive circuit 7 of a seventh embodiment is a combination of structures of drive circuit 6 of the sixth embodiment and structures of drive circuits 3a and 3b of the third embodiment and drive circuits 4a and 4b of the fourth embodiment. Details will now be described with reference to FIGS. 37 to 39.

Figure 37:
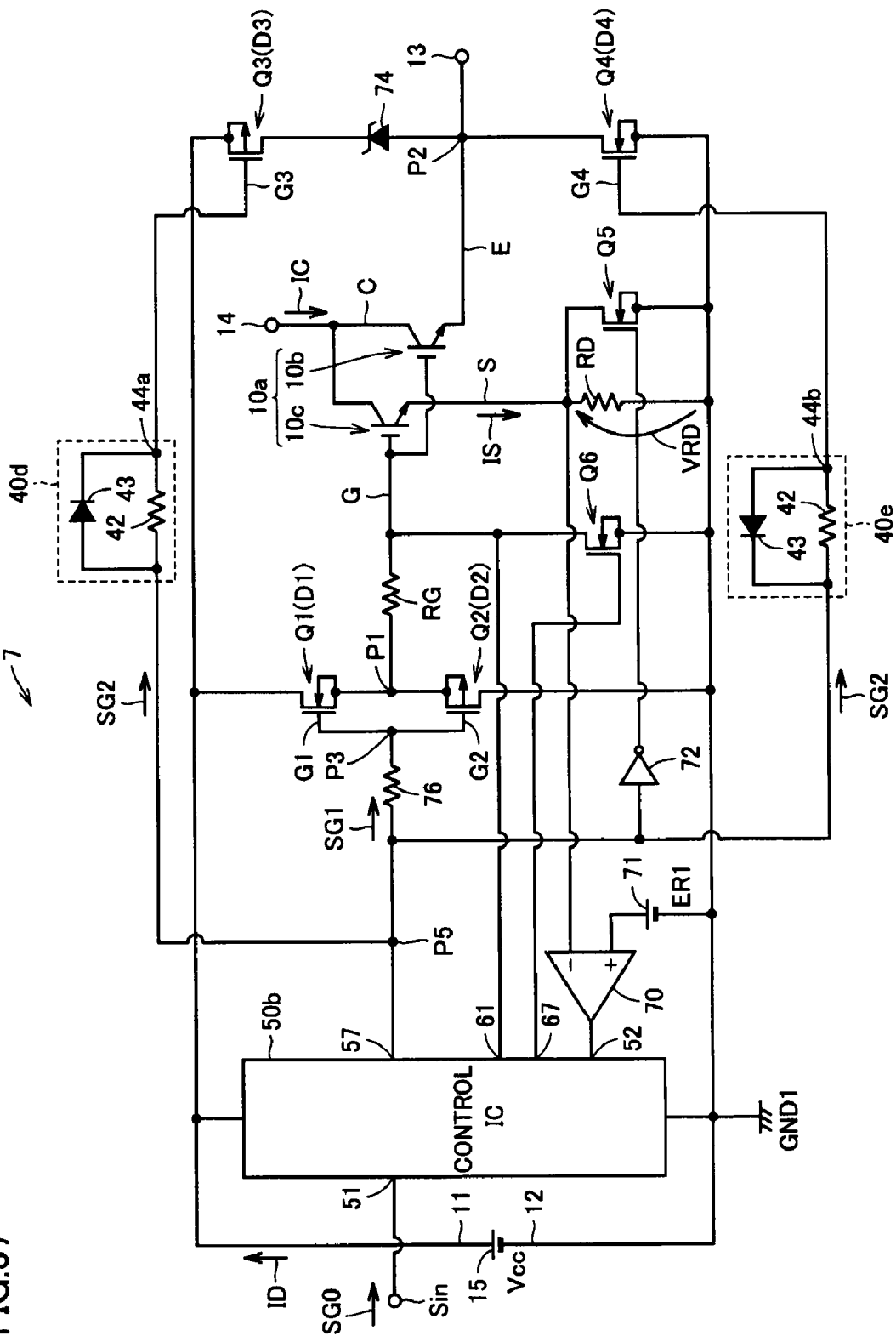
FIG. 37 is a circuit diagram showing a structure of a drive circuit 7 for sense IGBT 10a according to a seventh embodiment of the invention.

FIG. 37 shows a structure of a drive circuit 7 for sense IGBT 10a according to the seventh embodiment of the invention. Drive circuit 7 shown in FIG. 37 is a modification of drive circuit 6 in FIG. 34, and differs from drive circuit 6 in FIG. 34 in the following first to fourth points.

First, the conductivity types of MOSFETs Q3 and Q4 in drive circuit 7 are PNP and NPN types in contrast to drive circuit 6, respectively.

Second, drive circuit 7 does not have the circuit structure in FIG. 34 including connection node P4 and inverter 24, and alternatively includes a delay circuit 40d connected between gate electrode G3 of MOSFET Q3 and division node P5, and a delay circuit 40e connected between gate electrode G4 of MOSFET Q4 and division node P5.

Third, drive circuit 7 further includes a resistance 76 connected between division node P5 and connection node P3, and an N-channel MOSFET Q6 connected between gate electrode G of sense IGBT 10a and ground GND1.

Fourth, instead of control IC 50a in FIG. 34, drive circuit 7 includes control IC 50b which further has an input node 61 connected to gate electrode G of sense IGBT 10a and an output node 67 connected to a gate electrode of MOSFET Q6.

Delay circuit 40*d* is a modification of delay circuit 40*b* in FIG. 22. Delay circuit 40*d* differs from delay circuit 40*b* in that delay circuit 40*d* uses a capacitance between the gate and source of MOSFET Q3 instead of capacitor 45, does not include inverters 46*a* and 46*b* for the buffer, and MOSFET Q3 functions as the buffer. The function of delay circuit 40*d* is substantially the same as that of delay circuit 40*b* in FIG. 22, and is to delay the falling timing of the input signal by dulling the falling edge thereof. An intermediate node 44*a* connected to resistance 42, diode 43 and gate electrode G3 of MOSFET Q3 in FIG. 37 corresponds to intermediate node 44 in FIG. 22.

Delay circuit 40*e* is a modification of delay circuit 40*a* in FIG. 18, and differs from delay circuit 40*a* in that delay circuit 40*e* uses a capacitance between the gate and source of MOSFET Q4 instead of capacitor 45, does not include inverters 46*a* and 46*b* for the buffer, and MOSFET Q4 functions as the buffer. The function of delay circuit 40*e* is substantially the same as that of delay circuit 40*a* in FIG. 22, and is to delay the rising timing of the input pulse signal by dulling the rising edge thereof. An intermediate node 44*b* connected to resistance 42, diode 43 and gate electrode G4 of MOSFET Q4 in FIG. 37 corresponds to intermediate node 44 in FIG. 18.

In FIG. 37, parasitic diodes of MOSFETs Q3 and Q4 function as diode D3 included in drive circuit 4*a* of the fourth embodiment shown in FIG. 24 and diode D4 included in drive circuit 3*a* of the third embodiment shown in FIG. 16, respectively.

Figure 38:
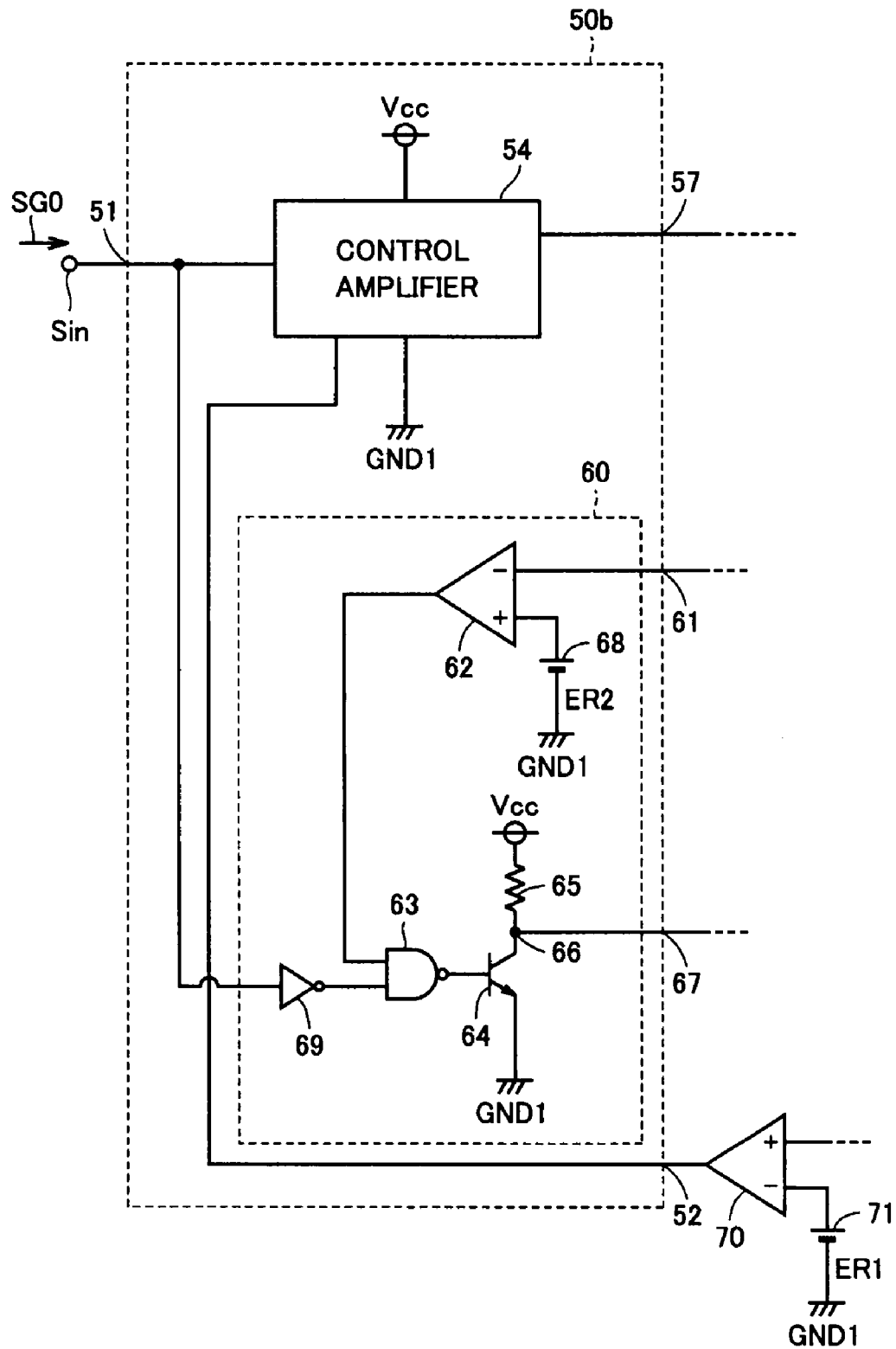
FIG. 38 is a circuit diagram showing an example of a specific structure of a control IC 50b shown in FIG. 37.

FIG. 38 is a circuit diagram showing an example of a specific structure of a control IC 50*b* shown in FIG. 37. Control IC 50*b* differs from control IC 50*a* shown in FIG. 34 in that control IC 50*b* includes foregoing input node 61 and output node 67 as well as a control circuit 60 for controlling on/off of MOSFET Q6.

Control circuit 60 of control IC 50*b* includes a comparator 62, a reference power supply 68, an NAND circuit 63, an NPN-type bipolar transistor 64 and a resistance 65. Connections between these components will be described below.

One of input ends of comparator 62 is connected to gate electrode G of sense IGBT 10*a* via input node 61, and the other input end is connected to the positive terminal of reference power supply 68. A negative terminal of reference power supply 68 is connected to ground GND1. One of input ends of NAND circuit 63 is connected to an output end of comparator 62, and the other input end is connected to input node 51 through an inverter 69. A gate electrode of bipolar transistor 64 is connected to an output end of NAND circuit 63, and an emitter electrode thereof is connected to ground node 12 (ground GND1). A collector electrode 66 of bipolar transistor 64 is connected to power supply node 11 (power supply voltage Vcc) through resistance 65, and is connected to the gate electrode of MOSFET Q6 through output node 67. Comparator 62 outputs a signal at the H-level when potential V(G) of gate electrode G of sense IGBT 10*a* is equal to or lower than a power supply voltage ER2 of reference power supply 68, and outputs a signal at the L-level when potential V(G) of gate electrode G exceeds power supply voltage ER2.

An operation of control circuit 60 will be described below. When turning off sense IGBT 10*a*, control circuit 60 turns off MOSFET Q6 when potential V(G) of gate electrode G of sense IGBT 10*a* becomes equal to or lower than power supply voltage ER2 of reference power supply 68, and thereby rapidly lowers gate-emitter voltage VGE of IGBT 10*a* so that IGBT 10*a* can be reliably turned off.

For achieving the above function, control circuit 60 is configured to output the signal at the L-level from NAND circuit 63 when input signal SG0 is at the L-level (the output of inverter 69 is at the H-level) and the output of the comparator is at the H-level (potential V(G) of gate electrode G is equal to or lower than power supply voltage ER2). In the cases other than the above, NAND circuit 63 provides the signal at the H-level to the base electrode of bipolar transistor 64. When the output of NAND circuit 63 is at the L-level, bipolar transistor 64 is off so that collector electrode 66 connected to power supply node 11 through resistance 65 has a potential of Vcc. When the output of NAND circuit 63 is at the H-level, bipolar transistor 64 is on so that collector electrode 66 of bipolar transistor 64 has a potential of 0.

The gate electrode of MOSFET Q6 is connected to collector electrode 66 of bipolar transistor 64 so that MOSFET Q6 is turned on when collector electrode 66 of bipolar transistor 64 has a potential of Vcc. Thus, MOSFET Q6 is turned on when input signal SG0 is at the L-level and the output of the comparator is at the H-level (potential V(G) of gate electrode G is equal to or lower than power supply voltage ER2). At this time, IGBT 10*a* is electrically connected to the ground node through MOSFET Q6. Therefore, in the turn-off operation of IGBT 10*a*, gate-emitter voltage VGE can rapidly lowers.

Figure 39:
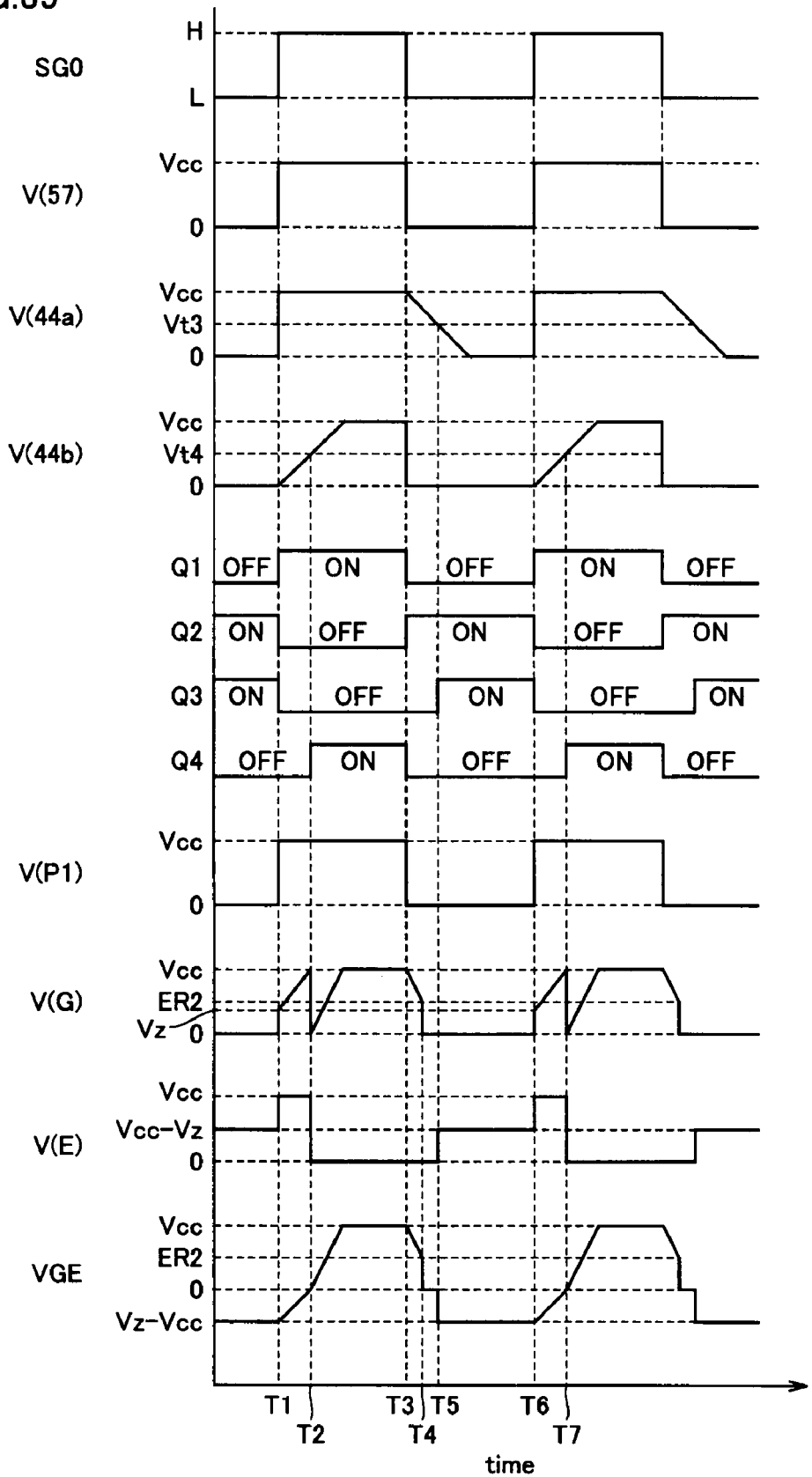
FIG. 39 is a time chart showing changes that occur in state relating to a drive circuit 7 in FIG. 37 according to input signal SG0.

FIG. 39 is a time chart showing changes that occur in state relating to drive circuit 7 in FIG. 37 according to input signal SG0. In FIG. 39, the abscissa gives the time, and the ordinate gives, in the descending order, the logical level of input signal SG0, potential V(57) of output node 57, a potential V(44*a*) of intermediate node 44*a*, a potential V(44*b*) of intermediate node 44*b*, the on/off states of MOSFETs Q1-Q4 and potential V(P1) of connection node P1 as well as potential V(G) of gate electrode G, potential V(E) of emitter electrode E and gate-emitter voltage VGE of sense IGBT 10*a*.

Referring to FIGS. 37 and 39, an operation of drive circuit 7 will be described below. In the following description, description will be primarily given on the operation of portions different from those in drive circuit 6 in FIG. 34, and description of the operations of substantially the same portions will not be repeated.

At time T1 in FIG. 39, input signal SG0 changes from the L-level to the H-level, and potential V(57) of output node 57 of control IC 50*b* changes from 0 to Vcc. Thereby, MOSFETs Q1 and Q2 switch to the on and off states, respectively, so that potential V(P1) of connection node P1 changes from 0 to Vcc at time T1.

When the rising edge of potential V(57) occurs at time T1, potential V(44*a*) of intermediate node 44*a* of delay circuit 40*a* changes from 0 to Vcc without a delay so that MOSFET Q3 changes to the off state at time T1. Conversely, potential V(44*b*) of intermediate node 44*b* of delay circuit 40*b* gradually changes from 0 to Vcc similarly to the changes in potential V(44) in FIG. 19 so that MOSFET Q4 switches to the on state at delayed time T2 when potential V(44*b*) of intermediate node 44*b* reaches a threshold voltage Vt4 of MOSFET Q4.

MOSFET Q4 is changing to the on state during a period between times T1 and T2. During this period, a discharge path is formed from emitter electrode E of sense IGBT 10*a* through forward Zener diode 74, parasitic diode D3 of MOSFET Q3, turned-on MOSFET Q1 and gate resistance RG to gate electrode G of sense IGBT 10*a*. When the discharge current flows through this discharge path not passing through power supply 15, the charges accumulated between the gate and emitter of IGBT 10 are discharged thereby. At this time, emitter electrode E of sense IGBT 10*a* is connected to power supply node 11 through forward Zener diode 74 and parasitic diode D3 of MOSFET Q3 so that potential V(E) of emitter electrode E changes to Vcc at time T1. The discharge through the discharge path gradually changes potential V(G) of gate electrode G toward Vcc that is potential V(E) of emitter electrode E. Consequently, gate-emitter voltage VGE of sense IGBT 10a gradually changes from (Vz−Vcc), and reaches 0 when the discharge is completed before time T2.

When MOSFET Q4 changes to the on state at time T2, MOSFETs Q1-Q4 attain the first state already described with reference to FIG. 1 so that potential V(E) of emitter electrode E of sense IGBT 10a becomes 0. Gate-emitter voltage VGE gradually changes from 0 to Vcc, and a forward bias is applied to sense IGBT 10a.

At next time T3, input signal SG0 changes from the H-level to the L-level, and potential V(57) of output node 57 of control IC 50b changes from Vcc to 0. Thereby, MOSFETs Q1 and Q2 change to the off and on states, respectively, so that potential V(P1) of connection node P1 changes from Vcc to 0.

At the falling edge of potential V(57) formed at time T3, potential V(44b) of intermediate node 44b of delay circuit 40b changes from Vcc to 0 without a delay. Therefore, MOSFET Q4 changes to the off state at time T3. Conversely, potential V(44a) of intermediate node 44a of delay circuit 40a gradually changes from Vcc to 0, similarly to the changes in potential V(44) in FIG. 23. Therefore, MOSFET Q3 switches to the on state at delayed time T5 when potential (44a) of intermediate node 44a reaches a threshold voltage Vt3 of MOSFET Q3.

MOSFET Q3 is changing to the on state during a period between times T3 and T5. During this period, a discharge path is formed from gate electrode G of sense IGBT 10a through gate resistance RG, turned-on MOSFET Q2 and parasitic diode D4 of MOSFET Q4 to emitter electrode E of sense IGBT 10a. Since the discharge current flows through this discharge path not passing through power supply 15, the charges accumulated between the gate and emitter of IGBT 10 are discharged. Since emitter electrode E of sense IGBT 10a is connected to ground GND1 (ground node 12) through parasitic diode D4 of MOSFET Q4, potential V(E) of emitter electrode E keeps 0 between times T3 and T5. Owing to the discharge through this discharge path, potential V(G) of gate electrode G gradually approaches 0 that is potential V(E) of emitter electrode E.

However, owing to the effect of control circuit 60 of control IC 50b, MOSFET Q6 is turned on at time T4 when potential V(G) of gate electrode G becomes equal to or lower than power supply voltage ER2, and potential V(G) of gate electrode G rapidly lowers to 0. The state where potential V(G) of gate electrode G is 0 continues until time T6 when input signal SG0 changes from the L-level to the H-level. Consequently, gate-emitter voltage VGE gradually lowers between times T3 and T4, and rapidly lowers to 0 at time T4.

When MOSFET Q3 changes to the on state at next time T5, MOSFETs Q1-Q4 enter the second state already described with reference to FIG. 1 so that potential V(E) of emitter electrode E of sense IGBT 10a attains (Vcc−Vz). Consequently, gate-emitter voltage VGE changes from 0 to (Vz−Vcc), and a reverse bias is applied to main portion 10b of sense IGBT 10a.

According to drive circuit 7 of the seventh embodiment, as described above, when the turn-on of sense IGBT 10a starting at time T1 is performed, the charges accumulated between the gate and emitter are discharged in advance between times T1 and T2 through the path not passing through power supply 15, similarly to the case in the fourth embodiment. Thereby, it is possible to reduce drive current ID required for turning on sense IGBT 10a.

In the case of turn-off starting from time T3, the charges accumulated between the gate and emitter are discharged in advance between times T3 and T4 through the path not passing through power supply 15, similarly to the case in the third embodiment. Thereby, it is possible to reduce drive current ID required for turning off sense IGBT 10a.

Eighth Embodiment

A drive circuit 8 of the eighth embodiment is a combination of drive circuit 7 of the seventh embodiment and drive circuit 2 of the second embodiment. Details will be described below with reference to FIGS. 40 and 41.

Figure 40:
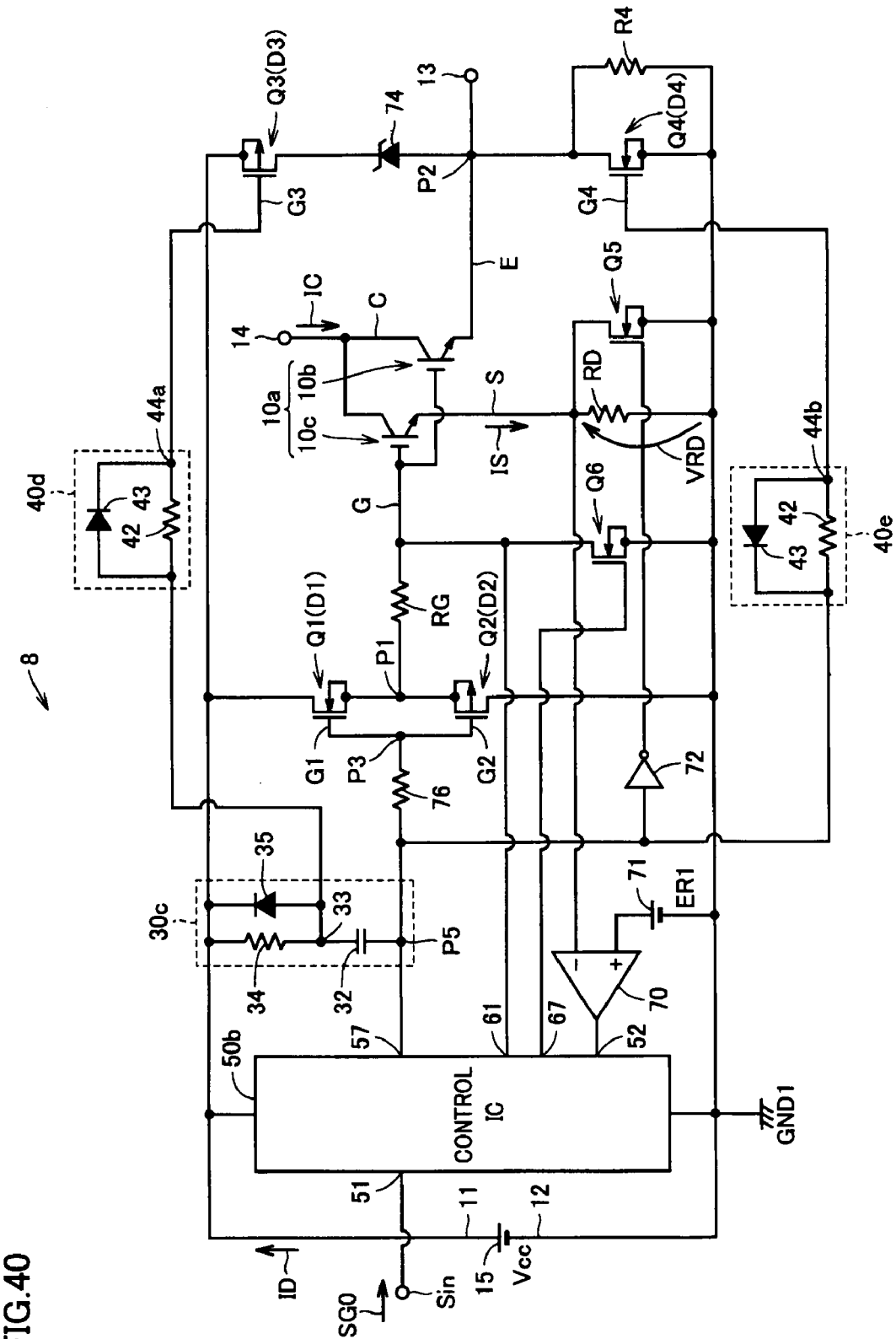
FIG. 40 is a circuit diagram showing a structure of a drive circuit 8 for sense IGBT 10a according to an eighth embodiment of the invention.

FIG. 40 is a circuit diagram showing a structure of drive circuit 8 for sense IGBT 10a according to the eighth embodiment of the invention. Drive circuit 8 shown in FIG. 40 differs from drive circuit 7 shown in FIG. 37 in that drive circuit 8 includes a differential circuit 30c connected between division node P5 and delay circuit 40d as well as resistance R4 connected between the source and drain electrodes of MOSFET Q4. Differential circuit 30c is a modification of one-shot pulse generating circuit 30b in FIG. 14, and differs therefrom in that inverters 36a and 36b for the buffer are not employed and MOSFET Q3 functions as the buffer. Resistance R4 corresponds to resistance R4 of drive circuit 2a of the second embodiment shown in FIG. 8. In FIG. 40, intermediate node 33 which is connected to capacitor 32, resistance 34, diode 35 and the input end of delay circuit 40d corresponds to intermediate node 33 of one-shot pulse generating circuit 30b in FIG. 14.

Figure 41:
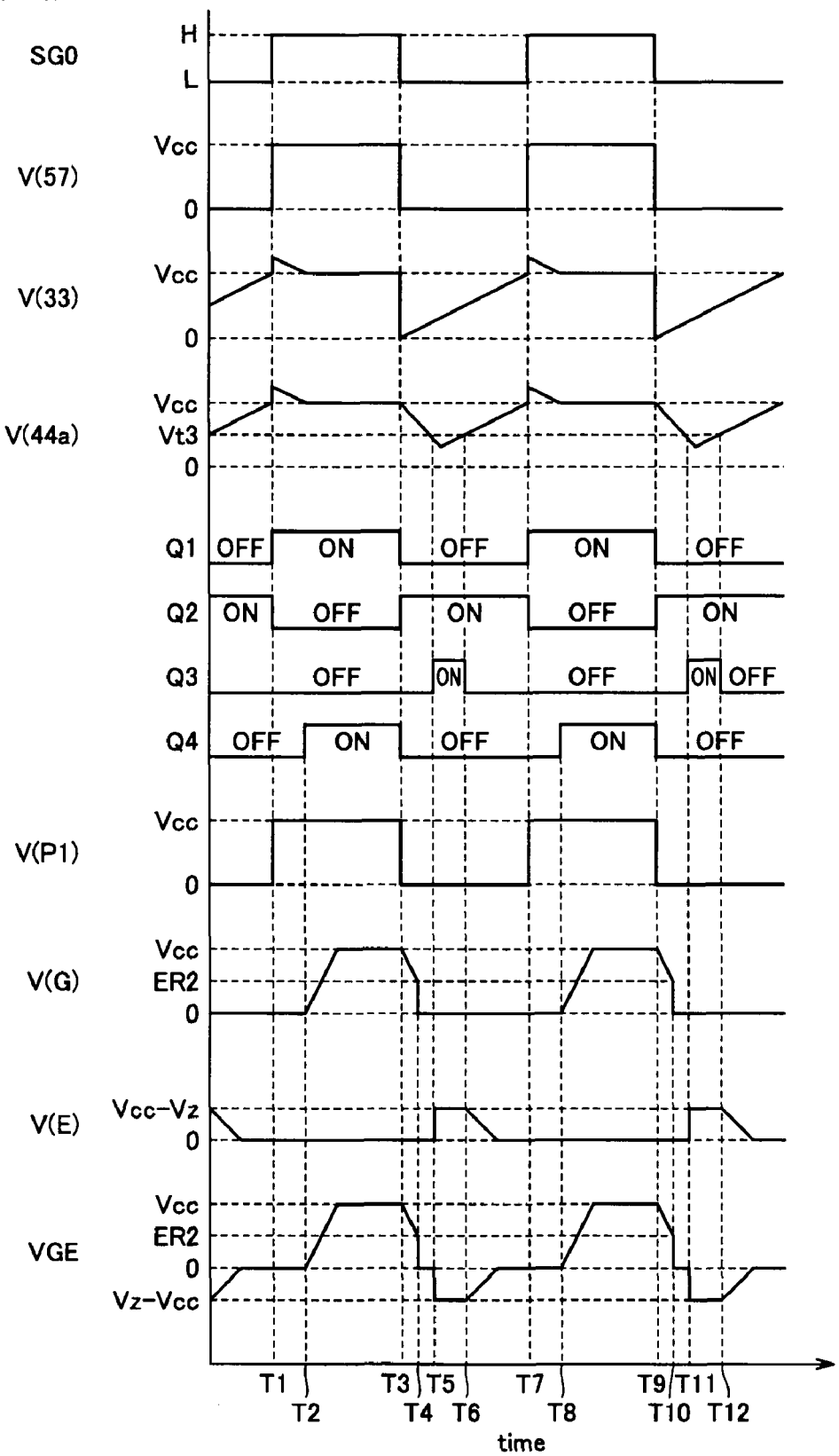
FIG. 41 is a time chart showing changes that occur in state relating to drive circuit 8 shown in FIG. 40 according to input signal SG0.

FIG. 41 is a time chart showing changes that occur in state relating to drive circuit 8 shown in FIG. 40 according to input signal SG0. In FIG. 41, the abscissa gives the time, and the ordinate gives, in the descending order, the logical level of input signal SG0, potential V(57) of output node 57, potential V(33) of intermediate node 33, potential V(44a) of intermediate node 44a, the on/off states of MOSFETs Q1-Q4 and potential V(P1) of connection node P1 as well as potential V(G) of gate electrode G, potential V(E) of emitter electrode E and gate-emitter voltage VGE of sense IGBT 10a.

Referring to FIGS. 40 and 41, an operation of drive circuit 8 will be described below. From comparison between the time charts relating to drive circuits 8 and 7 in FIGS. 41 and 39, respectively, there is no difference in timing of on/off of MOSFETs Q1, Q2 and Q4 according to input signal SG0. However, drive circuit 8 is provided with differential circuit 30c so that the on/off timing of MOSFET Q3 in FIG. 41 is different from that in FIG. 39. Accordingly, portions relating to differential circuit 30c and MOSFET Q3 will be first described below.

In response to the rising and falling of potential V(57) of output node 57, potential V(33) of intermediate node 33 of differential circuit 30c changes as shown in FIG. 41. This waveform change is substantially the same as that of potential V(33) of intermediate node 33 of one-shot pulse generating circuit 30b shown in FIG. 15. Thus, the waveform of potential V(33) of intermediate node 33 in FIG. 41 hardly changes from power supply voltage Vcc at the rising edges of potential V(57) at times T1 and T7. However, at the falling edges of potential V(57) at times T3 and T9, the waveform of potential V(33) exhibits such a differential waveform that the potential lowers from Vcc to 0 and then gradually returns to Vcc.

Delay circuit 40d connected to intermediate node 33 produces potential V(44) on intermediate node 44 by dulling the falling of potential V(33) provided to delay circuit 40d. Thus, when potential V(33) falls at time T3 or T9 in FIG. 41, potential V(44a) falls more slowly than potential V(33). Consequently, MOSFET Q3 switches to the on state when potential V(44a) of intermediate node 44a is lower than threshold voltage Vt3 of MOSFET Q3, i.e., between times T5 and T6 and between times T11 and T12. In other words, the falling edges of potential V(57) that change from the H-level to the L-level at times T3 and T9 trigger MOSFET Q3 to change temporarily to the on state at times T5 and T11 delayed from the above falling, respectively. Thereafter, MOSFET Q3 returns to the off state at times T6 and T11.

In response to the on/off operations of MOSFET Q3, changes occur in potential V(G) of gate electrode G, potential V(E) of emitter electrode E and gate-emitter voltage VGE of sense IGBT 10*a*, and these changes are different from those in drive circuit 7 shown in FIG. 39 as follows.

Between times T2 and T3 in FIG. 41, the states of MOSFETs Q1-Q4 attain the first state already described with reference to FIG. 1. In the steady state, potential V(G) of gate electrode G, potential V(E) of emitter electrode E and gate-emitter voltage VGE have respective magnitudes that are substantially the same as those between times T2 and T3 in drive circuit 7 shown in FIG. 39.

At time T3, when input signal SG0 changes from the H-level to the L-level, MOSFETs Q1, Q2 and Q4 switch to the off, on and off states, respectively, and MOSFET Q3 keeps the off state until time T5, and will change to the on state at time T5. The states of MOSFETs Q1-Q4 between times T3 and T5 are substantially the same as those between times T3 and T5 in drive circuit 7 shown in FIG. 39, and the changes in potential V(G) of gate electrode G, potential V(E) of emitter electrode E and gate-emitter voltage VGE are substantially the same as those in FIG. 39.

When MOSFET Q3 is turned on at time T5, the states of MOSFETs Q1-Q4 attain the second state already described with reference to FIG. 1 so that potential V(E) of emitter electrode E of sense IGBT 10*a* becomes equal to (Vcc−Vz), and a reverse bias of (Vz−Vcc) is applied as gate-emitter voltage VGE to main portion 10*b* of IGBT 10*a*. At this time, potential V(G) of gate electrode G keeps 0, i.e., the potential of ground GND1 because MOSFET Q6 is on.

After MOSFET Q3 is turned off at time T6 and before input signal SG0 changes from the L-level to the H-level at time T7, a discharge path is formed from emitter electrode E of sense IGBT 10*a* through resistance R4, turned-on MOSFET Q2 and gate resistance RG to gate electrode G of sense IGBT 10*a*. The discharge current flows through this discharge path not passing through power supply 15 so that the charges accumulated between the gate and emitter of IGBT 10 are discharged. This discharge gradually changes potential V(E) of emitter electrode E of sense IGBT 10*a* from (Vcc−Vz) to 0, and gradually changes gate-emitter voltage VGE from (Vz−Vcc) to 0. This change corresponds to the change between times T4 and T6 in FIG. 9 in the second embodiment.

When input signal SG0 changes from the L-level to the H-level at time T7, MOSFETs Q1 and Q2 change to the on and off states, respectively, and switch elements Q3 and Q4 keep the off state without a change. At time T7, the charges accumulated between the gate and emitter of sense IGBT 10*a* are already discharged so that each of potential V(G) of gate electrode G, potential V(E) of emitter electrode E and gate-emitter voltage VGE of sense IGBT 10*a* does not change and keeps 0.

When MOSFET Q4 changes to the on state at subsequent time T8, the states of MOSFETs Q1-Q4 attain the first state so that a forward bias is applied to sense IGBT 10*a*, and potential V(G) of gate electrode G and gate-emitter voltage VGE change from 0 to Vcc.

In drive circuit 8 of the eighth embodiment, as described above, the charges accumulated between the gate and emitter are discharged in advance through the path not passing through power supply 15, similarly to the seventh embodiment, so that drive current ID required for the turn-on and turn-off of sense IGBT 10*a* can be reduced.

Although the present invention has been described and illustrated in detail, it is clearly understood that the same is by way of illustration and example only and is not to be taken by way of limitation, the scope of the present invention being interpreted by the terms of the appended claims.

The invention claimed is:

1. A drive circuit for a power element, said power element controlling a main current flowing between first and second main electrodes according to a signal provided to a control electrode, comprising:
   a power supply connected between first and second nodes;
   a switch matrix circuit configured to connect said control electrode selectively to one of said first and second nodes, and to connect said second main electrode selectively to one of said first and second nodes; and
   a control unit for controlling said switch matrix circuit according to an input signal provided for switching said power element between on and off states, wherein,
   when said input signal changes to switch said power element from the on state to the off state, said control unit switches the state of said switch matrix circuit from a first state for connecting said control electrode to said first node and connecting said second main electrode to said second node to a second state for connecting said control electrode to said second node and connecting said second main electrode to said first node,
   when said input signal changes to switch said power element from the off state to the on state, said control unit switches the state of said switch matrix circuit from said second state to said first state,
   said control unit switches the state of said switch matrix circuit to a third or fourth state at least one of during switching the state of said switch matrix circuit from said first state to said second state and during switching the state of said switch matrix circuit from said second state to said first state,
   in said third state, a conductive state is established between said first node and said control electrode and between said first node and said second main electrode, and a non-conductive state is established between said second node and said control electrode and between said second node and said second main electrode, and
   in said fourth state, a conductive state is established between said second node and said control electrode and between said second node and said second main electrode, and a non-conductive state is established between said first node and said control electrode and between said first node and said second main electrode.

2. The drive circuit for the power element according to claim 1, wherein
   said switch matrix circuit comprises:
   a first switch element connected between said control electrode and said first node;
   a second switch element connected between said control electrode and said second node;
   a third switch element connected between said second main electrode and said first node; and
   a fourth switch element connected between said second main electrode and said second node, wherein
   said control unit in said first state turns on said first and fourth switch elements, and turns off said second and third switch elements, and said control unit in said second state turns off said first and fourth switch elements, and turns on said second and third switch elements.

3. The drive circuit for the power element according to claim 2, wherein
said switch matrix circuit further comprises:
a resistance connected in parallel to said first switch element, wherein
when said input signal changes to switch said power element from the on state to the off state, said control unit temporarily sets the state of said switch matrix circuit to said second state, and thereafter, before said input signal changes again, said control unit sets the state of said switch matrix circuit to said third state by keeping said third switch element in the on state and turning off said first, second and fourth switch elements.

4. The drive circuit for the power element according to claim 2, wherein
said switch matrix circuit further comprises:
a resistance connected in parallel to said fourth switch element, wherein
when said input signal changes to switch said power element from the on state to the off state, said control unit temporarily sets the state of said switch matrix circuit to said second state, and thereafter, before said input signal changes again, said control unit sets the state of said switch matrix circuit to said fourth state by keeping said second switch element in the on state and turning off said first, third and fourth switch elements.

5. The drive circuit for the power element according to claim 2, wherein
said switch matrix circuit further comprises:
a diode connected in parallel to said third switch element such that said power supply applies a reverse bias to said diode when said fourth switch element is on, wherein
when said input signal changes to switch said power element from the off state to the on state, said control unit switches the state of said switch matrix circuit from said second state to said third state by turning on said first switch element and turning off said second, third and fourth switch elements, and thereafter said control unit sets the state of said switch matrix circuit to said first state.

6. The drive circuit for the power element according to claim 2, wherein
said switch matrix circuit further comprises:
a diode connected in parallel to said second switch element such that said power supply applies a reverse bias to said diode when said first switch element is on, wherein
when said input signal changes to switch said power element from the off state to the on state, said control unit switches the state of said switch matrix circuit from said second state to said fourth state by turning on said fourth switch element and turning off said first, second and third switch elements, and thereafter said control unit sets said switch matrix circuit to said first state.

7. The drive circuit for the power element according to claim 2, wherein
said switch matrix circuit further comprises:
a diode connected in parallel to said first switch element such that said power supply applies a reverse bias to said diode when said second switch element is on, wherein
when said input signal changes to switch said power element from the on state to the off state, said control unit switches the state of said switch matrix circuit from said first state to said third state by turning on said third switch element and turning off said first, second and fourth switch elements, and thereafter said control unit sets the state of said switch matrix circuit to said second state.

8. The drive circuit for the power element according to claim 2, wherein
said switch matrix circuit further comprises:
a diode connected in parallel to said fourth switch element such that said power supply applies a reverse bias to said diode when said third switch element is on, wherein
when said input signal changes to switch said power element from the on state to the off state, said control unit switches the state of said switch matrix circuit from said first state to said fourth state by turning on said second switch element and turning off said first, third and fourth switch elements, and thereafter said control unit sets the state of said switch matrix circuit to said second state.

9. The drive circuit for the power element according to claim 2, wherein
when said input signal changes to switch said power element from the on state to the off state, said control unit switches the state of said switch matrix circuit from said first state to said third state by turning on said first and third switch elements and turning off said second and fourth switch elements, and thereafter said control unit sets the state of said switch matrix circuit to said second state.

10. The drive circuit for the power element according to claim 2, wherein
when said input signal changes to switch said power element from the on state to the off state, said control unit switches the state of said switch matrix circuit from said first state to said fourth state by turning on said second and fourth switch elements and turns turning off said first and third switch elements, and thereafter said control unit sets the state of said switch matrix circuit to said second state.

11. The drive circuit for the power element according to claim 2, wherein
when said input signal changes to switch said power element from the off state to the on state, said control unit switches the state of said switch matrix circuit from said second state to said third state by turning on said first and third switch elements and turning off said second and fourth switch elements, and thereafter said control unit sets the state of said switch matrix circuit to said first state.

12. The drive circuit for the power element according to claim 2, wherein
when said input signal changes to switch said power element from the off state to the on state, said control unit switches the state of said switch matrix circuit from said second state to said fourth state by turning on said second and fourth switch elements and turning off said first and third switch elements, and thereafter said control unit sets the state of said switch matrix circuit to said first state.

13. The drive circuit for the power element according to claim 1, wherein,
said power element further includes a sense electrode,
a part of said main current flows between said first main electrode and said sense electrode, and
said drive circuit further comprises a current sense resistance connected between said second node and said sense electrode, and a voltage monitoring unit for monitoring a voltage occurring on said current sense resistance.

14. The drive circuit for the power element according to claim 13, further comprising:
a fifth switch element connected in parallel to said current sense resistance, wherein said control unit turns on said fifth switch element when said input signal changes to switch said power element from the on state to the off state.

15. The drive circuit for the power element according to claim 1, wherein
said power supply is a single DC power supply for supplying a voltage necessary and sufficient for switching said power element to the on state.

16. A drive circuit for a power element, said power element controlling a main current flowing between first and second main electrodes according to a signal provided to a control electrode comprising:
a power supply connected between first and second nodes;
a switch matrix circuit configured to connect said control electrode selectively to one of said first and second nodes, and to connect said second main electrode selectively to one of said first and second nodes; and
a control unit for controlling said switch matrix circuit according to an input signal provided for switching said power element between on and off states, wherein,
when said input signal changes to switch said power element from the on state to the off state, said control unit switches the state of said switch matrix circuit from a first state for connecting said control electrode to said first node and connecting said second main electrode to said second node to a second state for connecting said control electrode to said second node and connecting said second main electrode to said first node,
said switch matrix circuit includes:
a first switch element connected between said control electrode and said first node;
a second switch element connected between said control electrode and said second node;
a third switch element connected between said second main electrode and said first node; and
a fourth switch element connected between said second main electrode and said second node,
said control unit in said first state turns on said first and fourth switch elements, and turns off said second and third switch elements, and said control unit in said second state turns off said first and fourth switch elements, and turns on said second and third switch elements, and
said drive circuit for the power element further comprises a constant voltage unit arranged on at least one of a path extending from said first node through said third switch element to said second main electrode and a path extending from said control electrode through said second switch element to said second node for sharing a voltage between said first and second nodes.

* * * * *